(12) United States Patent
Fukuzumi

(10) Patent No.: US 7,122,854 B2
(45) Date of Patent: Oct. 17, 2006

(54) SEMICONDUCTOR MEMORY DEVICE COMPRISING MAGNETO RESISTIVE ELEMENT AND ITS MANUFACTURING METHOD

(75) Inventor: Yoshiaki Fukuzumi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/109,675

(22) Filed: Apr. 20, 2005

(65) Prior Publication Data

US 2005/0185459 A1 Aug. 25, 2005

Related U.S. Application Data

(62) Division of application No. 10/649,704, filed on Aug. 28, 2003, now abandoned.

(30) Foreign Application Priority Data

Mar. 24, 2003 (JP) ............................. 2003-080586
Aug. 14, 2003 (JP) ............................. 2003-207564

(51) Int. Cl.
*H01L 29/76* (2006.01)
(52) U.S. Cl. ................. 257/295; 257/421; 257/E27.006
(58) Field of Classification Search ................. 257/295
See application file for complete search history.

(56) References Cited

U.S. PATENT DOCUMENTS

| 6,229,170 B1 | 5/2001 | Sakao |
| 2002/0146851 A1 | 10/2002 | Okazawa et al. |
| 2004/0063223 A1 | 4/2004 | Costrini et al. |

OTHER PUBLICATIONS

Roy Scheuerlein, et al., "A 10ns Read and Write Non-Volatile Memory Array Using a Magnetic Tunnel Junction and FET Switch in each Cell", 2000 IEEE International Solid-State Circuits Conference, Digest of Technical Papers, pp. 128-129.
Masashige Sato, et al., "Spin-Valve-Like Properties of Ferromagnetic Tunnel Junctions", Jpn. J. Appl. Phys. vol. 36 (1997) pp. L200-L201.

*Primary Examiner*—Andy Huynh
*Assistant Examiner*—Earl Taylor
(74) *Attorney, Agent, or Firm*—Oblon, Spivak, McClelland, Maier & Neustadt, P.C.

(57) ABSTRACT

A semiconductor memory device includes a memory cell, a side wall insulating film, and an interlayer insulating film. A memory cell includes a first ferromagnetic film, a tunnel barrier film formed on the first ferromagnetic film, and a second ferromagnetic film formed on the tunnel barrier film. The side wall insulating film is formed so as to surround at least sides of the second ferromagnetic film. The interlayer insulating film is formed so as to cover the memory cell and the side wall insulating film.

20 Claims, 34 Drawing Sheets

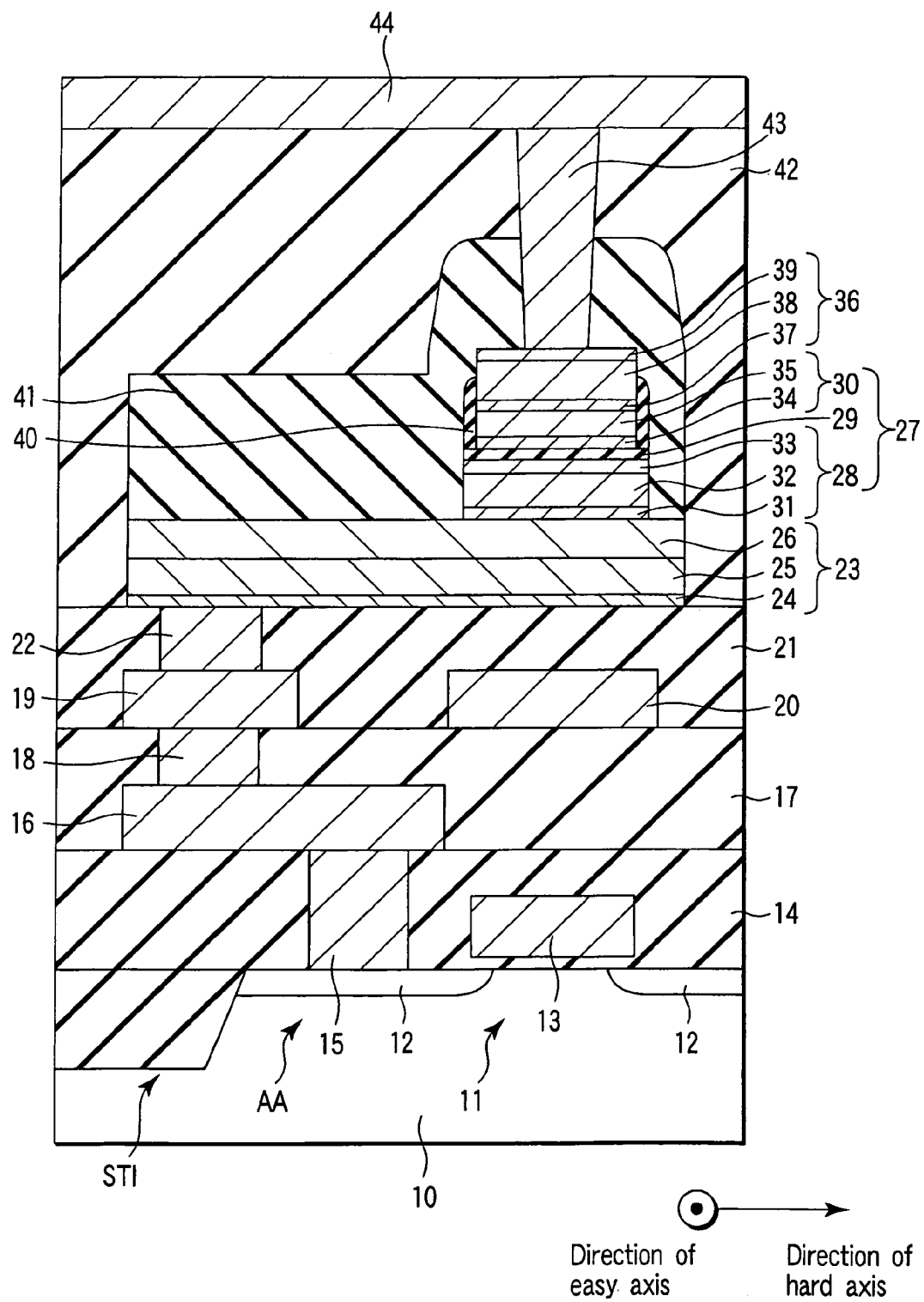
F I G. 1A

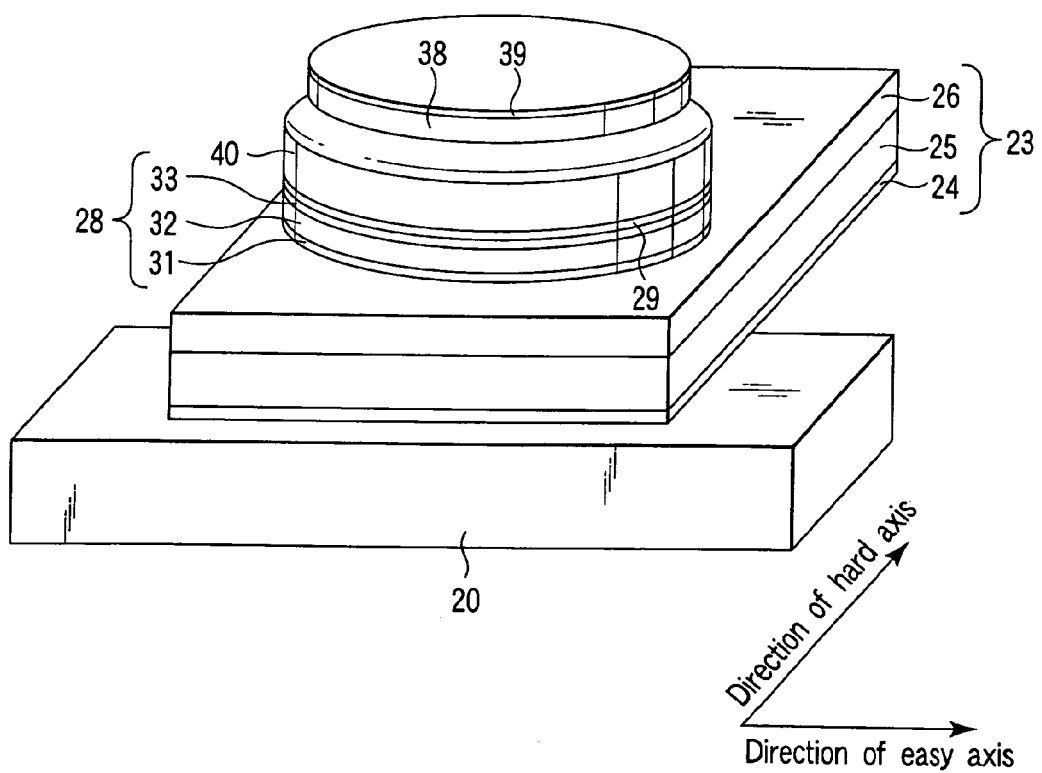
F I G. 1B

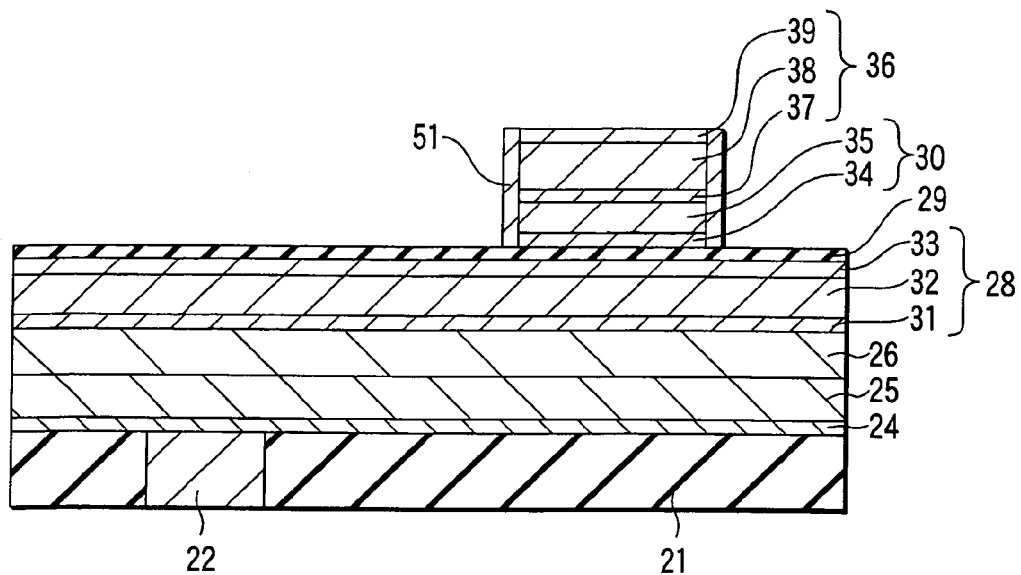
F I G. 4A
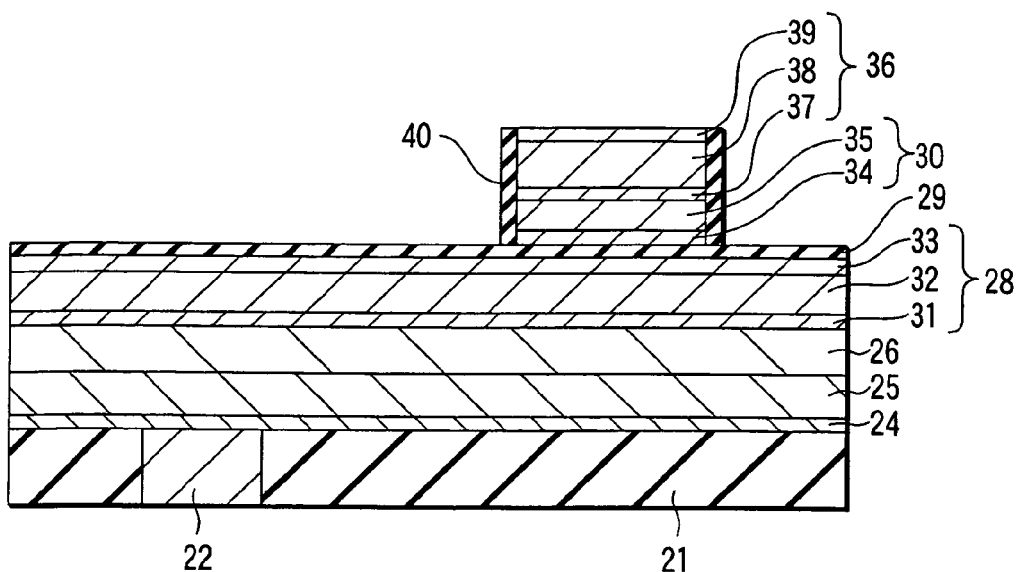
F I G. 4B

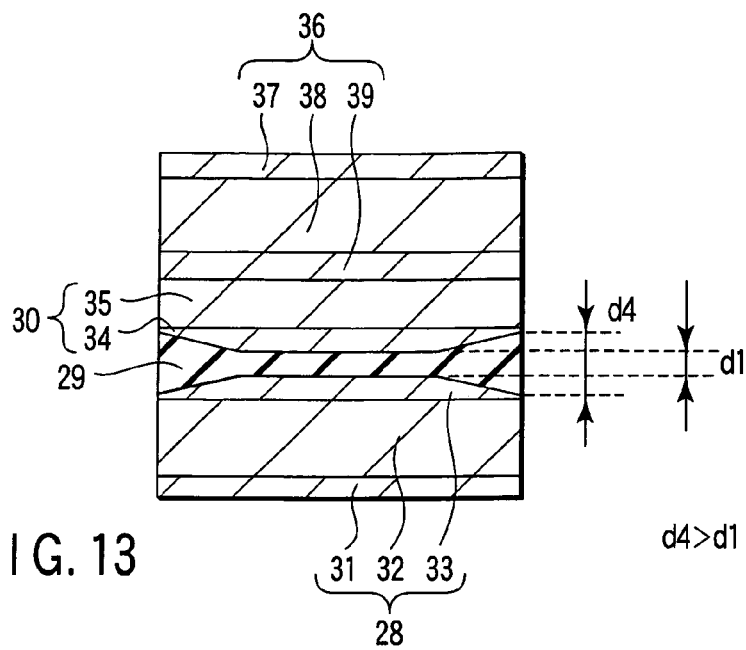
F I G. 13     d4>d1
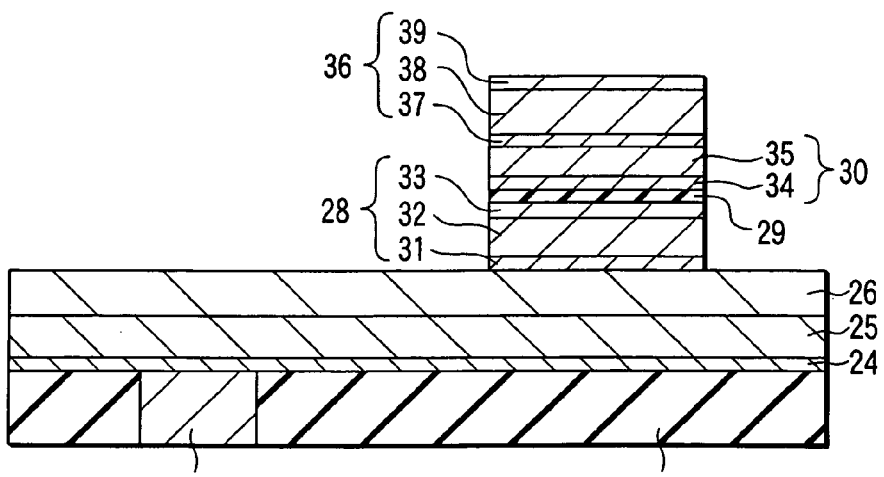
F I G. 14A
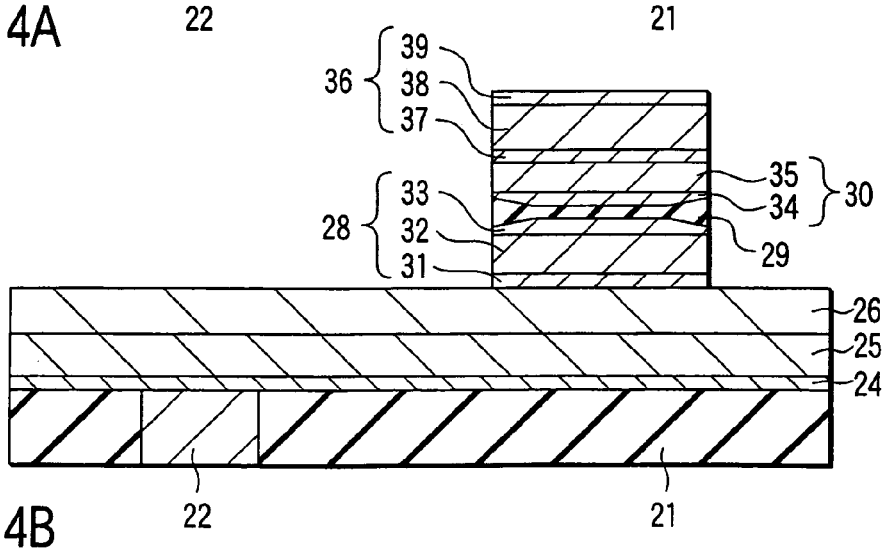
F I G. 14B

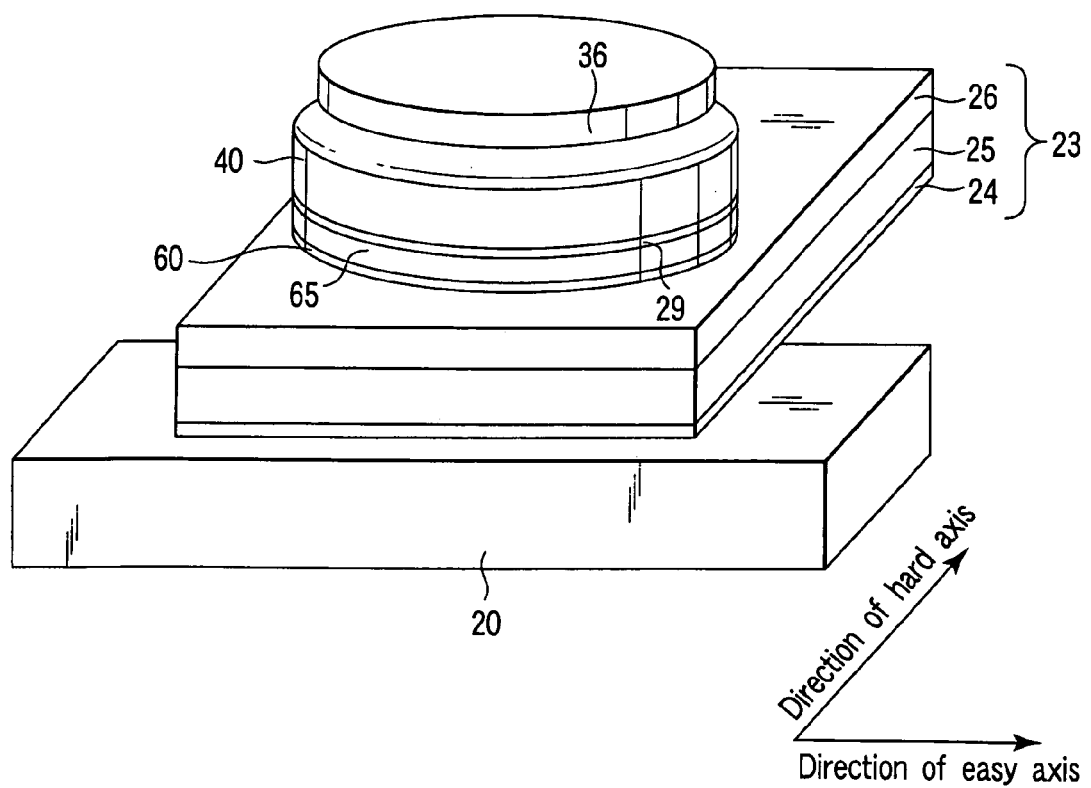
F I G. 15B

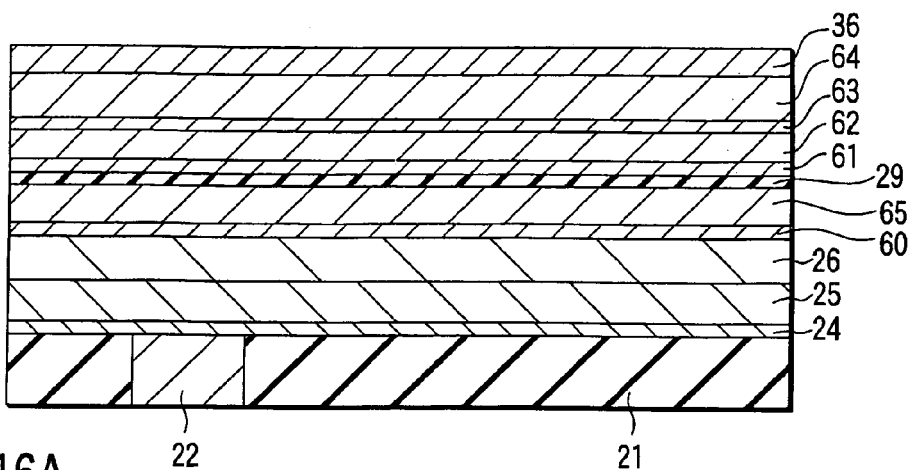
F I G. 16A
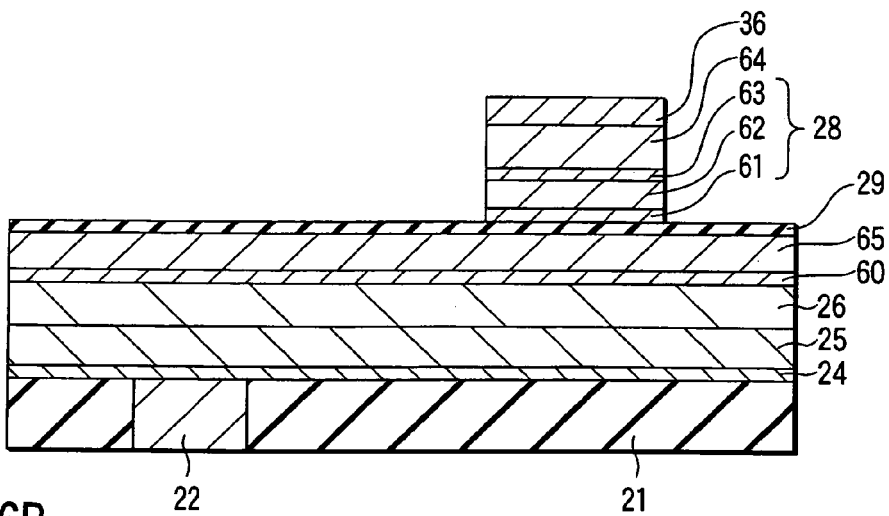
F I G. 16B
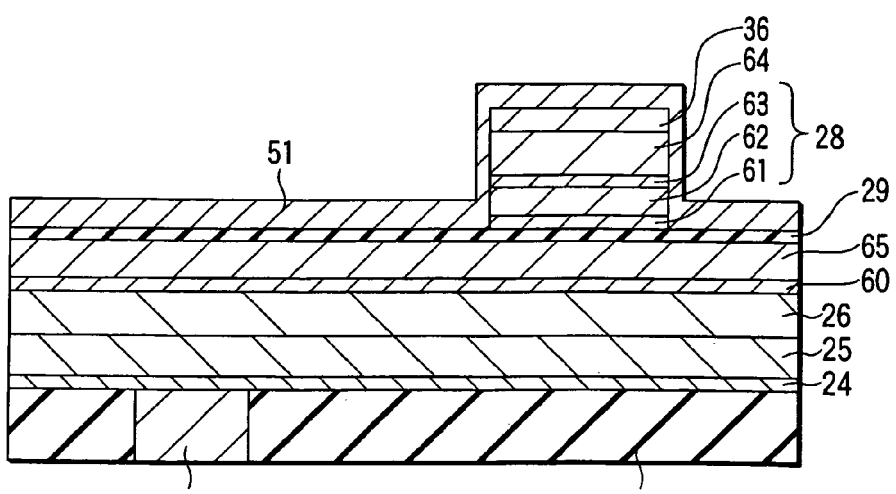
F I G. 16C

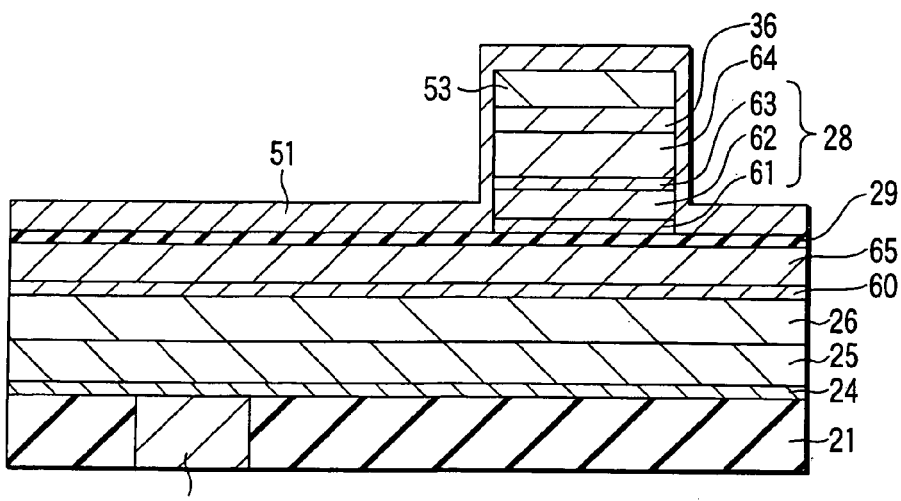
F I G. 20D
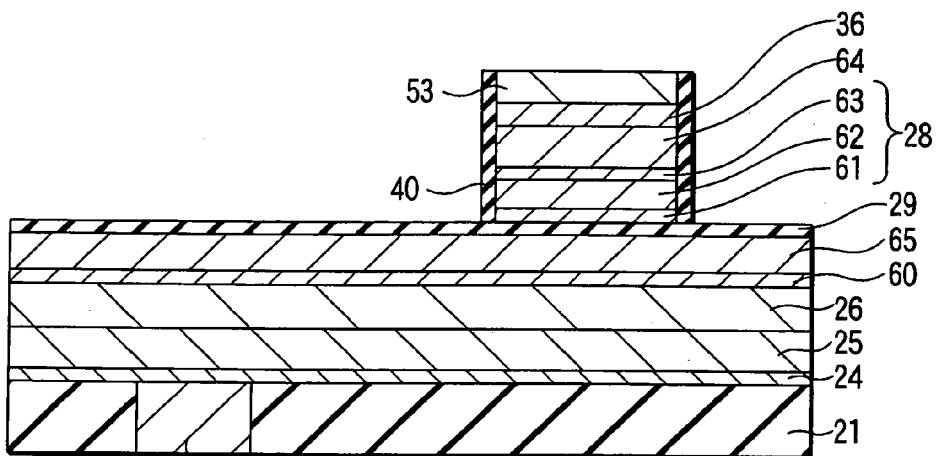
F I G. 20E
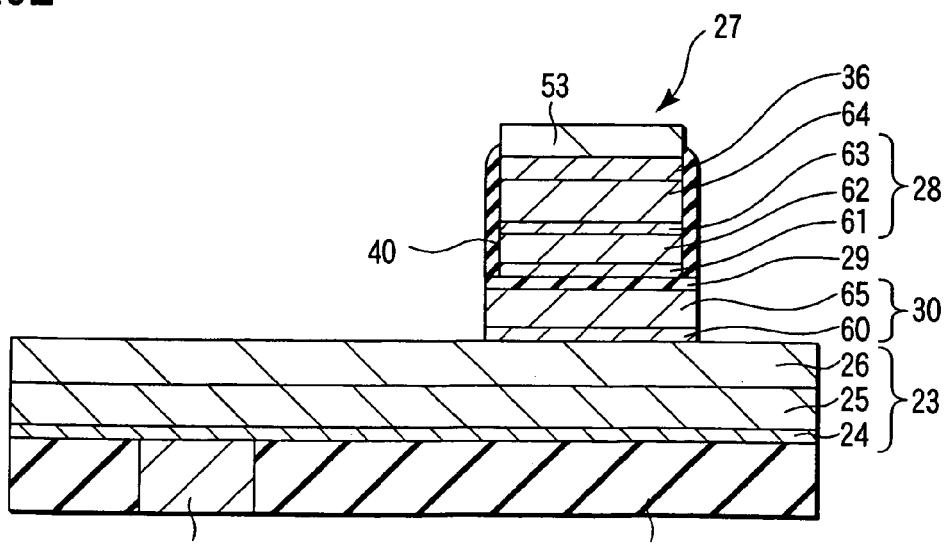
F I G. 20F

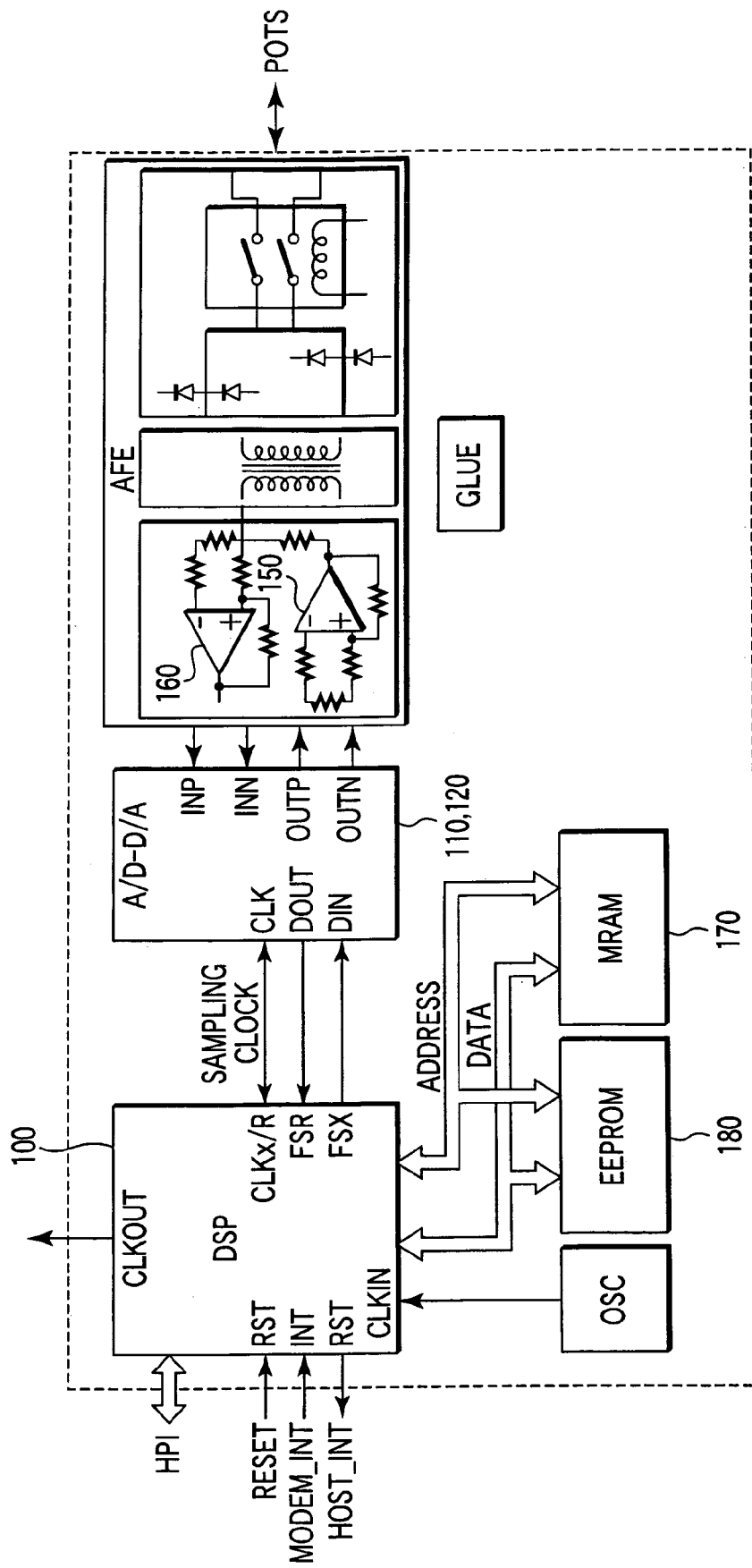
F I G. 27

To first MRAM data rewrite control section

To first MRAM data rewrite control section

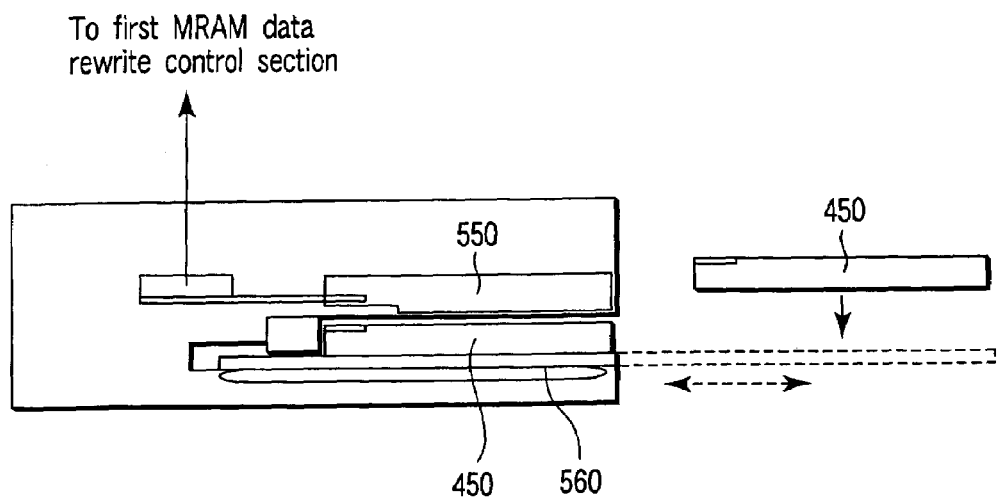
F I G. 33
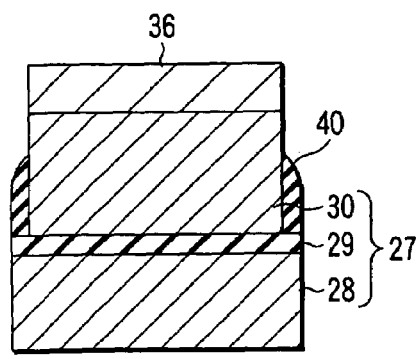
F I G. 34
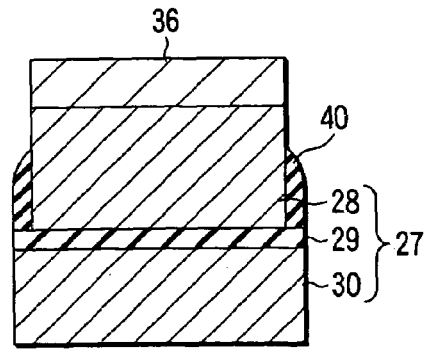
F I G. 35

SEMICONDUCTOR MEMORY DEVICE COMPRISING MAGNETO RESISTIVE ELEMENT AND ITS MANUFACTURING METHOD

CROSS-REFERENCE TO RELATED APPLICATIONS

This application is a divisional of U.S. patent application Ser. No. 10/649,704, filed Aug. 28, 2003 now abandoned, and is based upon and claims the benefit of priority from the prior Japanese Patent Applications Nos. 2003-080586, filed Mar. 24, 2003; and 2003-207564, filed Aug. 14, 2003. The entire contents of these applications are incorporated herein by reference.

BACKGROUND OF THE INVENTION

1. Field of the Invention

The present invention relates to a semiconductor memory device and its fabricating method, e.g. a magneto resistive element provided in a magneto resistive random access memory (MRAM) and its peripheral structure.

2. Description of the Related Art

The MRAM is a general term for solid state memories which act as recorded information carriers utilizing the direction of magnetization of ferromagnetic material and which enable recorded information to be rewritten, retained, and read as required.

A memory cell in the MRAM normally has a structure in which a plurality of ferromagnetic materials are stacked together. Information is recorded by using binary information "1" and "0" to represent the relative arrangement of magnetizations of the plurality of ferromagnetic materials in the memory cell, i.e. to indicate whether the directions of the magnetization are parallel or antiparallel with one another. Recording information is written to the memory by using current magnetic fields to reverse the directions of magnetization of ferromagnetic materials of each memory cell.

The MRAM is perfectly nonvolatile and enables information to be rewritten $10^{15}$ times or more. Furthermore, the MRAM enables nondestructive reading and does not require any refresh operations. Accordingly, it enables a read cycle to be reduced. It is also resistant to radiations compared to charge accumulation type memory cells. Thus, the MRAM has a large number of advantages in terms of functions compared to conventional semiconductor memories using dielectrics. The degree of integration per unit area of the MRAM and the time required by the MRAM for a write or read are expected to be generally equivalent to those of a DRAM (Dynamic Random Access Memory). Accordingly, the non-volatility of the MRAM, its major characteristic, is expected to be utilized to use it as an external storage device for portable equipment, embedding it in an LSI, or apply it to a main memory of a personal computer.

An MRAM that is now examined so as to be put to practical use uses a magnetic tunnel junction (hereinafter simply referred to as an "MTJ") for the memory cell. Such an example is described in, for example, "IEEE International Solid-State Circuits Conference 2000 Digest Paper", TA7.2. The MTJ mainly comprises a three-layer film including a ferromagnetic layer, an insulating layer, and a ferromagnetic layer. A current tunnels the insulating layer. The resistance value of the junction varies in proportion to the cosine of the relative angle between the directions of magnetization in both ferromagnetic metal layers. The resistance value of the junction is largest when the directions of magnetization in both ferromagnetic layers are antiparallel with each other. This is a tunnel magneto resistive effect. One type of MTJ has a structure that retains data utilizing a difference in magnetic coercive force between both ferromagnetic materials. Another type of MTJ has a so-called spin valve structure in which an antiferromagnetic material is arranged adjacent to one of the ferromagnetic materials to pin the directions of magnetization. The spin valve structure aims reduction of write current and improve the magnetic field sensitivity. An MRAM having the spin valve structure is described in, for example, "Japanese Journal of Applied Physics", 1997, No. 36, p.200.

A brief description will be given of a conventional method of forming an MTJ element having the spin valve structure.

First, a switching transistor is formed on a semiconductor substrate. Subsequently, an interlayer insulating film, a local interconnect layer, a write interconnect layer, and a contact plug are formed in this order. Then, a nonmagnetic conductive film is formed on the interlayer insulating film as a leading interconnect layer.

Next, a ferromagnetic layer is formed on the leading interconnect layer as a pinning layer. Furthermore, an insulating layer is formed on the pinning layer as a tunnel barrier film. Subsequently, a ferromagnetic layer is formed on the tunnel barrier film as a free layer.

Moreover, the free layer, the tunnel barrier film, and the pinning layer are patterned using a photolithography technique and ion milling. This completes an MTJ element.

Next, an $SiO_2$ film is formed on the MTJ element in order to protect the MTJ element. Then, the $SiO_2$ film and the nonmagnetic conductive film are patterned using the photolithography technique and etching. This completes a leading interconnect layer.

Subsequently, an interlayer insulating film is formed so as to cover the MTJ element. Furthermore, a contact plug is formed in the interlayer insulating film so as to reach the free layer.

The MTJ element is formed as described above.

However, in the conventional MRAM, the upper and lower ferromagnetic layers, arranged opposite each other via the tunnel barrier film, may be electrically short-circuited at their ends. Thus, the yield of the MRAM decreases significantly. This is mainly because when a junction is etched using ion milling, residue containing metal remains near the tunnel barrier at a certain probability. The tunnel barrier film has a very small thickness of about 1 to 1.5 nm. That is, the upper and lower substrates are adjacent to each other at a very small distance of 1 to 1.5 nm. Thus, if the residue is larger than 1 to 1.5 nm in size, a short circuit may occur. However, for a large-scale MRAM, it is substantially impossible to avoid this defect. As the degree of integration of the MRAM increases, it tends to become increasingly difficult to obtain acceptable products.

It is contemplated that the above short circuit problem may be solved by, for example, allowing ions to be incident at about 45° during an ion milling step. In this case, the sides of the MTJ are tapered. As a result, the probability of occurrence of a defect is expected to decrease. However, in an MRAM of a Gbit class, an MTJ element has a size of, for example, 0.1×0.2 µm. The distance between adjacent MTJ elements is about 0.1 µm. Then, to avoid an electric short circuit between the adjacent MTJ elements, ions are desirably allowed to enter the substrate surface as perpendicularly to it as possible during the ion milling step. That is, the short circuit between the MTJ elements and the short circuit between the ferromagnetic layers are traded off with each other.

BRIEF SUMMARY OF THE INVENTION

A semiconductor memory device according to an aspect of the present invention comprises:

a memory cell comprising a first ferromagnetic film, a tunnel barrier film formed on the first ferromagnetic film, and a second ferromagnetic film formed on the tunnel barrier film;

a side wall insulating film formed so as to surround at least sides of the second ferromagnetic film; and an interlayer insulating film formed so as to cover the memory cell and the side wall insulating film.

A method for fabricating a semiconductor memory device according to an aspect of the present invention comprises:

forming a first ferromagnetic layer on a semiconductor layer;

forming a tunnel barrier film on the first ferromagnetic layer;

forming a second ferromagnetic layer on the tunnel barrier film;

patterning the second ferromagnetic layer to expose a part of the tunnel barrier film;

forming a side wall insulating film on the tunnel barrier film so that the side wall insulating film surrounds side walls of the second ferromagnetic layer; and patterning the tunnel barrier film and the first ferromagnetic layer.

BRIEF DESCRIPTION OF THE SEVERAL VIEWS OF THE DRAWING

FIG. 1A is a sectional view of an MRAM according to a first embodiment of the present invention;

FIG. 1B is a perspective view of the MRAM according to the first embodiment of the present invention;

FIGS. 4A and 4B are sectional views sequentially showing the MRAM fabricating steps according to the second embodiment of the present invention;

FIG. 13 is a sectional view of a magneto resistive element provided in an MRAM according to a seventh embodiment of the present invention;

FIGS. 14A and 14B are sectional views sequentially showing MRAM fabricating steps according to the seventh embodiment of the present invention;

FIG. 15B is a perspective view of the MRAM according to the eighth embodiment of the present invention;

FIGS. 16A to 16F are sectional views sequentially showing the MRAM fabricating steps according to the eighth embodiment of the present invention;

FIGS. 20A to 20F are sectional views sequentially showing the MRAM fabricating steps according to the tenth embodiment of the present invention;

FIG. 27 is a block diagram of a modem having the MRAM according to the first to fifteenth embodiments of the present invention;

FIG. 33 is a sectional view of a transfer device which transfers data of the card having the MRAM according to the first to fifteenth embodiments of the present invention;

FIG. 34 is a sectional view of a magneto resistive element provided in an MRAM according to a first modification of the first to fifteenth embodiment of the present invention; and FIG. 35 is a sectional view of a magneto resistive element provided in an MRAM according to a first modification of the first to fifteenth embodiment of the present invention.

DETAILED DESCRIPTION OF THE INVENTION

Figure 1C:
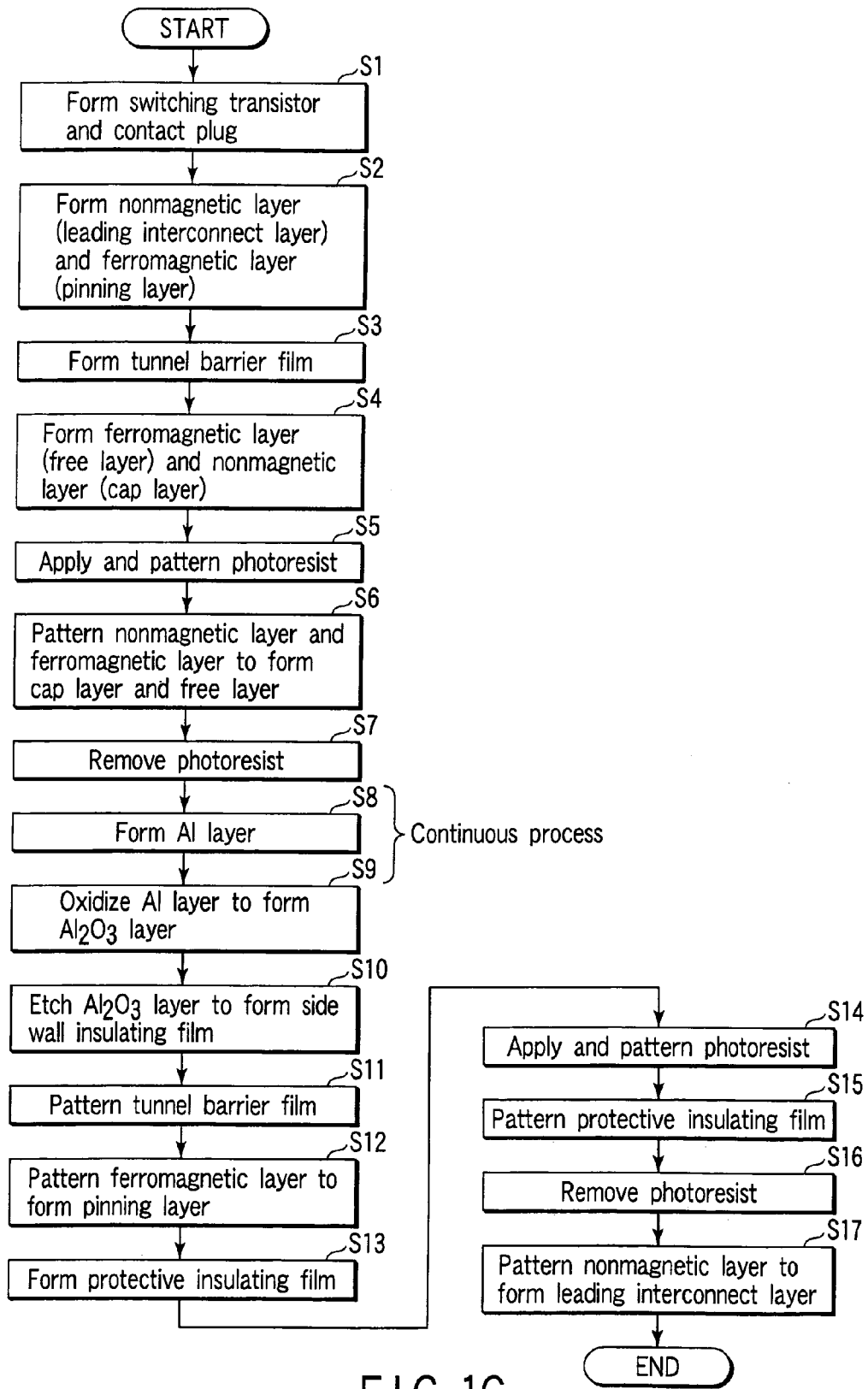
FIG. 1C is a flow chart of MRAM fabricating steps according to the first embodiment of the present invention.

With reference to FIG. 1A, description will be given of a semiconductor memory device according to a first embodiment of the present invention. FIG. 1A is a sectional view of a memory cell in an MRAM.

As shown in this figure, an element isolating region STI is formed in a semiconductor substrate 10. A switching transistor 11 is formed in an element area AA the periphery of which is surrounded by the element separating area STI. The switching transistor 11 comprises impurity diffusion layers 12 formed in a surface region of the semiconductor substrate 10, a gate insulating film (not shown), and a gate electrode 13. The gate electrode 13 functions as a word line and is formed like a stripe extending along the direction of an easy axis (a direction perpendicular to the sheet of the drawing).

Further, an interlayer insulating film 14 is formed on the semiconductor substrate 10. The interlayer insulating film 14 covers the switching transistor 11. A contact plug 15 is formed in the interlayer insulating film 14. The contact plug 15 is connected to one (a drain region) of the impurity diffusion layers 12 of the switching transistor 11.

A metal interconnect layer 16 connected to the contact plug 15 is formed on the interlayer insulating film 14. Furthermore, an interlayer insulating film 17 is formed on the interlayer insulating film 14. The interlayer insulating film 17 covers the metal interconnect layer 16. A contact plug 18 is formed in the interlayer insulating film 17. The contact plug 18 is connected to the metal interconnect layer 16.

Metal interconnect layers 19 and 20 are formed on the interlayer insulating film 17; the metal interconnect layer 19 is connected to the contact plug 18, and the metal interconnect layer 20 is electrically separated from the metal interconnect layer. The metal interconnect layer 20 functions as a write word line and is formed like a stripe extending along the direction of the easy axis. Furthermore, an interlayer insulating film 21 is formed on the interlayer insulating film 17. The interlayer insulating film 21 covers the metal interconnect layers 19 and 20. A contact plug 22 is formed in the interlayer insulating film 21. The contact plug 22 is connected to the metal interconnect layer 19.

A nonmagnetic conductive film 23 connected to the contact plug 22 is formed on the interlayer insulating film 21. The nonmagnetic conductive film 23 functions as a leading interconnect layer. It is formed of a multilayer film including a Ta layer of, for example, film thickness 3 nm, an Al layer 25 of, for example, film thickness 30 nm, and a Ta layer 26 of, for example, film thickness 30 nm which are sequentially formed. Further, a magneto resistive element 27 is formed on the nonmagnetic conductive film 23. The magneto resistive element 27 is formed to lie on top of the metal interconnect layer 20 so as to sandwich the interlayer insulating film 21 and the nonmagnetic conductive film 23 between itself and the metal interconnect layer 20. The magneto resistive element 27 is designed so that an insulating film is sandwiched between magnetic material films and is, for example, an MTJ element.

The structure of the magneto resistive element 27 will be described with reference to FIGS. 1A and 1B. FIG. 1B is a perspective view of a semiconductor memory device focusing on the magneto resistive element 27.

As shown in this figure, the magneto resistive element 27 is shaped like a general ellipse the major axis of which extends along the direction of the easy axis. The magneto resistive element 27 includes a pinning layer 28 formed on the nonmagnetic conductive layer 23, a tunnel barrier film 29 formed on the pinning layer 28, and a free layer 30 formed on the tunnel barrier film 29. The pinning layer 28 is formed of a stacked film in which the following layers are sequentially formed: a seed layer (or buffer layer) 31 formed of permalloy (Py: NiFe alloy) of, for example, film thickness 3 nm, an antiferromagnetic layer 32 formed of IrMn of, for example, film thickness 15 nm, and a pinning ferromagnetic layer 33 formed of a CoFe layer of, for example, film thickness 5 nm. The tunnel barrier film 29 is formed of an $Al_2O_3$ layer of, for example, film thickness about 1 to 1.5 nm. The free layer 30 is formed of a stacked film including a CoFe layer 34 of, for example, 4 nm film thickness and a Py layer 35 of, for example, 20 nm film thickness which are sequentially formed.

The pinning layer 28 and the tunnel barrier film 29 have substantially the same surface area and completely overlap each other. The free layer 30 has a smaller surface area than the pinning layer 28 and the tunnel barrier film 29 and is provided, as a whole, on the tunnel barrier film 29. The magneto resistive element 27 is thus formed.

A cap layer 36 is formed on the free layer 30. The cap layer 36 is formed of a multilayer film including a Ta layer of, for example, 20 nm film thickness, an Al layer 38 of, for example, 50 nm film thickness, and a Ta layer 39 of, for example, 10 nm film thickness which are sequentially formed. Further, a side wall insulating film 40 is formed on the tunnel barrier film 29 so as to surround at least the periphery of the free layer 30. The side wall insulating film 40 is formed of, for example, an $Al_2O_3$ film.

Further, an $SiO_2$ film 41 is formed on the nonmagnetic conductive film 23 so as to cover the magneto resistive element 27, the cap layer 36, and the side wall insulating film 40. The SiO film 41 serves to protect the magneto resistive element 27. Furthermore, an interlayer insulating film 42 is formed on the interlayer insulating film 21 so as to cover the nonmagnetic conductive film 23 and the $SiO_2$ film 41. A contact plug 43 is formed in the interlayer insulating film 42 and the $SiO_2$ film 41. The contact plug 43 extends from the surface of the interlayer insulating film 42 to the Ta layer 39 in the cap layer 36. A bit line 44 connected to the contact plug 43 is formed on the interlayer insulating film 42.

The memory cell including the magneto resistive element 27 and the switching transistor 11 is formed as described above. Spins in the pinning layer 28 in the magneto resistive element 27 are set beforehand to have predetermined orientations. The orientations of spins in the free layer 30 are then set to be parallel or antiparallel with the pinning layer 28. This creates two states to cause "0" or "1" data to be written in the magneto resistive element 27.

Now, with reference to FIGS. 1C and 2A to 2L, description will be given of method of fabricating the semiconductor memory device shown in FIGS. 1A and 1B. FIG. 1C is a flow chart of MRAM fabricating steps according to the present embodiment. FIGS. 2A to 2L are sectional views sequentially showing the fabricating steps. In FIGS. 2B to 2L, the structure including the metal interconnect layers 19 and 20 and other components located below them is omitted.

Figure 2A:
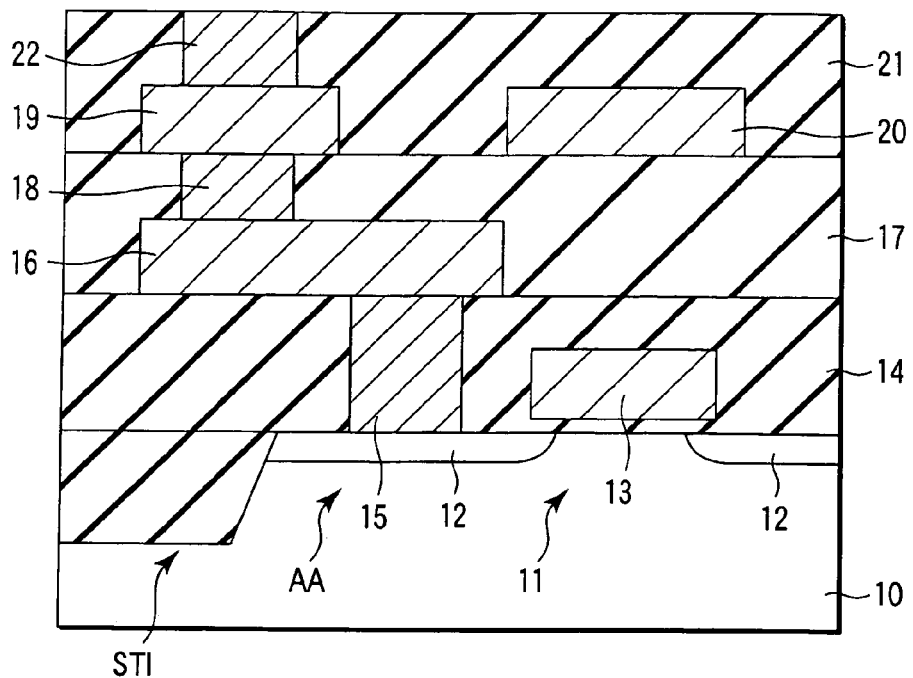
FIGS. 2A to 2L are sectional views sequentially showing the MRAM fabricating steps according to the first embodiment of the present invention.

First, in step S1 in FIG. 1C, the switching transistor 11 and the contact plug are formed. That is, as shown in FIG. 2A, the element isolating region STI is formed in the semiconductor substrate 10. Then, the switching transistor 11 is formed on the element area AA surrounded by the element isolating region STI using a well-known manner. The gate electrode 13 of the switching transistor 11 is formed like a stripe extending along the direction of the easy axis. Then, the interlayer insulating film 14 is formed on the semiconductor substrate 10. The interlayer insulating film 14 covers the switching transistor 11. Subsequently, the contact plug 15 is formed in the interlayer insulating film 14. The contact plug 15 is connected to the drain region 12 of the switching transistor.

Then, the metal interconnect layer 16 is formed on the interlayer insulating film 14. The metal interconnect layer 16 is connected to the contact plug 15. Then, the interlayer insulating film 17 is formed on the interlayer insulating film 14. Subsequently, the contact plug 18 is formed in the interlayer insulating film 17. The contact plug 18 is connected to the metal interconnect layer 16.

Then, the metal interconnect layers 19 and 20 are formed on the interlayer insulating film 17. The metal interconnect layer 19 is connected to the contact plug 18. The metal interconnect layer 20 is separated from the metal interconnect layer 19 and is formed like a stripe extending along the direction of the easy axis. It is located immediately above the gate electrode 13. Subsequently, the interlayer insulating film 21 is formed on the interlayer insulating film 17. The interlayer insulating film 21 covers the metal interconnect layers 19 and 20. Subsequently, the contact plug 22 is formed in the interlayer insulating film 21. The contact plug 22 is connected to the metal interconnect layer 19.

Figure 2B:
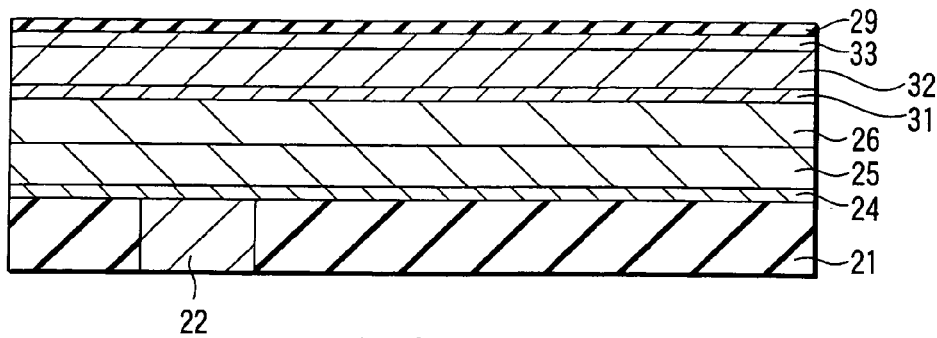

Then, in step S2 in FIG. 1C, a nonmagnetic layer and a ferromagnetic layer are formed on the interlayer insulating film 21. That is, as shown in FIG. 2B, a nonmagnetic conductive film is formed on the interlayer insulating film 21 and the contact plug 22. More specifically, the following layers are sequentially formed using a sputtering method: the Ta layer of, for example, 3 nm film thickness, the Al layer 25 of, for example, film thickness 30 nm, and the Ta layer 26 of, for example, film thickness 30 nm. The nonmagnetic conductive film is used to form a leading interconnect layer. Subsequently, a ferromagnetic layer is formed on the nonmagnetic conductive film. More specifically, the following layers are sequentially formed using the sputtering method: the seed layer 31 of, for example, 3 nm film thickness, the antiferromagnetic layer 32 of, for example, 15 nm film thickness, the pinning ferrromagnetic layer 33 of, for example, 5 nm film thickness. The multilayer film including the seed layer 31, the antiferromagnetic layer 32, and the pinning ferromagnetic layer 33 is used to form a pinning layer of the magneto resistive element.

Furthermore, the tunnel barrier film 29 is formed on the pinning ferromagnetic layer 33 (step S3). The tunnel barrier film 29 is formed, for example, in the following manner. An Al layer of, for example, film thickness 1 to 1.5 nm is formed on the pinning ferromagnetic layer 33 using the sputtering method. The Al layer is then plasma-oxidized using an ICP (Inductively Coupled Plasma) method. As a result, the Al layer is oxidized to form an $Al_2O_3$ layer forming the tunnel barrier film 29. Of course, instead of oxidizing Al, it is possible to form an $Al_2O_3$ layer on a ferromagnetic layer using, for example, the sputtering method or a CVD (Chemical Vapor Deposition). As a result, the structure shown in FIG. 2B is completed.

Figure 2C:
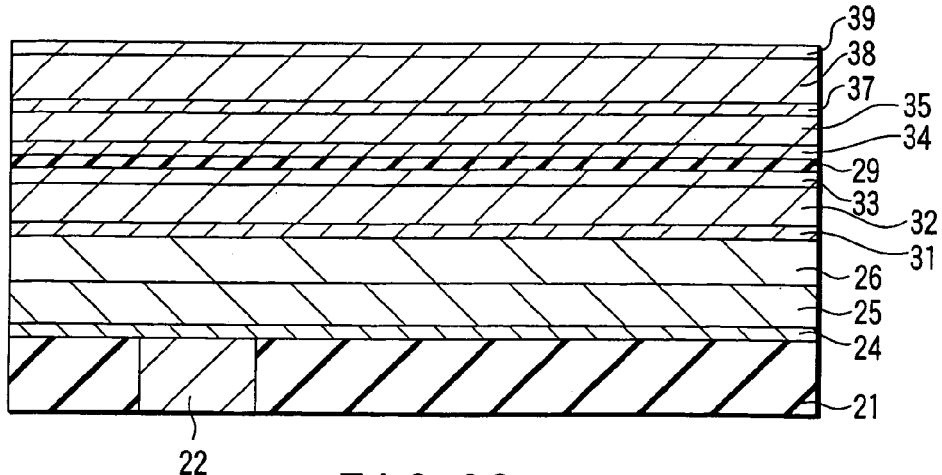

Then, in step S4 in FIG. 1C, a ferromagnetic layer and a nonmagnetic layer are formed on the tunnel barrier film 29. That is, as shown in FIG. 2C, the CoFe layer 34 of, for example, 4 nm film thickness and the permalloy layer 35 of, for example, 20 nm film thickness are sequentially formed on the tunnel barrier film 29 using the sputtering method. This multilayer film is used to form a free layer of the magneto resistive element. Subsequently, a nonmagnetic conductive film is formed on the permalloy 35. Specifically, the following layers are sequentially formed using the sputtering method: the Ta layer 37 of, for example, 20 nm film thickness, the Al layer 38 of, for example, 50 nm film thickness, and the Ta layer 39 of, for example, 10 nm film thickness. This nonmagnetic conductive film is used to form a cap layer. As a result, the structure shown in FIG. 2C is completed.

Then, in step S5 in FIG. 1C, a photo resist is applied to the surface of the nonmagnetic conductive film and is further patterned. That is, a photo resist 50 is applied to the surface of the Ta layer 39. Then, a photolithography technique is used to pattern the photo resist 50 so that the resist 50 has a pattern for forming the magneto resistive element such as the one shown in FIG. 2D. This pattern is formed like an ellipse the major axis of which extends along the direction of the easy axis. It should be appreciated that the pattern may have other shape such as a rectangle.

Then, in step S6 in FIG. 1C, the nonmagnetic conductive film and the ferromagnetic layer are patterned to form the cap layer 36 and the free layer 30. That is, as shown in FIG. 2E, an etching operation is performed by an RIE method (Reactive Ion Etching) or by Ar ion milling using the photo resist 50 as a mask. This etching is continued until the tunnel barrier film 29 is exposed. As a result, the Ta layers 39 and 37 and the Al layer 38 are patterned to form the cap layer 36. Further, the Py layer 35 and the CoFe layer 34 are patterned to form the free layer 30 of the magneto resistive element.

Subsequently, the resist 50 is removed (step S7).

Then, in step S8 in FIG. 1C, an Al layer is formed. That is, as shown in FIG. 2F, an Al layer 51 of 5 nm film thickness is formed on the tunnel barrier film 29, the free layer 30, and the cap layer 30 using the sputtering method. In this case, the Al layer 51 has a thickness of about 3 nm on the side of the free layer 30. The relationship between the film thickness of the Al layer 51 formed on the tunnel barrier film 29 and cap layer 36 and the film thickness of the Al layer 51 formed on the sides of the free layer 30 and cap layer 36 can be varied by the conditions under which Al is formed during sputtering. For example, this relationship can be controlled by the distance between a target and the semiconductor substrate, or the like.

Then, in step S9 in FIG. 1C, the Al layer is oxidized to form the $Al_2O_3$ layer 40. That is, as shown in FIG. 2G, the Al layer 51 is plasma-oxidized using the ICP method. Thus, the Al layer 51 becomes the $Al_2O_3$ layer 40, and the free layer 30 and the cap layer 36 are covered with the $Al_2O_3$ layer 40.

In steps S8 and S9, the Al layer 51 is desirably formed and oxidized without exposing the substrate to the atmosphere.

To accomplish this, a semiconductor fabricating apparatus must be provided which can continuously carry out sputtering and a plasma oxidization process. This fabricating apparatus has, for example, a sputtering chamber and a oxidization chamber as well as a mechanism that can carry the semiconductor substrate between these chambers without exposing it to the atmosphere. Then, after the Al layer 51 has been formed in the sputtering chamber, the substrate is carried to the oxidization chamber without being removed from the semiconductor fabricating apparatus. The Al layer 51 is then plasma-oxidized.

Then, in step S10 in FIG. 1C, the $Al_2O_3$ layer 40 is etched using the Ar ion milling or RIE method to form a side wall insulating film. Subsequently, in step S11, the tunnel barrier film 29 is etched using the Ar ion milling. In the present embodiment, the tunnel barrier film 29 is formed of $Al_2O_3$, so that the $Al_2O_3$ layer 40 and the tunnel barrier film 29 can be continuously etched under similar conditions. As a result, as shown in FIG. 2H, the $Al_2O_3$ layer 40 remains only on the tunnel barrier film 29 and on the side of the free layer 30 and on the side of part of the cap layer 36. Furthermore, the $Al_2O_3$ layer 40 is left so as to surround the side wall of the free layer 30.

Then, in step S12 in FIG. 1C, the ferromagnetic layer is patterned to form a pinning layer. That is, the ferromagnetic layer is etched using the Ar ion milling or the RIE method. As a result, the pinning layer 28 such as the one shown in FIG. 2I is formed. The side of the pinning layer 28 is formed to lie flush with the side of the $Al_2O_3$ layer 40. Accordingly, the width of the pinning layer 28 is formed to be larger than that of the free layer 30 by double the width of the $Al_2O_3$ layer 40. The present steps complete the elliptic magneto resistive element 27 the major axis of which extends along the direction of the easy axis. As described later, to control the adverse effects of leakage magnetic fields to reduce differences in the adverse effects of leakage magnetic fields among magneto resistive elements, all of the stacked film forming the pinning layer 28 may be patterned as described above but it is sufficient to pattern at least the pinning ferromagnetic layer 33 in step S12. In this case, the width of the pinning ferromagnetic layer 33 is formed to be larger than that of the free layer 30 by double the width of the $Al_2O_3$ layer 40.

Then, in step S13 in FIG. 1C, a protective insulating film is formed. That is, as shown in FIG. 2J, the sputtering method or the CVD (Chemical Vapor Deposition) method is used to form the $SiO_2$ film 41 on the Ta layer 26 so as to cover the magneto resistive element 27.

Subsequently, in step S14, a photo resist 52 is applied to the surface of the $SiO_2$ film 41. Then, the photo resist 52 is patterned using the photolithography technique as shown in FIG. 2J.

Then, in step S15 in FIG. 1C, the $SiO_2$ film 41 is patterned by anisotropic etching such as the RIE method using the photo resist 52 as a mask. As a result, the protective insulating film 41 such as the one shown in FIG. 2K is completed. Subsequently, the photo resist 52 is removed (step S16).

Then, in step S17 in FIG. 1C, the nonmagnetic conductive film 23 is patterned by the RIE method or ion milling using the protective insulating film 41 as a mask. As a result, the leading interconnect layer 23 such as the one shown in FIG. 2L is completed.

Subsequently, the interlayer insulating film 42 is formed on the interlayer insulating film 21. Then, the photolithography technique or the RIE method is used to make a contact hole that reaches the magneto resistive element 27. Furthermore, a conductor is filled into the contact hole to form the contact plug 43. Subsequently, the bit line 44 is formed on the interlayer insulating film 42 to complete the MRAM shown in FIG. 1A.

As described above, according to the first embodiment of the present invention, the yield of the MRAM can be improved. This will be described below.

First, the side wall insulating film 40 is formed on the sides of at least one of the two ferromagnetic layers arranged opposite each other with the tunnel barrier film 29 interposed therebetween. In the present embodiment, the side wall insulating film 40 is formed on the sides of the free layer 30 to surround its periphery. Accordingly, even if residue remains around the periphery of the magneto resistive element 27, it is possible to prevent a short circuit between the pinning layer 28 and the free layer 30 unless the residue is large enough to contact with both the pinning layer 28 and the cap layer 36, located higher than the side wall insulating film 40. For example, in the present embodiment, the side wall insulating film 40 has a height of about 80 nm. Consequently, it is possible to hinder a short circuit between the pinning layer 28 and the free layer 30 unless the residue remaining after the Ar ion milling is about 80 nm or more in size. With the conventional configuration, a short circuit may be caused by residue of size 1 to 1.5 nm, which is substantially equal to the film thickness of the tunnel barrier film. Therefore, the configuration according to the present embodiment allows the residue to be removed much more easily than the conventional one. As a result, the yield of MRAMs, notably large-scale MRAMs can be effectively improved.

Further, the formation of the side wall insulating film 40 serves to hinder a short circuit between the free layer and pinning layer. This eliminates the need to carry out the Ar ion milling described in FIG. 2I, in a diagonal direction. That is, the Ar ion milling can be accomplished using an incident angle substantially perpendicular to the semiconductor substrate surface. Consequently, the sides of the magneto resistive element 27 are substantially perpendicular to the semiconductor substrate surface. As a result, it is possible to hinder a short circuit between the adjacent magneto resistive elements 27. This contributes to improving the yield of the MRAM.

Furthermore, with the fabricating method according to the present embodiment, the Al layer 51, formed on the side walls of the magneto resistive element 27, is oxidized to form the side wall insulating film 40. With this fabricating method, the oxidation gradually proceeds from the outer sides of the Al layer 51. Finally, all of the Al layer 51 is oxidized to form the $Al_2O_3$ layer 40. In this case, oxygen is introduced into an end of the $Al_2O_3$ layer, the tunnel barrier film 29. When the free layer 30 is patterned by the Ar ion milling, the tunnel barrier film 29 has its surface beaten by Ar ions and is thus damaged. As a result, the oxygen may be lost at the end of the tunnel barrier film 29. Then, the insulating property of the $Al_2O_3$ layer 40 may be markedly lost to cause a short circuit between the free layer 30 and the pinning layer 28. With the fabricating method according to the present embodiment, when the Al layer 51 is oxidized, oxygen is also introduced into the end of the tunnel barrier film 29. Accordingly, the $Al_2O_3$ layer 40 has a sufficient insulating property. As a result, the free layer 30 and the pinning layer 28 can be electrically sufficiently separated from each other. That is, it is possible to prevent a short circuit in the magneto resistive circuit 27. Therefore, the yield of the MRAM can be improved.

Furthermore, according to the first embodiment of the present invention, the operational reliability of the MRAM is improved. This will be described below.

With the fabricating method according to the present embodiment, the Ar ion milling described in FIG. 2I can be accomplished using an incident angle substantially perpendicular to the semiconductor substrate surface. Accordingly, the shape of the free layer 30 in the magneto resistive element 27 can be easily controlled. It is thus possible to hinder a value for a current required for a write from varying among magneto resistive elements. As a result, a write operation margin for the MRAM can be increased to improve the operational reliability of the MRAM.

Moreover, the shape of the free layer 30 in the magneto resistive element 27 can be easily controlled as described above, so that it is easy to control the horizontal extension of the pinning layer 28 with respect to the free layer 30. It is thus possible to reduce differences among magneto resistive elements in the adverse effects of leakage magnetic fields from the pinning layer 28, or the like. As a result, the write operation margin for the MRAM can be increased to improve the operational reliability of the MRAM.

Figure 3:
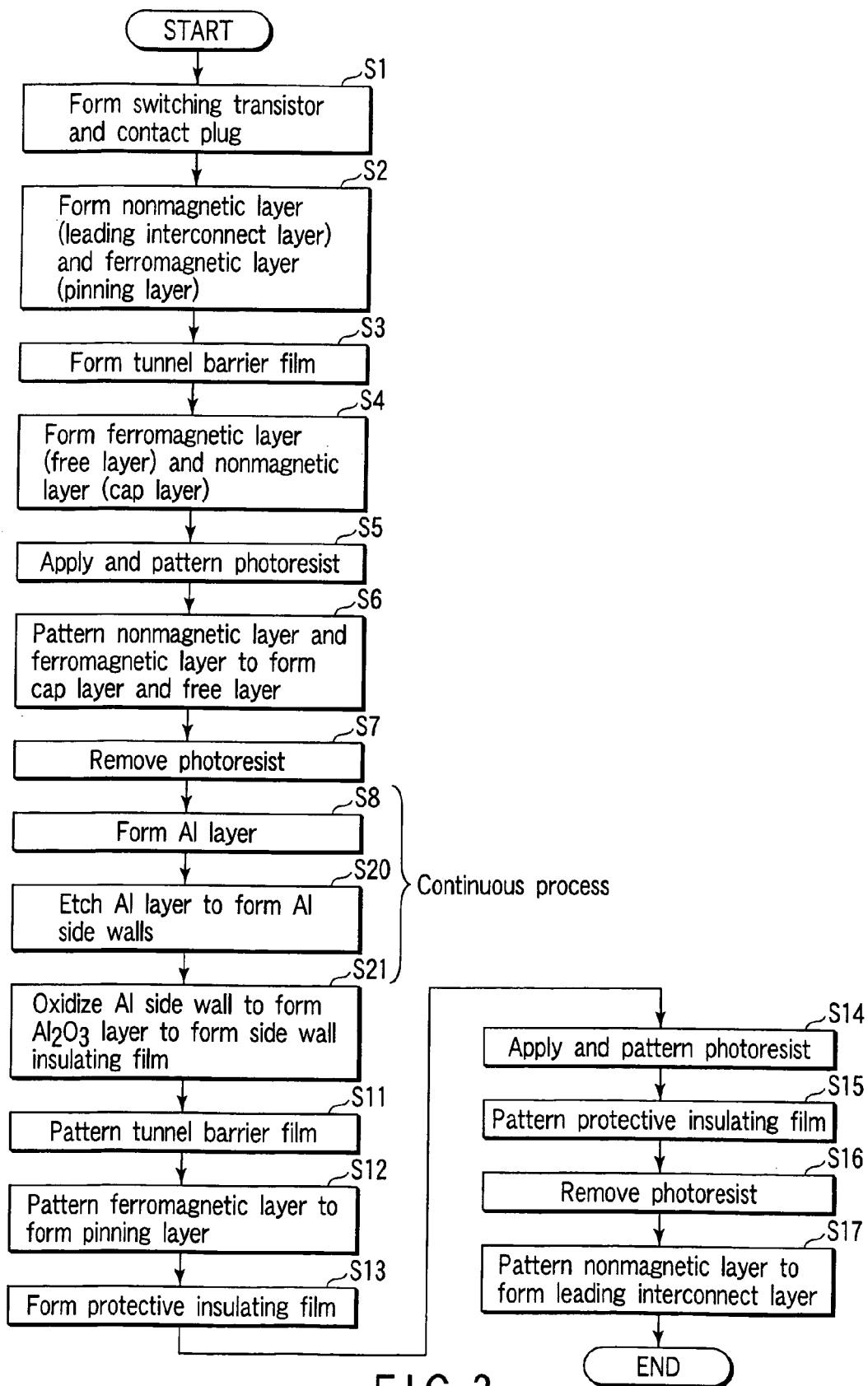
FIG. 3 is a flow chart of MRAM fabricating steps according to a second embodiment of the present invention.

Now, with reference to FIGS. 3, 4A, and 4B, description will be given of method of fabricating a semiconductor memory device according to a second embodiment of the present invention. FIG. 3 is a flow chart of MRAM fabricating steps according to the present embodiment. FIGS. 4A and 4B are sectional views sequentially showing some of the fabricating steps. The present embodiment is used to describe another method of fabricating the MRAM shown in FIGS. 1A and 1B, described in the above first embodiment.

First, the structure shown in FIG. 2F is obtained through steps S1 to S8, described in the above first embodiment. Subsequently, in step S20 in FIG. 3, the Al layer 51 is etched. That is, as shown in FIG. 4A, the Al layer 51 is etched using the Ar ion milling or the RIE method. As a result, the Al layer 51 remains only on the tunnel barrier film 29 and on the sides of the free layer 30 and cap layer 36. Furthermore, the Al layer 51 is left so as to surround the periphery of the free layer 30.

Then, in step S21 in FIG. 3, the Al layer 51 is oxidized to form the Al$_2$O$_3$ layer. That is, the Al layer 51 is plasma-oxidized using, for example, the ICP method. As a result, the side wall insulating film 40 formed of an Al$_2$O$_3$ layer is completed as shown in FIG. 4B.

In the fabricating method according to the present embodiment, steps S8, S20, and S21 are also desirably executed without exposing the substrate to the atmosphere. To accomplish this, a semiconductor fabricating apparatus must be provided which can continuously execute the sputtering, plasma oxidization process, and RIE or ion milling. The series of processes are executed within this semiconductor fabricating apparatus. However, if the RIE is compared with the ion milling, the former is more preferable.

Then, in step S11, the tunnel barrier film 29 is patterned to obtain the structure shown in FIG. 2H. Subsequently, as in the case with the first embodiment, steps S12 to S17 are executed to complete the MRAM shown in FIGS. 1A and 1B.

According to the present embodiment, effects similar to those of the above first embodiment are obtained. At the same time, the operational reliability of the MRAM can be further improved. This will be described below.

With the fabricating method according to the present embodiment, after the Al layer 51 has been etched, it is oxidized to form the Al$_2$O$_3$ layer 40. Accordingly, the step of etching the Al$_2$O$_3$ layer 40 need not be executed before the pinning layer 28 is patterned in contrast with the first embodiment. During the Ar ion milling, Al can be etched faster than Al$_2$O$_3$. Consequently, the etching operation can be easily stopped once the Ta layer 26, forming the leading interconnect layer, is exposed when the ferromagnetic layer is etched by the Ar ion milling in order to form the pinning layer 28. As a result, the resistance distribution of the leading interconnect layer 23 is improved. Furthermore, if the Al is etched using the RIE, the resistance distribution of the leading interconnect layer 23 can be further improved. This is because the use of the RIE enables the Al layer 51 to be selectively etched and enables the etching to be reliably stopped at the surface of the tunnel barrier film 29. In this case, only the tunnel barrier film 29 and the pinning layer 28 must be etched by the Ar ion milling. As a result, the write operation margin for the MRAM can be increased to improve the operational reliability of the MRAM.

Figure 5:
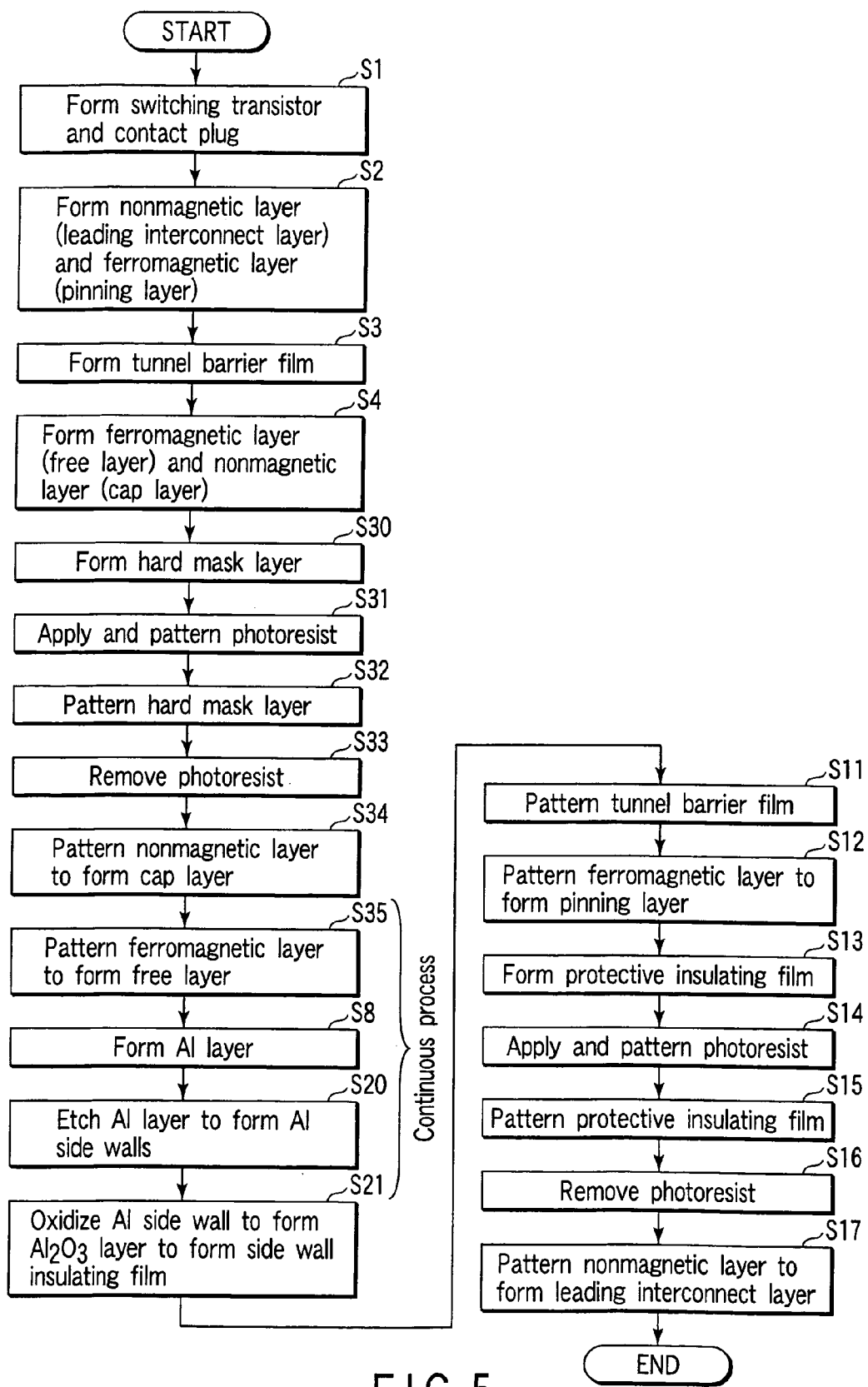
FIG. 5 is a flow chart of MRAM fabricating steps according to a third embodiment of the present invention.

Now, with FIGS. 5 and 6A to 6I, description will be given of method of fabricating a semiconductor memory device according to a third embodiment of the present invention. FIG. 5 is a flow chart of MRAM fabricating steps according to the present embodiment. FIGS. 6A to 6I are sectional views sequentially showing some of the fabricating steps. The present embodiment relates to the MRAM fabricating method according to the above second embodiment which uses a hard mask.

First, the structure shown in FIG. 2C is obtained through steps S1 to S4, described in the above first embodiment. Then, in step S30 in FIG. 5, a hard mask layer 53 is formed on the Ta layer 39 using the sputtering or CVD method.

Figure 6A:
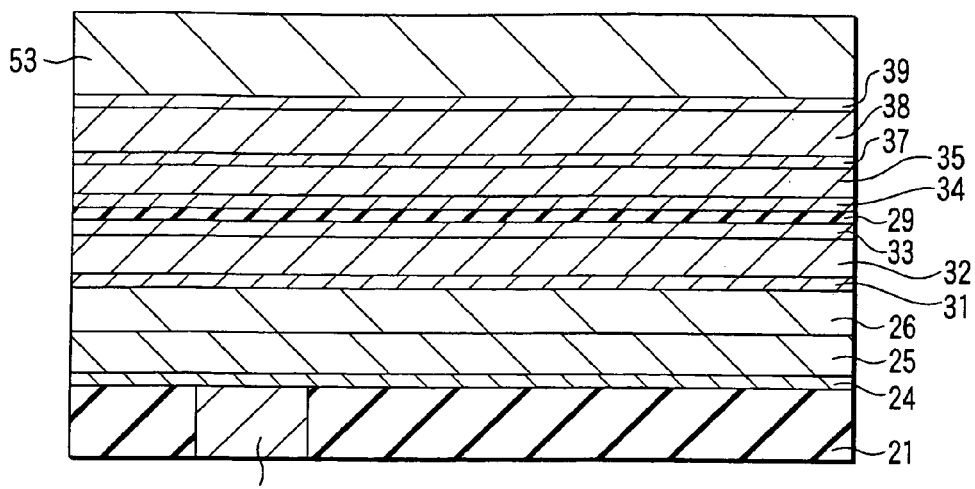
FIGS. 6A to 6I are sectional views sequentially showing the MRAM fabricating steps according to the third embodiment of the present invention.
Figure 6B:
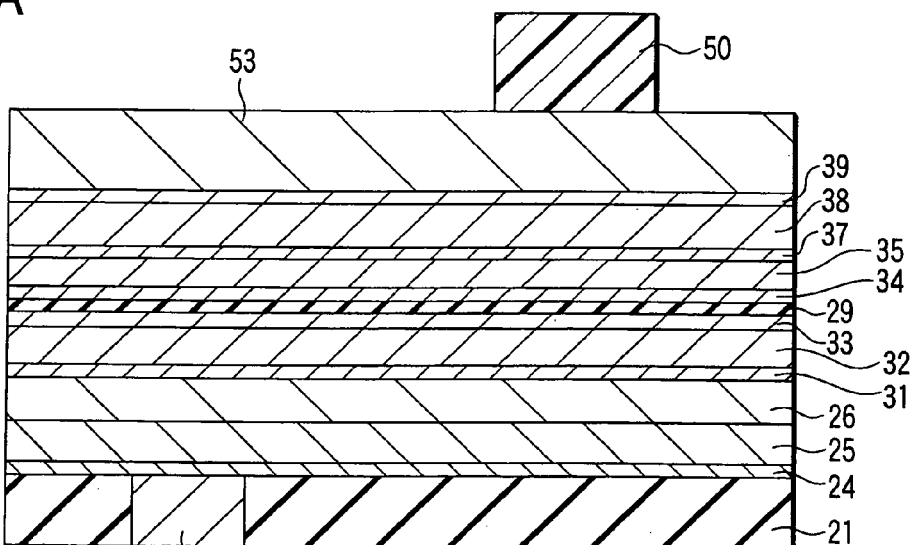

Then, in step S31 in FIG. 5, a photo resist is applied to the surface of the hard mask layer 53 and is further patterned. That is, as shown in FIG. 6B, the photolithography technique is used to pattern the photo resist 50 so that the resist 50 has a pattern for forming the magnetic resistive element as in the case with the step described in step S5 in the above first embodiment.

Figure 6C:
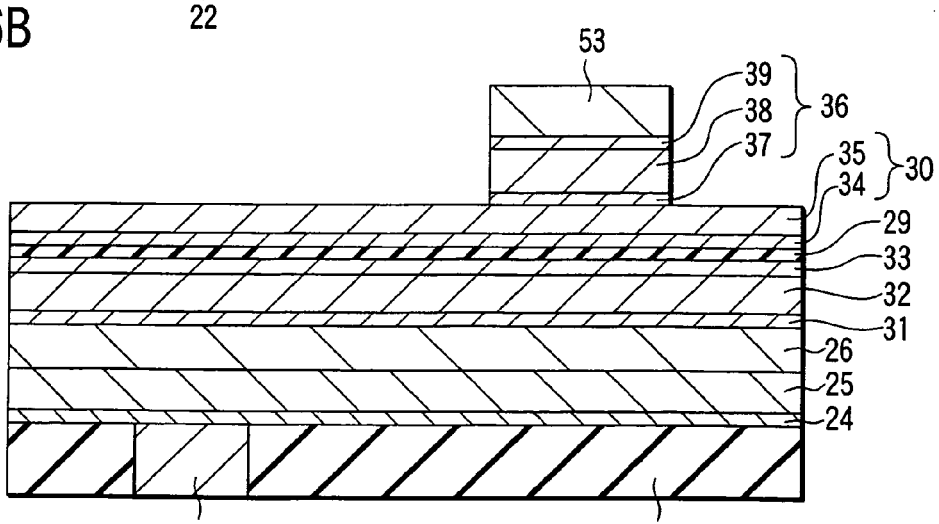

Then, in step S32 in FIG. 5, the hard mask layer 53 is patterned by the RIE method or Ar ion milling using the photo resist 50 as a mask. Subsequently, the photo resist 50 is removed (step S33). Subsequently, in step S34 in FIG. 5, a nonmagnetic layer (Ta layer 39 and 37 and Al layer 38) is patterned by the RIE method or Ar ion milling using the hard mask layer 53 as a mask. As a result, the cap layer 36 such as the one shown in FIG. 6C is completed.

Figure 6D:
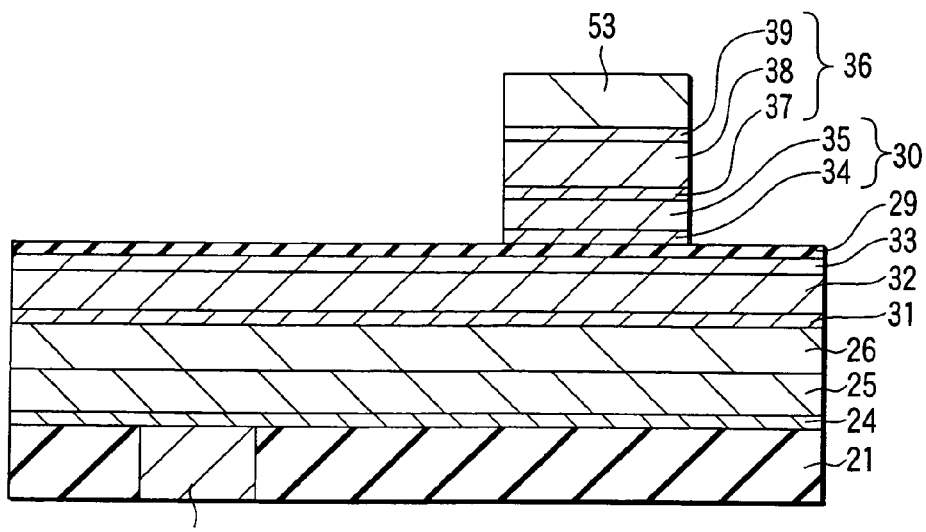

Then, in step S35 in FIG. 5, the ferromagnetic layer is patterned to form the free layer 30. That is, as shown in FIG. 6D, an etching operation is performed until the tunnel barrier film 29 is exposed by the RIE method or Ar ion milling using the hard mask layer 53 as a mask. As a result, the Py layer 35 and the Co layer 34 are patterned to form the free layer 30 of the magneto resistive element.

Figure 6E:
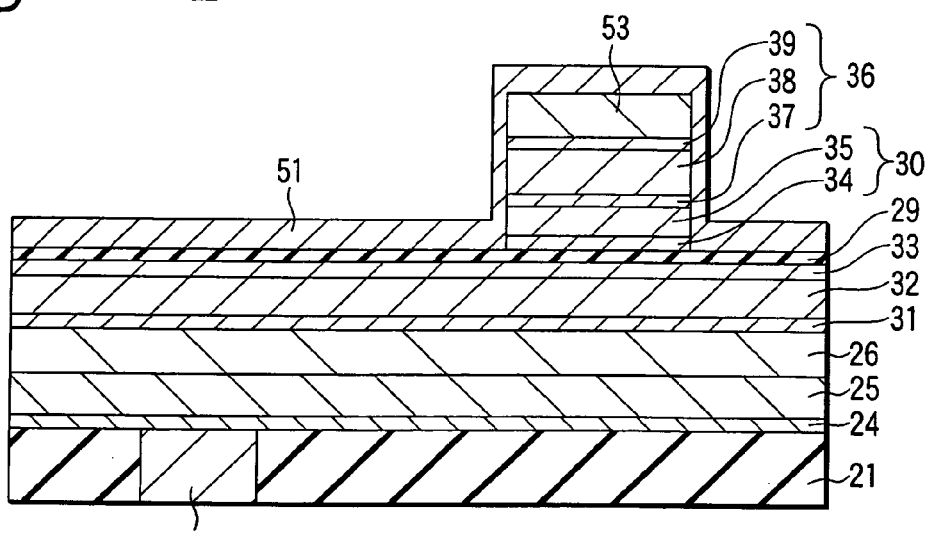

Then, in step S8 in FIG. 5, an Al layer is formed. That is, as shown in FIG. 6E, the Al layer 51 of about 5 nm film thickness is formed on the tunnel barrier film 29, the free layer 30, the cap layer 36, and the hard mask layer 53 using the sputtering method. The present step corresponds to step S8 described in the above first embodiment.

Figure 6F:
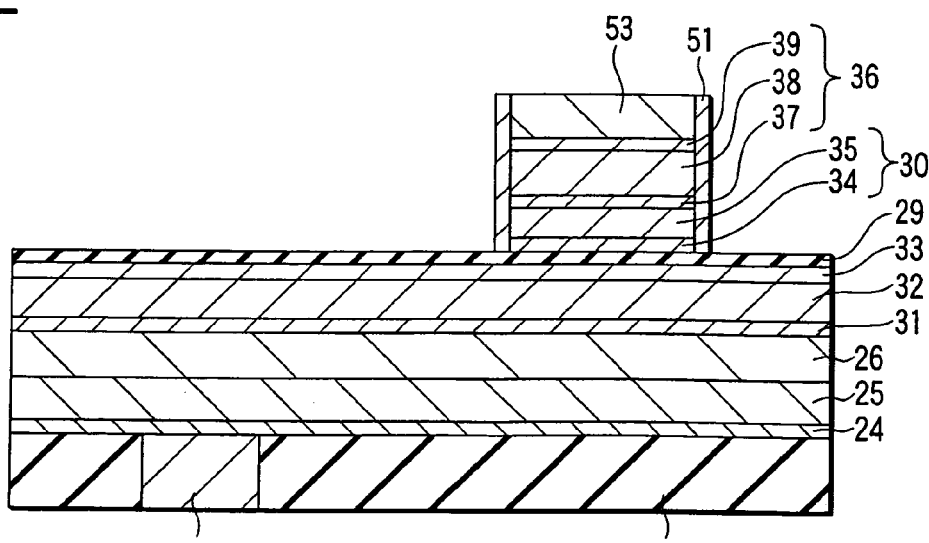

Then, in step S20 in FIG. 5, the Al layer 51 is etched. That is, as shown in FIG. 6F, the Al layer 51 is etched using the Ar ion milling or the RIE method. As a result, as shown in the figure, the Al layer 51 remains only on the tunnel barrier film 29 and on the sides of the free layer 30, cap layer 36, and hard mask layer 53. In particular, the Al layer 51 is left so as to surround the periphery of the free layer 30.

Figure 6G:
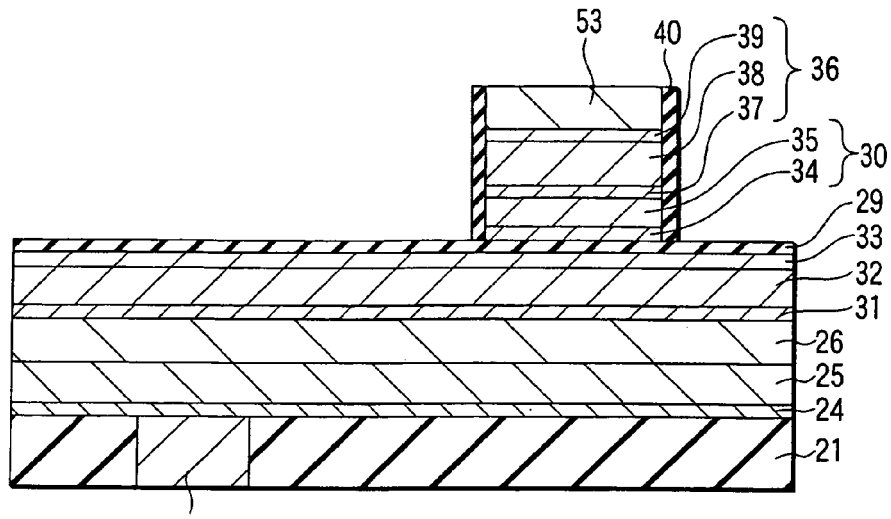

Then, in step S21 in FIG. 5, the Al layer 51 is oxidized to form an Al$_2$O$_3$ layer. That is, the Al layer 51 is plasma-oxidized using, for example, the ICP method. As a result, the side wall insulating film 40 formed of the $Al_2O_3$ layer is completed as shown in FIG. 6G.

In the fabricating method according to the present embodiment, steps S35, S8, S20, and S21 are also desirably executed without exposing the substrate to the atmosphere. To accomplish this, a semiconductor fabricating apparatus must be provided which can continuously execute the sputtering, plasma oxidization process, and RIE or ion milling.

Figure 6H:
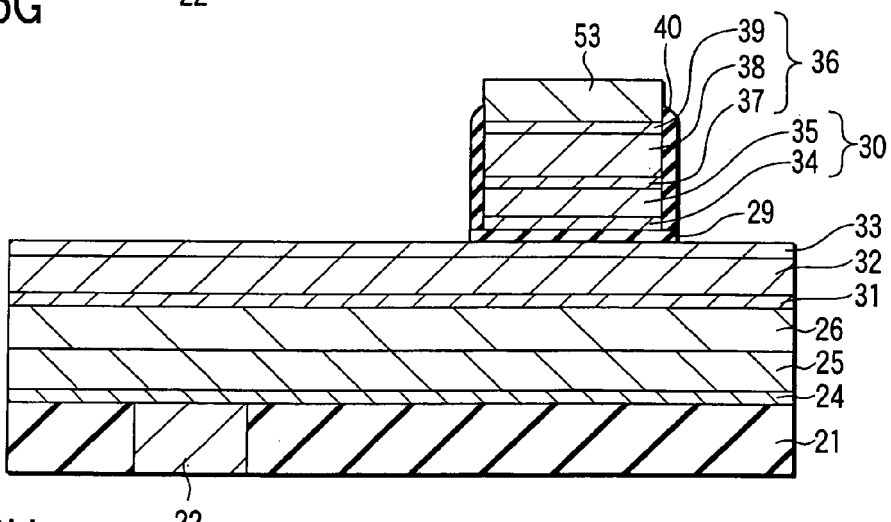
Figure 6I:
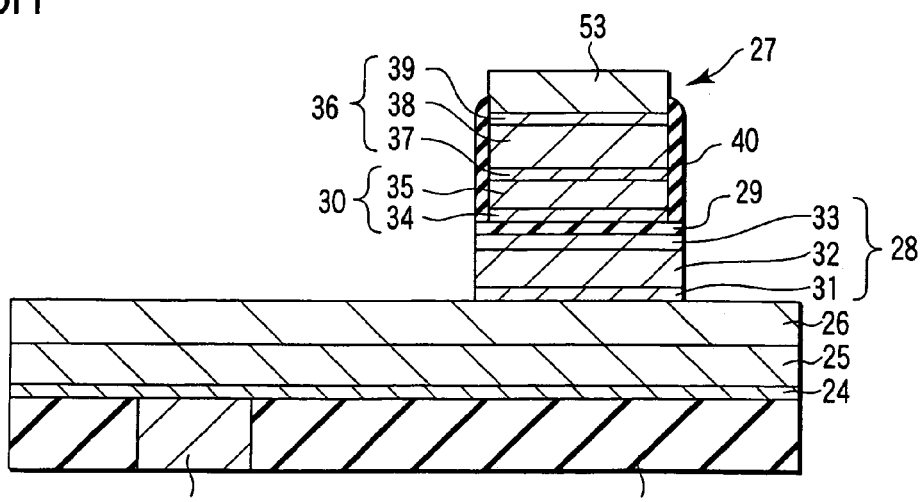

Then, in step S11 in FIG. 5, the tunnel barrier film 29 is patterned to obtain the structure shown in FIG. 6H. Subsequently, in step S12, the ferromagnetic layer is patterned. As a result, the pinning layer 28 such as the one shown in FIG. 6I is completed.

Subsequently, as described in the above first embodiment, steps S13 to S17 are executed to complete the MRAM.

With the fabricating method according to the present embodiment, effects similar to those of the above first and second embodiments are obtained.

Figure 7:
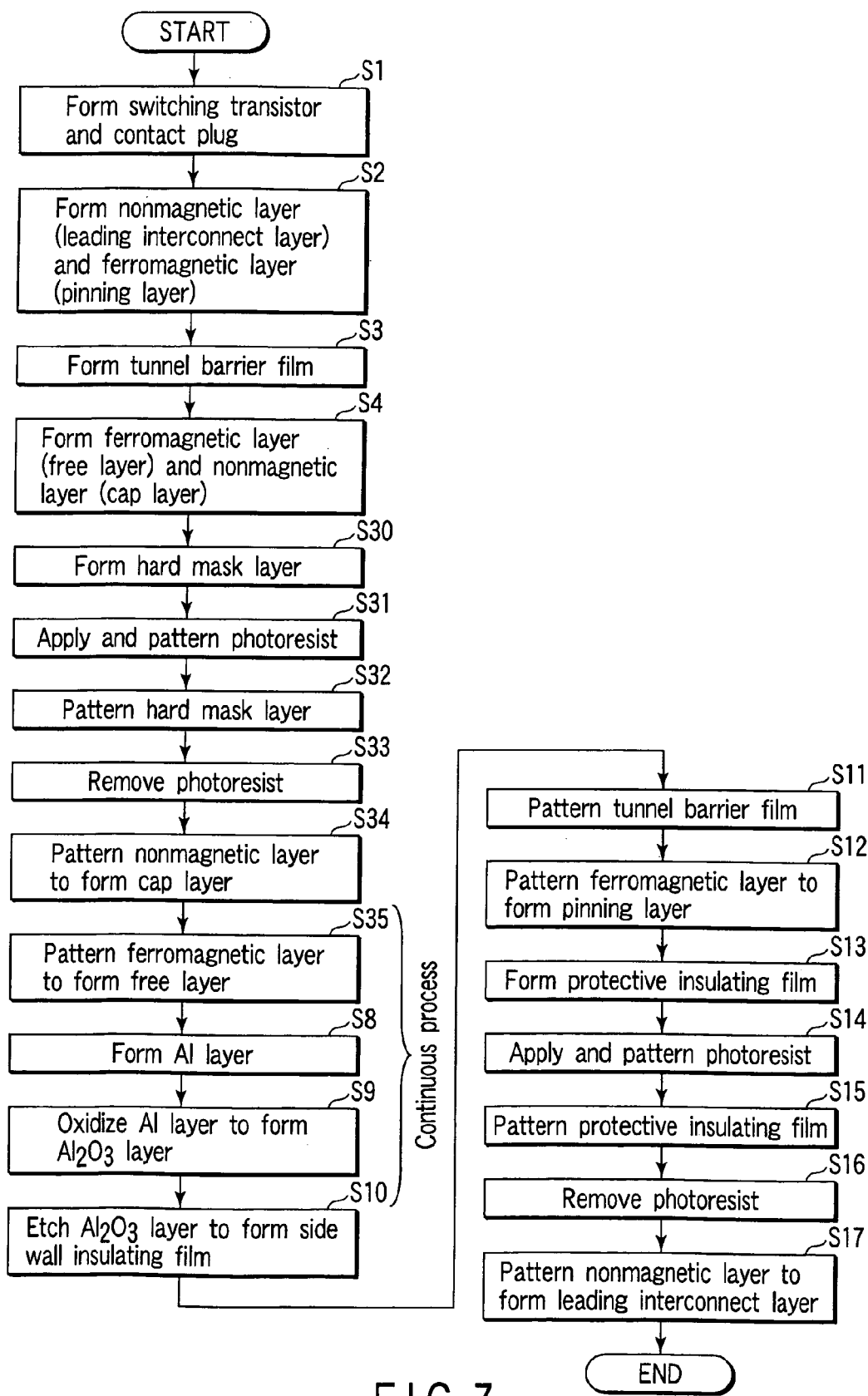
FIG. 7 is a flow chart of MRAM fabricating steps according to a variation of the third embodiment of the present invention.

FIG. 7 is a flow chart of MRAM fabricating steps according to a variation of the present embodiment. The present variation relates to the above first embodiment which uses a hard mask layer. That is, even with a hard mask layer, the side wall insulating film may be formed by patterning the $Al_2O_3$ layer.

Figure 8:
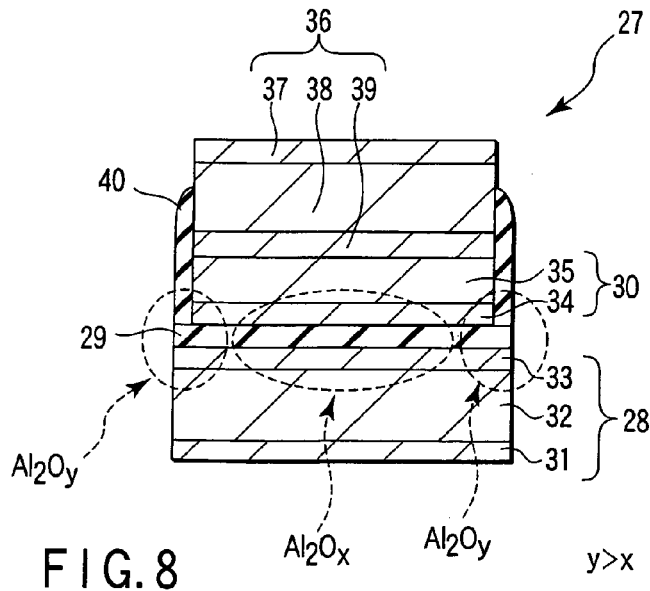
FIG. 8 is a sectional view of a magneto resistive element provided in an MRAM according to a fourth embodiment of the present invention.

Then, with reference to FIG. 8, description will be given of a semiconductor memory device according to a fourth embodiment of the present invention. FIG. 8 is a sectional view of a memory cell in an MRAM, notably its magneto resistive element.

As shown in the figure, the magneto resistive element 27 of the MRAM according to the present embodiment corresponds to the arrangement according to the first to third embodiments in which the composition of $Al_2O_3$ as the tunnel barrier film 29 is improved. That is, the tunnel barrier film 29 has a higher oxygen content at the end than in the center of the magneto resistive element 27. Specifically, the composition of the tunnel barrier film is $Al_2O_x$ in the center of the magneto resistive element and is $Al_2O_y$ at its end, where x and y are both close to 3 and y>x.

The present structure can be formed by increasing, in the above first to third embodiments, the time required for the oxidizing process to provide excessive oxidization when the Al layer 51 is oxidized. The excessive oxidization causes oxygen to enter the tunnel barrier film 29. As a result, the oxygen content in $Al_2O_3$ is higher at the end of the magneto resistive element. More specifically, in the steps in FIGS. 2G, 4B, and 6G, oxygen is introduced into an area of the tunnel barrier film 29 which is located immediately below the in-surface edge of the free layer 20. This enables the oxygen content in this area of the tunnel barrier film 29 to be higher than that in the in-surface center of the free layer 30.

With the configuration according to the present embodiment, effects similar to those of the above first and second embodiments are obtained. At the same time, the operational reliability of the MRAM can be further improved. This will be described below.

Figures 9A, 9B:
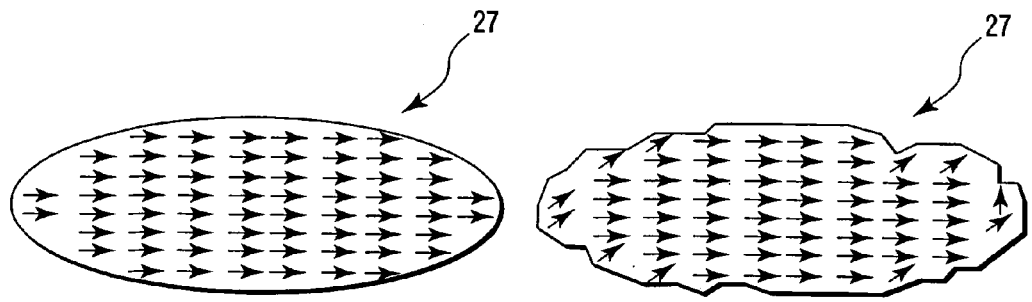
FIG. 9A is a plan view of an ideal magneto resistive element, showing the orientations of spins.
FIG. 9B is a plan view of an actual magneto resistive element, showing the orientations of spins.

FIG. 9A shows the planar shape of an ideal magneto resistive element. Intrinsically, the magneto resistive element is desirably perfectly elliptic. In this case, as shown in the figure, the orientations of spins are substantially fixed.

However, the formation of a magneto resistive element of 0.1 µm size requires a very difficult machining technique. Accordingly, as shown in FIG. 9B, the periphery of the magneto resistive element is actually prone to be somewhat notched. In such a situation, the orientations of spins in the periphery are disturbed. Thus, the orientations of spins in the free layer are not necessarily parallel/antiparallel with the pinning layer. For an MRAM of a Gbit class, the adverse effects in the periphery of the MTJ element are not negligible because its magneto resistive element is smaller. Accordingly, the MR ratio of the magneto resistive element decreases substantially. As a result, the read operation margin may decrease to degrade the operational reliability of the MRAM.

Figure 9C:
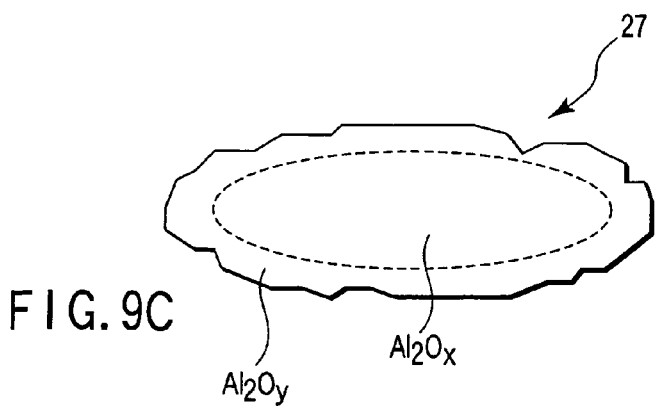
FIG. 9C is a plan view of the magneto resistive element provided in the MRAM according to the fourth embodiment of the present invention.

However, with the configuration according to the present embodiment, as shown in FIG. 9C, the tunnel barrier film 29 has a higher oxygen content in the periphery of the magneto resistive element, which tends to be notched. Consequently, tunnel resistance per unit area is low in the center of the magnet resistive element, while it is high at the end of the element. That is, a tunnel current conducts easily through the center of the magneto resistive element but not through its end. Then, the area of the tunnel barrier film 29 which has the composition of $Al_2O_y$ does not substantially function as a magneto resistive element. The orientations of spins are prone to be disturbed in this are. In contrast, the area of the tunnel barrier film 29 which has the composition of $Al_2O_x$ substantially function as a magneto resistive element. The orientations of spins are substantially fixed in this are. This reduces the adverse effects on the MR ratio of the disturbed spin orientations at the end of the magneto resistive element. This in turn serves to provide a reliable MRAM of a Gbit class which has a large read margin.

Figure 10:
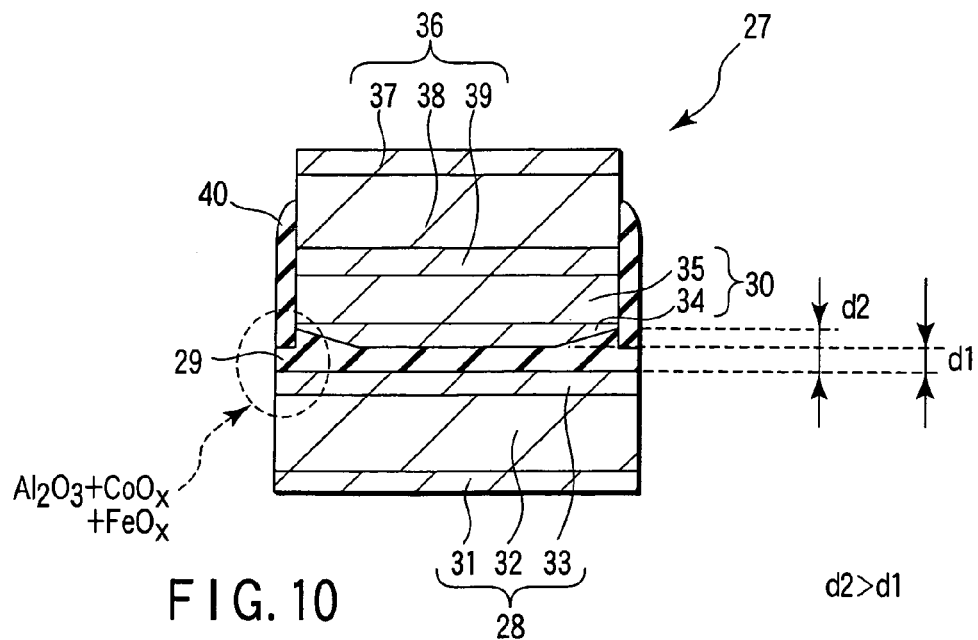
FIG. 10 is a sectional view of a magneto resistive element provided in an MRAM according to a fifth embodiment of the present invention.
Figure 11:
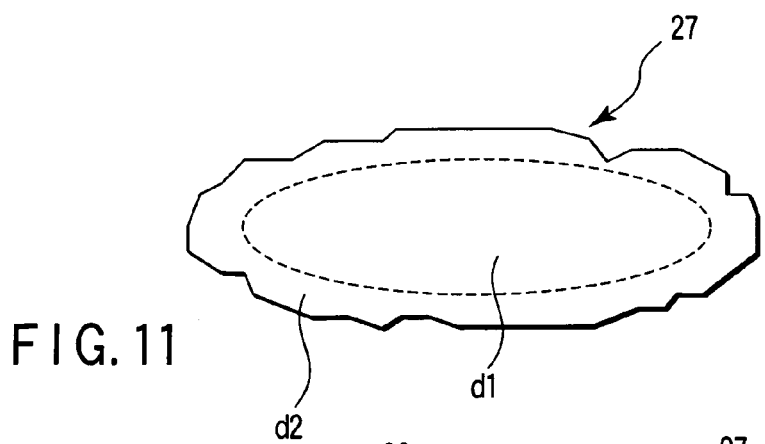
FIG. 11 is a plan view of the magneto resistive element provided in the MRAM according to the fifth embodiment of the present invention.

Now, with reference to FIG. 10, description will be given of a semiconductor memory device according to a fifth embodiment of the present invention. FIG. 10 is a sectional view of a memory cell in an MRAM, notably, its magneto resistive element.

As shown in this figure, the magneto resistive element 27 of the MRAM according to the present embodiment corresponds to the arrangement according to the above first to third embodiments in which the tunnel barrier film 29 has a larger film thickness at the end of the magneto resistive element. That is, the tunnel barrier film 29 has a film thickness d1 in the center of the magneto resistive element and a film thickness d2 at its end. In this case, d2>d1.

The present structure can be formed by increasing, in the above first to third embodiments, the time required for the oxidizing process to provide excessive oxidization when the Al layer 51 is oxidized. The excessive oxidization causes oxygen to enter not only the tunnel barrier film 29 but also an area of the in-surface edge of the free layer 30 which contacts with the tunnel barrier film 29. As a result, a part of the CoFe layer 34, forming the free layer 30, is oxidized to form a $CoO_x$ layer and an $FeO_x$ layer. The $CoO_x$ layer and the $FeO_x$ layer are insulators and function as a part of the tunnel barrier film. That is, at the end of the magneto resistive element, the tunnel barrier film 29 is formed of an $Al_2O_3$ layer, a $CoO_x$ layer, and an $FeO_x$ layer. Consequently, the tunnel barrier film 29 apparently has a larger film thickness in the center than at the end of the magneto resistive element.

With the present embodiment, not only the effects described in the above first and second embodiments but also the effects described in the fourth embodiment are obtained. That is, with the structure according to the present embodiment, the tunnel barrier film 29 has a larger film thickness in the periphery of the magneto resistive element 27, which tends to be notched. Consequently, the tunnel resistance per unit area is low in the center of the magnet resistive element, while it is high at the end of the element. That is, a tunnel current flows easily through the center of the magneto resistive element but not through its end. As a result, the effects described in the above fourth embodiment contribute to reducing the adverse effects on the MR ratio of the disturbed spin orientations at the end of the magneto resistive element. This in turn serves to provide a reliable MRAM having a large read margin.

Figure 12:
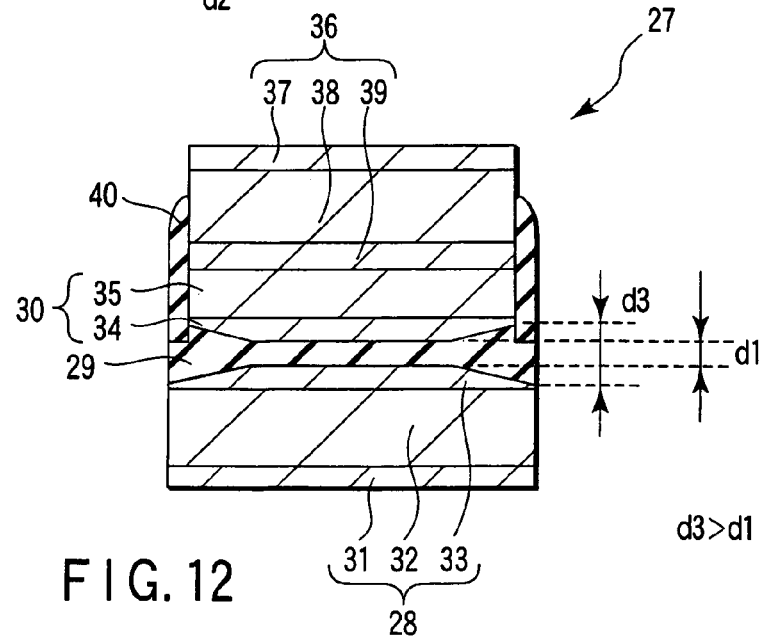
FIG. 12 is a sectional view of a magneto resistive element provided in an MRAM according to a sixth embodiment of the present invention.

Now, with reference to FIG. 12, description will be given of a semiconductor memory device according to a sixth embodiment of the present invention. FIG. 12 is a sectional view of a memory cell in an MRAM, notably, its magneto resistive element.

As shown in this figure, the magneto resistive element 27 of the MRAM according to the present embodiment corresponds to the arrangement according to the above first to third embodiments in which the tunnel barrier film 29 has a much larger film thickness at the end of the magneto resistive element. That is, the tunnel barrier film 29 has the film thickness d1 in the center of the magneto resistive element and a film thickness d3 at its end. In this case, d3>d2>d1.

The present structure can be formed by increasing, in the above first to third embodiments, the time required for the oxidizing process to provide excessive oxidization when the Al layer 51 is oxidized. The excessive oxidization causes oxygen to enter not only the tunnel barrier film 29 but also the pinning layer 28 and the free layer 30. As a result, a $CoO_x$ layer and an $FeO_x$ layer are formed by oxidizing a part of the pinning ferromagnetic layer 33, forming the pinning layer 28, and a part of the CoFe layer 34, forming the free layer 30. Thus, at the end of the magneto resistive element, the tunnel barrier film 29 is formed of an $Al_2O_3$ layer, and a $CoO_x$ and $FeO_x$ layers formed by oxidizing the CoFe layers 33 and 34. Consequently, the tunnel barrier film 29 apparently has a larger film thickness in the center than at the end of the magneto resistive element.

With the present embodiment, effects similar to those of the fifth embodiments are obtained. Further, the tunnel resistance at the end of the magneto resistive element can be further increased compared to the fifth embodiment. Therefore, the read margin can be further increased to provide a reliable MRAM.

Now, with reference to FIG. 13, description will be given of a semiconductor memory device according to a seventh embodiment of the present invention. FIG. 13 is a sectional view of a memory cell in an MRAM, notably, its magneto resistive element.

As shown in the figure, the magneto resistive element 27 comprises the pinning layer 28, the tunnel barrier film 29 formed on the pinning layer 28, and the free layer 30 formed on the tunnel barrier film 29. The pinning layer 28 has a stacked structure including the seed layer 31 formed of, for example, Py, the antiferromagnetic layer 32 formed of, for example, IrMn, and the pinning ferromagnetic layer 33 formed of, for example, CoFe. Further, the free layer 30 has a multilayer structure Py 35/CoFe 34. The tunnel barrier film 29 has the film thickness d1 in the center of the magneto resistive element and a film thickness d4 at its end (d4>d1).

Now, with reference to FIGS. 14A and 14B, description will be given of method of forming a magneto resistive element according to the present embodiment. FIGS. 14A and 14B are sectional views sequentially showing some of the MRAM fabricating steps.

Figure 2D:
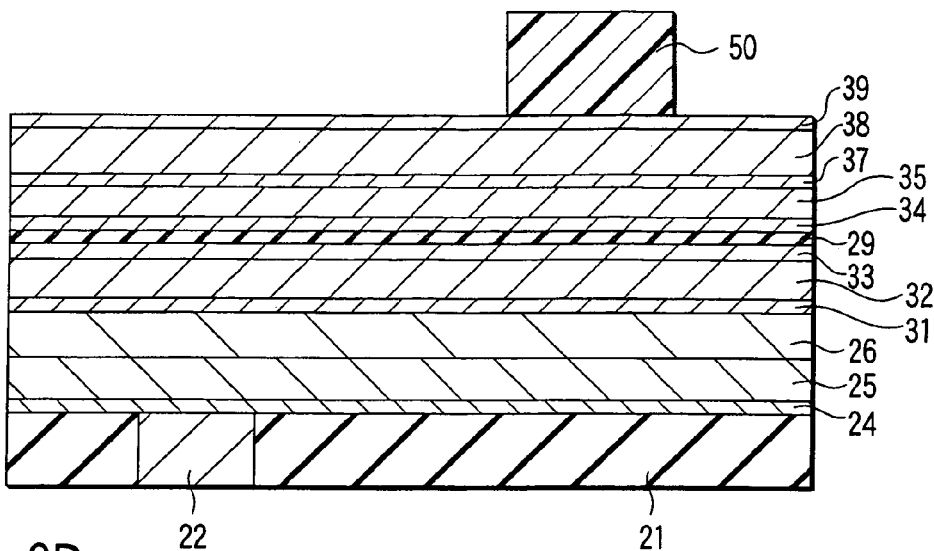
Figure 2E:
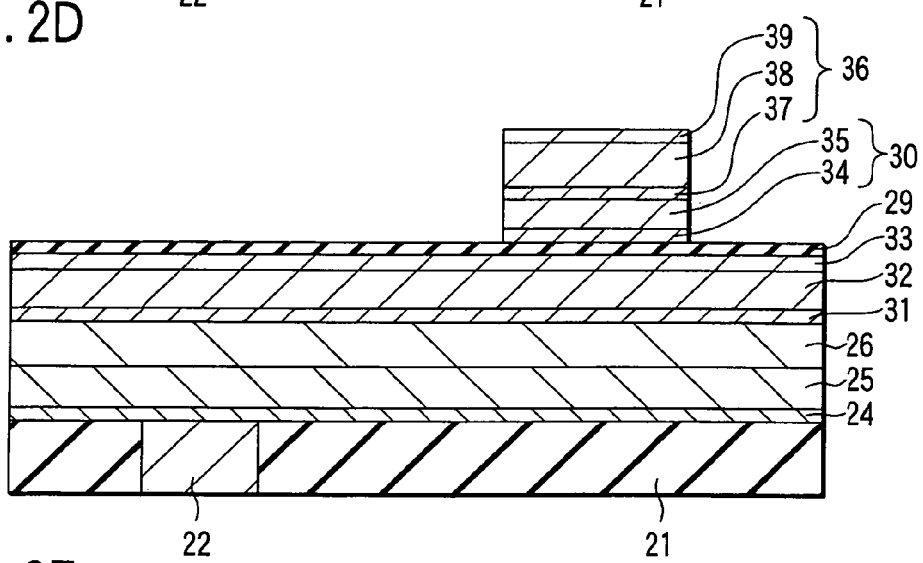
Figure 2F:
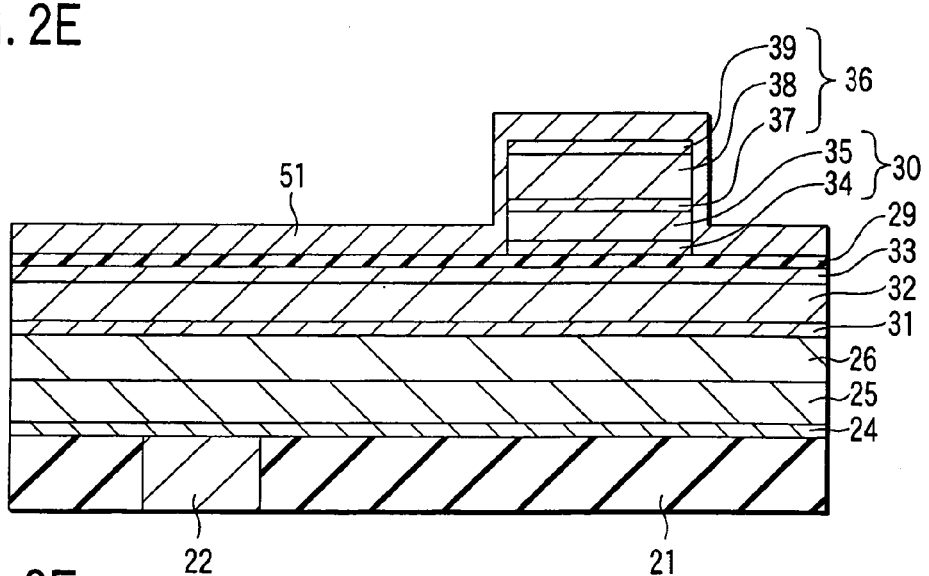
Figure 2G:
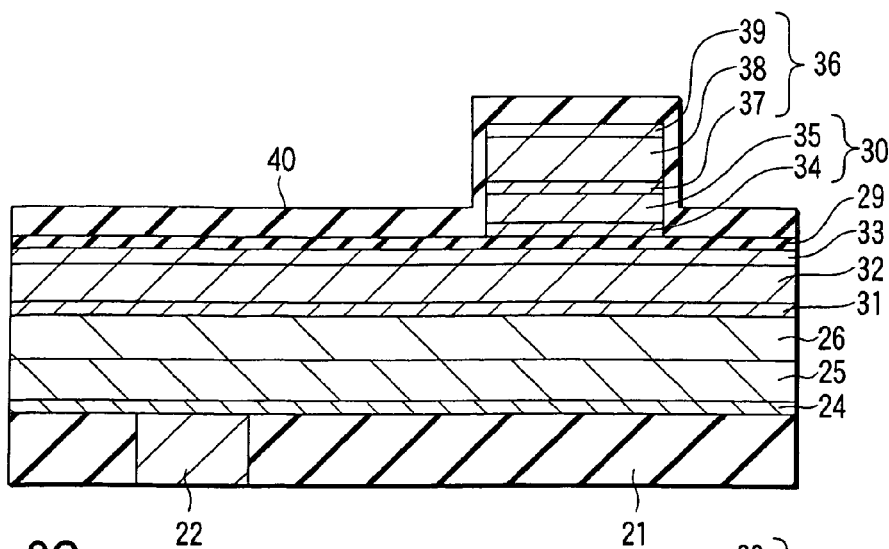
Figure 2H:
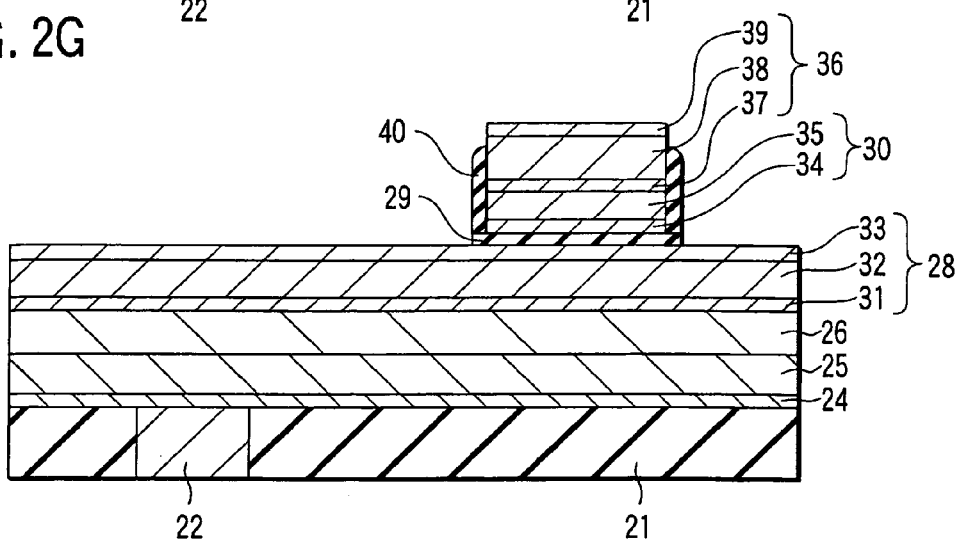
Figure 2I:
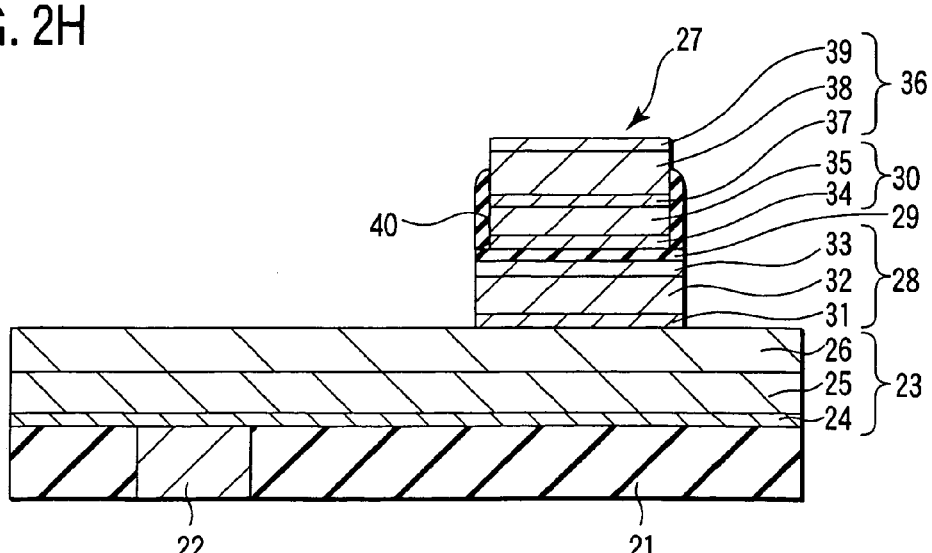
Figure 2J:
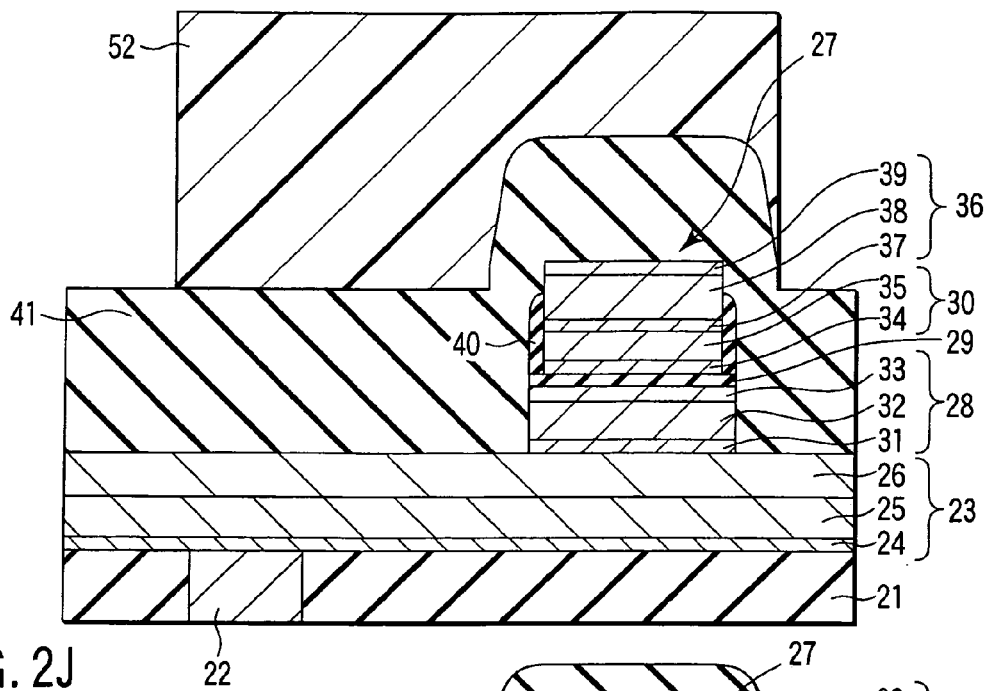
Figure 2K:
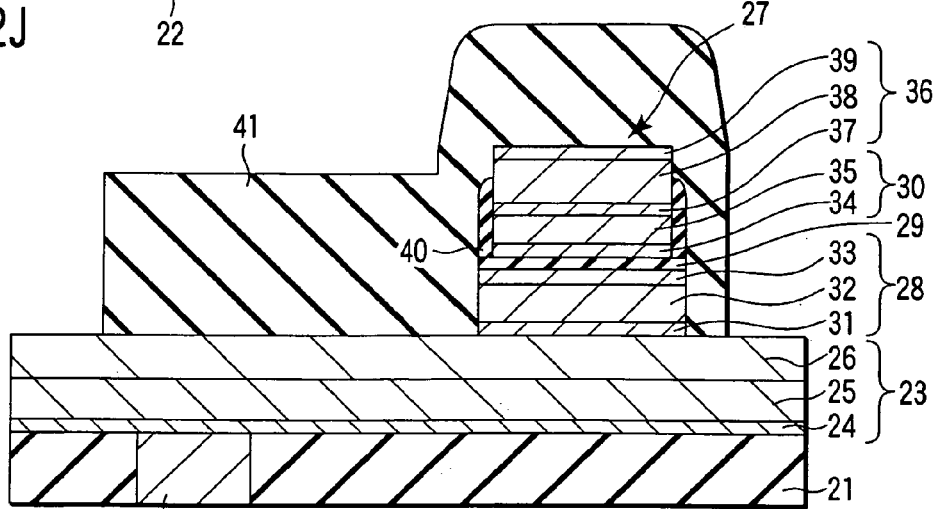
Figure 2L:
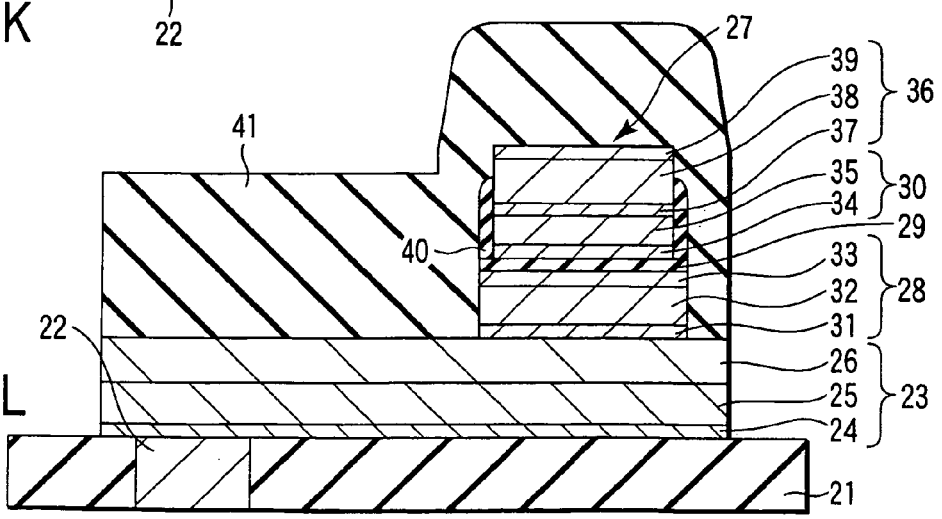

First, the structure shown in FIG. 2D is obtained by executing steps S1 to S5 in FIG. 1C, described in the above first embodiment. Then, in an $Ar/Cl_2$ mixed gas and, for example, with the substrate temperature set at 220° C., an etching operation is performed by the RIE method using the photo resist 50 as a mask. This etching operation is continued until the Ta layer 26, a part of the leading interconnect layer, is exposed. As a result, the Ta layer 39, the Al layer 38, the Ta layer 37, the Py layer 35, the CoFe layer 34, the $Al_2O_3$ layer 29, the pinning ferromagnetic layer 33, the antiferromagnetic layer 32, and the seed layer 31 are sequentially etched to obtain a magneto resistive element having the structure shown in FIG. 14A. During the etching, some chloride ions adhere to the neighborhood of end of the $Al_2O_3$ layer 29. Then, a very small amount of chloride atoms are diffused toward the inside of the magneto resistive element along the interface between the $Al_2O_3$ layer 29 and the CoFe layers 33 and 34 owing to the substrate temperature of 220° C.

Then, the magneto resistive element is exposed to an oxidization atmosphere. More specifically, the magneto resistive element is oxidized, for example, for about 5 minutes in an oxygen atmosphere at a pressure of about 200 Torr. Then, the CoFe layers 33 and 34, arranged over and under the tunnel barrier film 29, respectively, are oxidized at a higher speed in their areas which correspond to the end of the magneto resistive element and which are also close to their interfaces. Thus, the structure shown in FIG. 14B is obtained.

With the configuration according to the present embodiment, in contrast with the above first to third embodiments, the side wall insulating film 40 is not formed. However, a $CoO_x$ layer and an $FeO_x$ layer are formed by oxidizing the CoFe layers 33 and 34, arranged over and under the tunnel barrier film 29, respectively, in their areas corresponding to the end of the magneto resistive element. Accordingly, the tunnel barrier film 29 is considered to have a larger film thickness at the end of the magneto resistive element. Consequently, as in the above first embodiment, a short circuit can be hindered from occurring between the pinning layer 28 and the free layer 30 owing to residue. Further, the magneto resistive element described in FIG. 2I can be etched using an incident angle substantially perpendicular to the semiconductor substrate surface. It is thus possible to hinder a short circuit between adjacent magneto resistive elements. Furthermore, oxidization serves to supply oxygen to the end of the $Al_2O_3$ layer corresponding to the end of the magneto resistive element. This hinders a short circuit between the pinning layer 28 and the free layer 30. As a result, the yield of the MRAM can be improved. Further, as in the above first embodiment, the operational reliability of the MRAM can be improved.

Figure 15A:
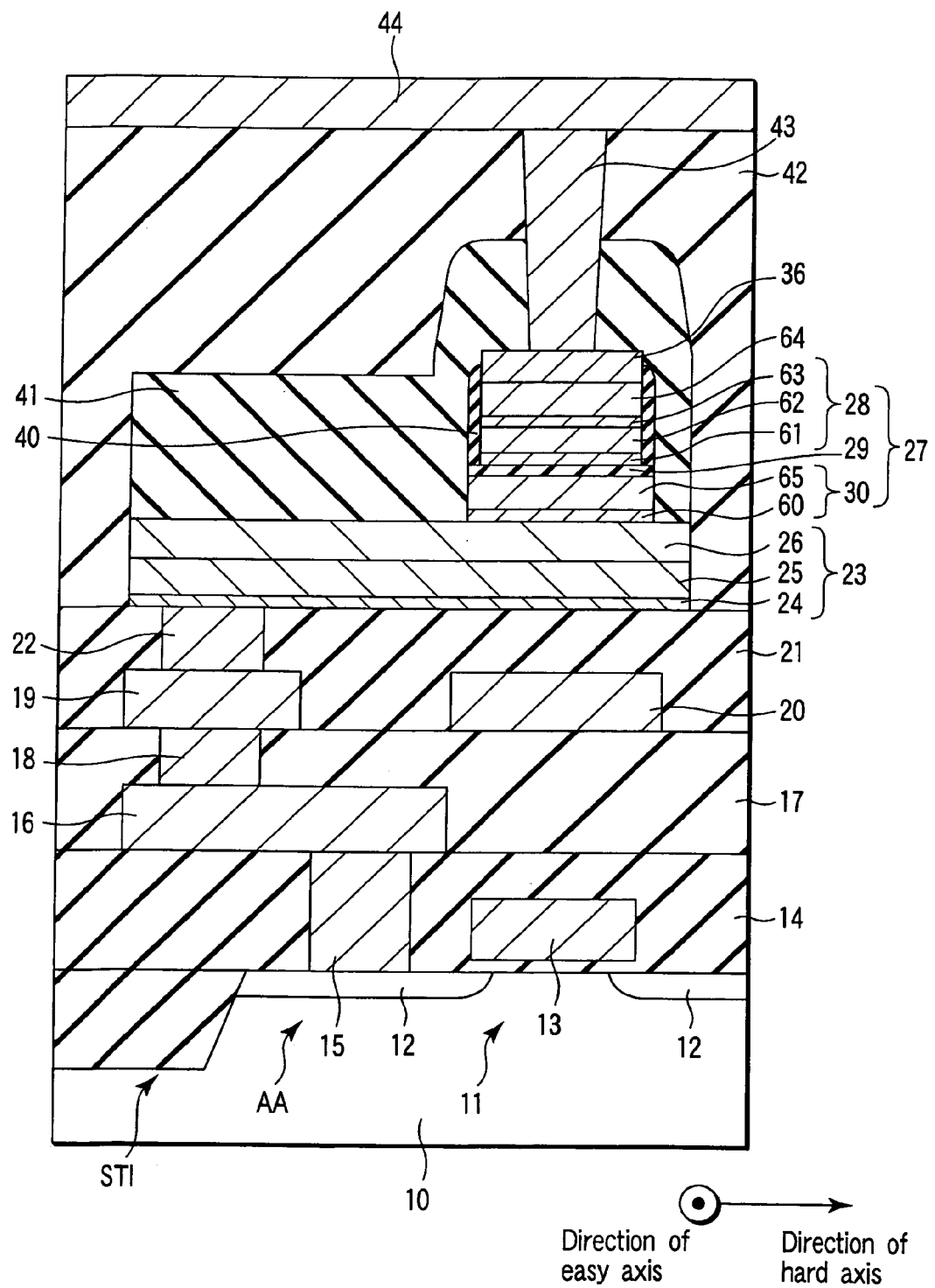
FIG. 15A is a sectional view of an MRAM according to an eighth embodiment of the present invention.

Now, with reference to FIG. 15A, description will be given of a semiconductor memory device according to an eighth embodiment of the present invention. FIG. 15A is a sectional view of a memory cell in an MRAM according to the present embodiment. The present embodiment is obtained by applying the above first embodiment to a top pin type MRAM. Consequently, the structure according to the present embodiment is similar to that described in the above first embodiment except for the magneto resistive element and its peripheral structure. Accordingly, the description of components similar to those of the above first embodiment is omitted.

As shown in the figure, the magneto resistive element 27 is formed on the nonmagnetic conductive film 23, functioning as a leading interconnect layer. The magneto resistive element 27 is, for example, an MTJ element. The structure of the magneto resistive element 27 will be described with reference to FIGS. 15A and 15B. FIG. 15B is a perspective view of a semiconductor memory device, focusing on the magneto resistive element 27.

As shown in the figures, the magneto resistive element 27 is shaped like a general ellipse the major axis of which extends along the easy axis. It includes the free layer 30 formed on the nonmagnetic conductive film 23, the tunnel barrier film 29 formed on the free layer 30, and the pinning layer 28 formed on the tunnel barrier film 29. The free layer 30 is formed of a stacked film including a seed layer 60 formed of Cu of, for example, film thickness 5 nm and a permalloy (Py: NiFe) layer 65 of, for example, film thickness 5 nm which are sequentially formed. The tunnel barrier film 29 is formed of an Al$_2$O$_3$ layer of, for example, film thickness 1 to 1.5 nm. The pinning layer 28 is formed of a stacked film including a CoFe layer 61 of, for example, film thickness 1.5 nm, an Ru layer 62 of film thickness 1 nm, and a CoFe layer 63 of, for example, film thickness 2 nm which are sequentially stacked.

The free layer 30 and the tunnel barrier film 29 have substantially the same surface area and completely overlap each other. The pinning layer 28 has a smaller surface area than the free layer 30 and the tunnel barrier film 29 and is provided, as a whole, on the tunnel barrier film 29. The magneto resistive element 27 is thus formed.

An antiferromagnetic layer 64 is formed on the pinning layer 28. The antiferroelectric layer 64 is formed of an IrMn layer of, for example, film thickness 15 nm. Furthermore, the cap layer is formed on the antiferromagnetic layer 64. The cap layer 36 is formed of a Ta layer of, for example, film thickness 5 nm. Further, the side wall insulating film 40 is formed on the tunnel barrier film 29 so as to surround at least the periphery of the pinning layer 28. The side wall insulating film 40 is formed of, for example, an Al$_2$O$_3$ film.

The other arrangements are similar to those of the first embodiment.

Figure 15C:
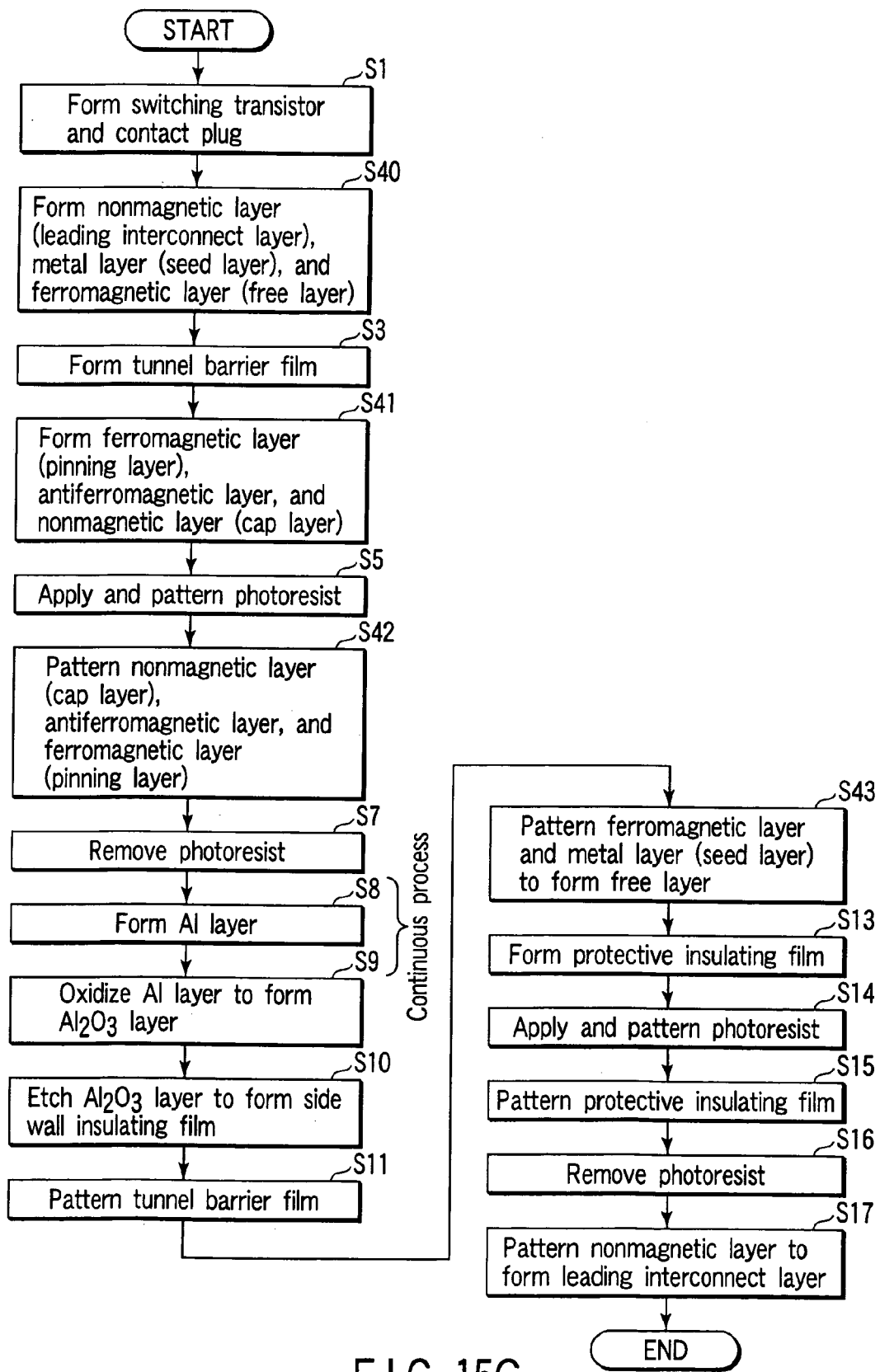
FIG. 15C is a flow chart of MRAM fabricating steps according to the eighth embodiment of the present invention.

Now, with reference to FIGS. 15C and 16A to 16F, description will be given of method of fabricating the semiconductor memory device shown in FIGS. 15A and 15B. FIG. 15C is a flow chart of MRAM fabricating steps according to the present embodiment. FIGS. 16A to 16F are sectional views sequentially showing the fabricating steps. In FIGS. 16A to 16F, the structure including the metal interconnect layers 19 and 20 and other components located below them is omitted. Further, detailed description will be given of points different from those of the fabricating method described in the above first embodiment.

First, as described in the first embodiment, in step S1 in FIG. 15C, the structure shown in FIG. 2A is obtained. Then, in step S40, a nonmagnetic layer, a metal layer, and a ferromagnetic layer are formed on the interlayer insulating film 21. That is, as shown in FIG. 16A, a nonmagnetic conductive film (Ta layer 26/Al layer 25/Ta layer 24) is formed on the interlayer insulating film 21 and the contact plug 22. Subsequently, a metal layer, for example, the Cu layer 60 of film thickness 5 nm is formed on the nonmagnetic conductive film. Then, a ferromagnetic layer, for example, the permalloy layer 30 of film thickness 5 nm is formed on the metal layer 60. The metal layer 60 and the ferromagnetic layer 65 are used to form a free layer.

Furthermore, in step S3, the tunnel barrier film 29 is formed on the ferromagnetic layer 65. Subsequently, in step S41, a ferromagnetic layer is formed on the tunnel barrier film 29. That is, the CoFe layer 61 of, for example, film thickness 1.5 nm, the Ru layer 62 of, for example, film thickness 1 nm, and the CoFe layer 63 of, for example, film thickness 2 nm are sequentially formed on the tunnel barrier film 29 using the sputtering method. The ferromagnetic layer formed of the multilayer film CoFe/Ru/CoFe is used to form a pinning layer of the magneto resistive layer. Subsequently, an antiferromagnetic layer, for example, the IrMn layer 64 of film thickness 15 nm is formed on the CoFe layer 63. Furthermore, a nonmagnetic conductive film, for example, the Ta layer 36 of film thickness 5 nm is formed on the IrMn layer 64. This nonmagnetic conductive film 36 is used to form a cap layer. As a result, the structure shown in FIG. 16A is completed.

Then, in step S5, a photo resist is applied to the surface of the nonmagnetic conductive film 36. Then, the photolithography technique is used to pattern the photo resist so that the resist has a pattern for forming the magneto resistive element. Subsequently, in step S42, the nonmagnetic conductive film 36, the antiferromagnetic layer 64, and the ferromagnetic layers 61 to 63 are patterned using the RIE method or the Ar ion milling. As a result, the pinning layer 28 of the magneto resistive element is formed as shown in FIG. 16B. Subsequently, the resist is removed (step S7).

Figure 16D:
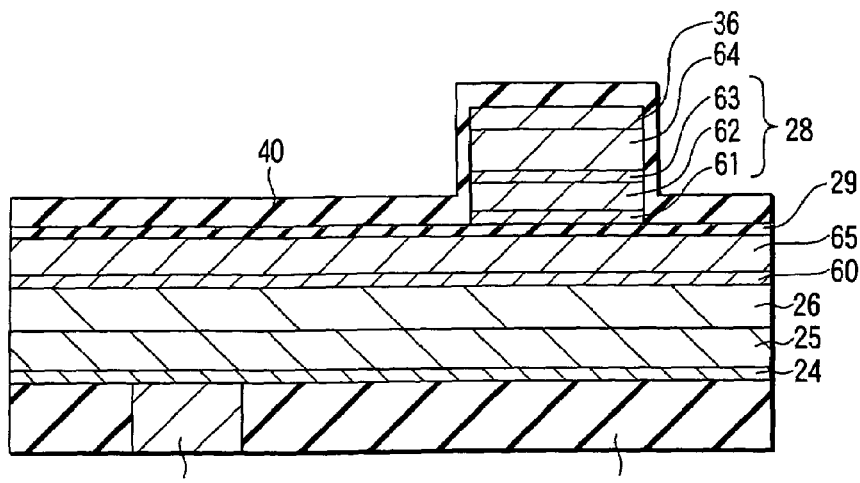

Then, in step S8, the Al layer 51 is formed to obtain the structure shown in FIG. 16C. Subsequently, in step S9, the Al layer 51 is oxidized to form the Al$_2$O$_3$ layer 40. As a result, the structure shown in FIG. 16D is obtained. That is, the pinning layer 28, the antiferromagnetic layer 64, and the cap layer 36 are covered with the Al$_2$O$_3$ layer 40.

Figure 16E:
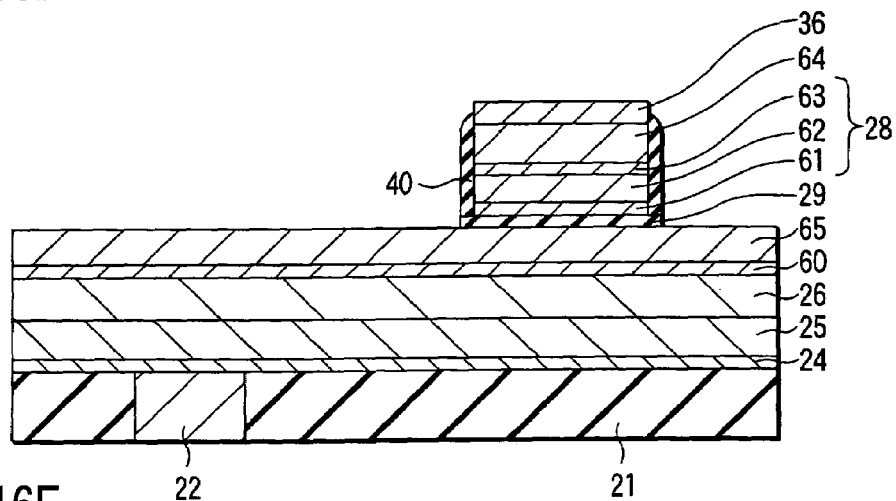

Then, in step S10 in FIG. 15C, the Al$_2$O$_3$ layer 40 is etched to form a side wall insulating film. Subsequently, in step S11, the tunnel barrier film 29 is etched. As a result, as shown in FIG. 16E, the Al$_2$O$_3$ layer 40 remains only on the tunnel barrier film 29 and on the sides of the antiferromagnetic layer 64 and pinning layer 28 and on the side of a part of the cap layer 36. Furthermore, the Al$_2$O$_3$ layer 40 is left so as to surround the periphery of the pinning layer 28 and antiferromagnetic layer 64. The Al$_2$O$_3$ layer 40 has only to surround at least the periphery of the pinning layer 28 and need not surround the entire sides of the antiferromagnetic layer 64.

Figure 16F:
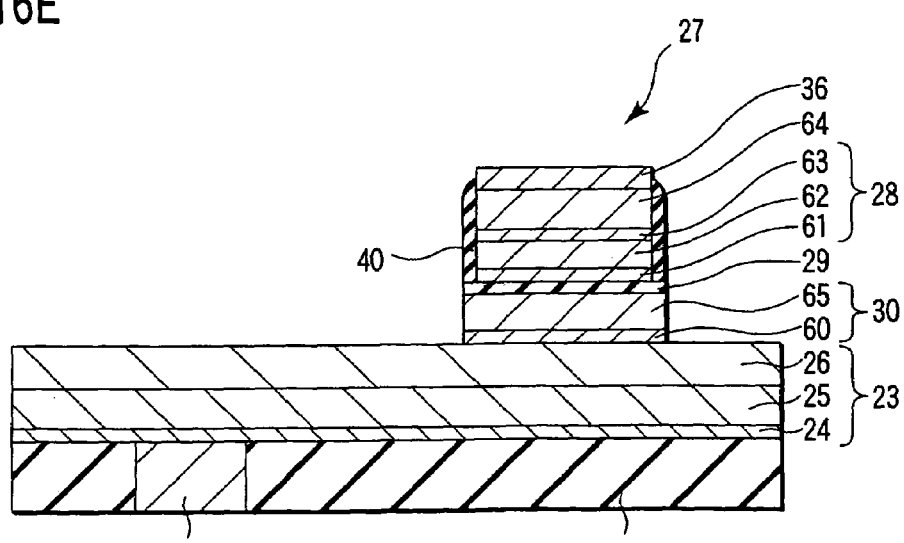

Then, in step S43, the ferromagnetic layer 65 and the metal layer 60 are patterned. As a result, the free layer 30 is formed as shown in FIG. 16F. The sides of the free layer 30 are formed so as to be flush with the sides of the Al$_2$O$_3$ layer 40. Accordingly, the width of the free layer 30 is formed to be larger than that of the pinning layer 28 by double the width of the Al$_2$O$_3$ layer 40. The present steps complete the magneto resistive element 27 shaped like an ellipse the major axis of which extends along the easy axis as shown in FIG. 15B. Further, as described in the first embodiment, although all of the stacked film forming the free layer 30 may be patterned, it is sufficient to pattern at least the NiFe layer 65 in step S43.

Subsequently, the structure shown in FIGS. 15A and 15B is completed through steps S13 to S17, described in the above first embodiment.

As described above, with the structure and fabricating method according to the present embodiment, effects similar to those of the above first embodiment are obtained even with an MRAM of a top pin type structure in which a pinning layer is formed on a free layer.

Figure 17:
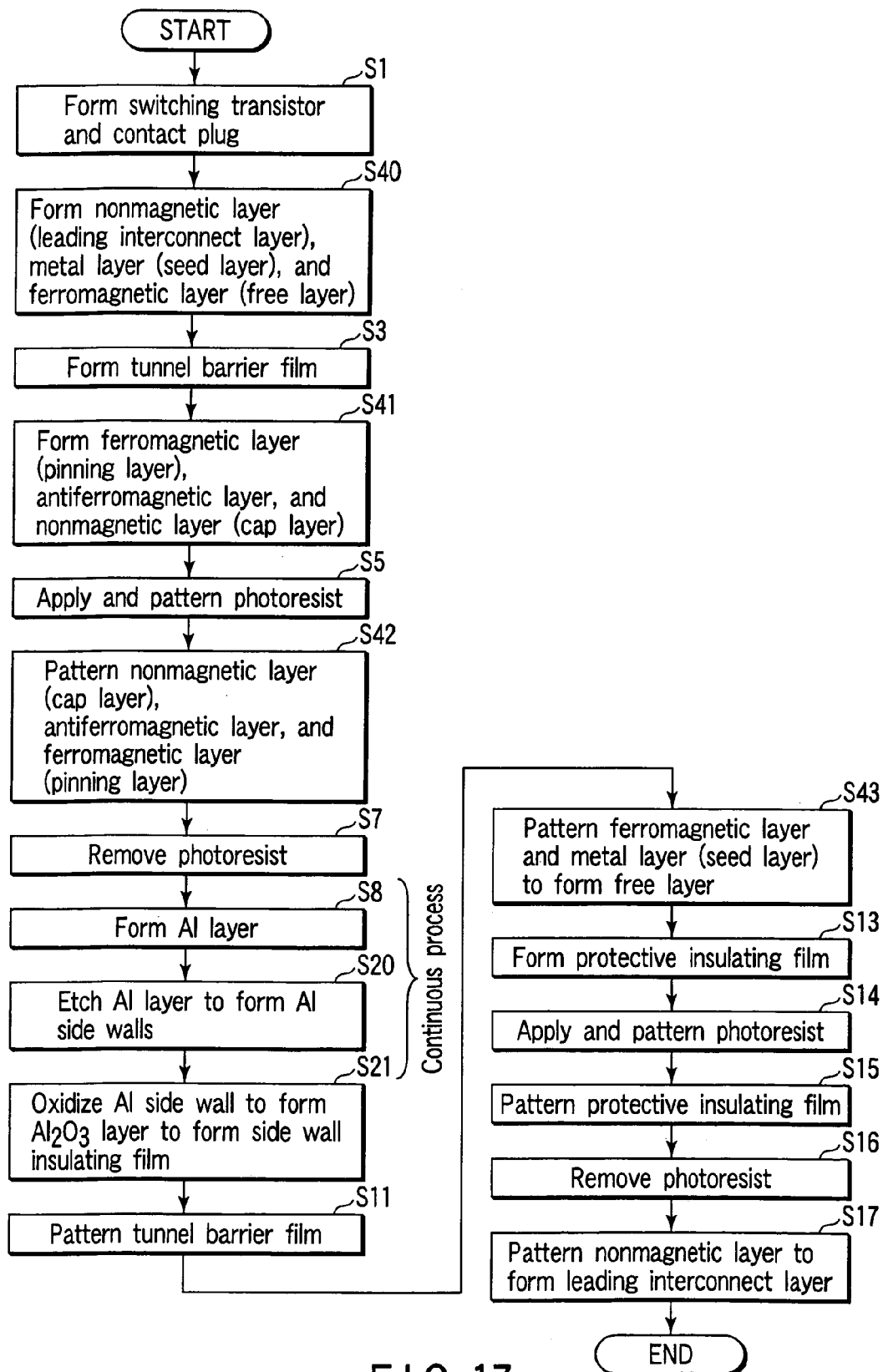
FIG. 17 is a flow chart of MRAM fabricating steps according to a ninth embodiment of the present invention.
Figure 18A:
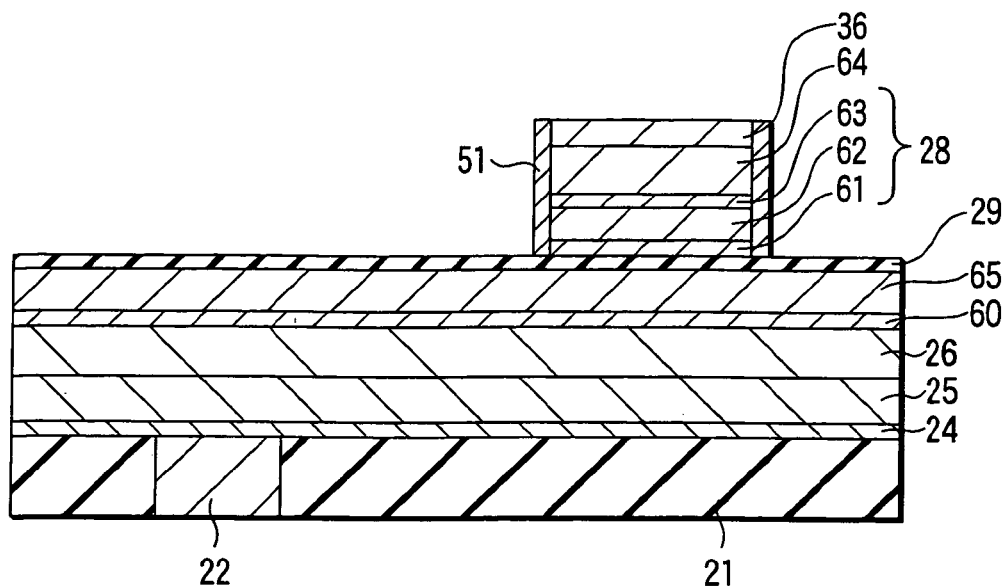
FIGS. 18A and 18B are sectional views sequentially showing the MRAM fabricating steps according to the ninth embodiment of the present invention.
Figure 18B:
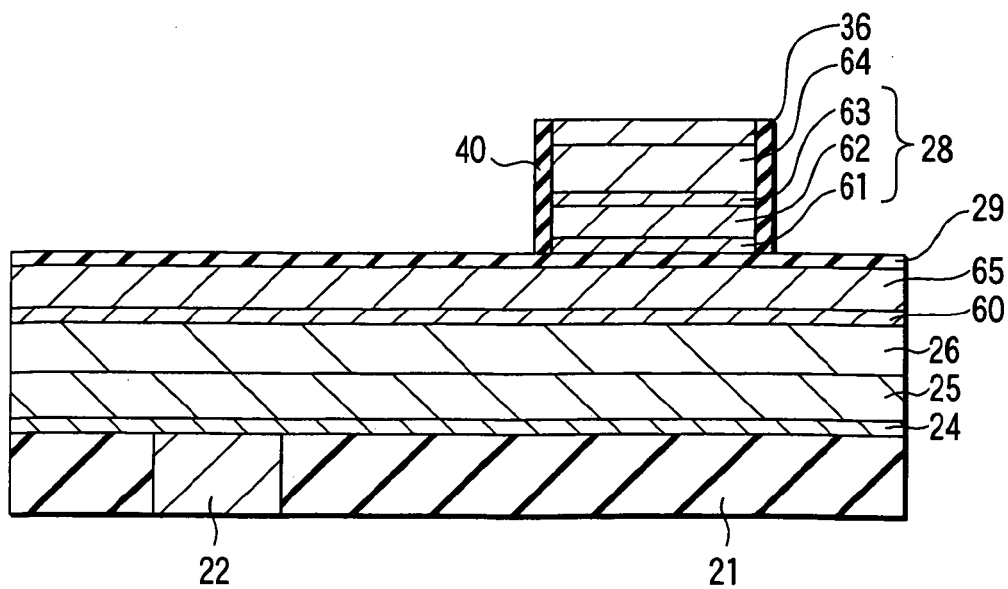

Now, with reference to FIGS. 17, 18A, and 18B, description will be given of method of fabricating a semiconductor memory device according to a ninth embodiment of the present invention. FIG. 17 is a flow chart of MRAM fabricating steps according to the present embodiment. FIGS. 18A and 18B are sectional views sequentially showing some of the fabricating steps. The present embodiment corresponds to the above second embodiment applied to a top pin type MRAM. It is used to describe another method of fabricating the MRAM shown in FIGS. 15A and 15B, described in the above eighth embodiment.

First, the structure shown in FIG. 16C is obtained through steps S1 to S8 described in the above eighth embodiment. Subsequently, in step S20 in FIG. 17, the Al layer 51 is etched. That is, as shown in FIG. 18A, the Al layer 51 is etched using the Ar ion milling or the RIE method. As a result, as shown in the figures, the Al layer 51 remains only on the tunnel barrier film 29 and on the sides of the pinning layer 28, antiferromagnetic layer 64, and cap layer 36. Furthermore, the Al layer 51 is left so as to surround the periphery of the pinning layer 28.

Then, in step S21, the Al layer 51 is oxidized to form an $Al_2O_3$ layer. As a result, as shown in FIG. 18B, the side wall insulating film 40 formed of the $Al_2O_3$ layer is completed.

Then, in step S11, the tunnel barrier film 29 is patterned to obtain the structure shown in FIG. 16E. Subsequently, as in the case with the eighth embodiment, the MRAM shown in FIGS. 15A and 15B is completed through steps S43 to S17.

With the structure and fabricating method according to the present embodiment, the effects described in the above second embodiment are obtained even with a top pin type MRAM.

Figure 19:
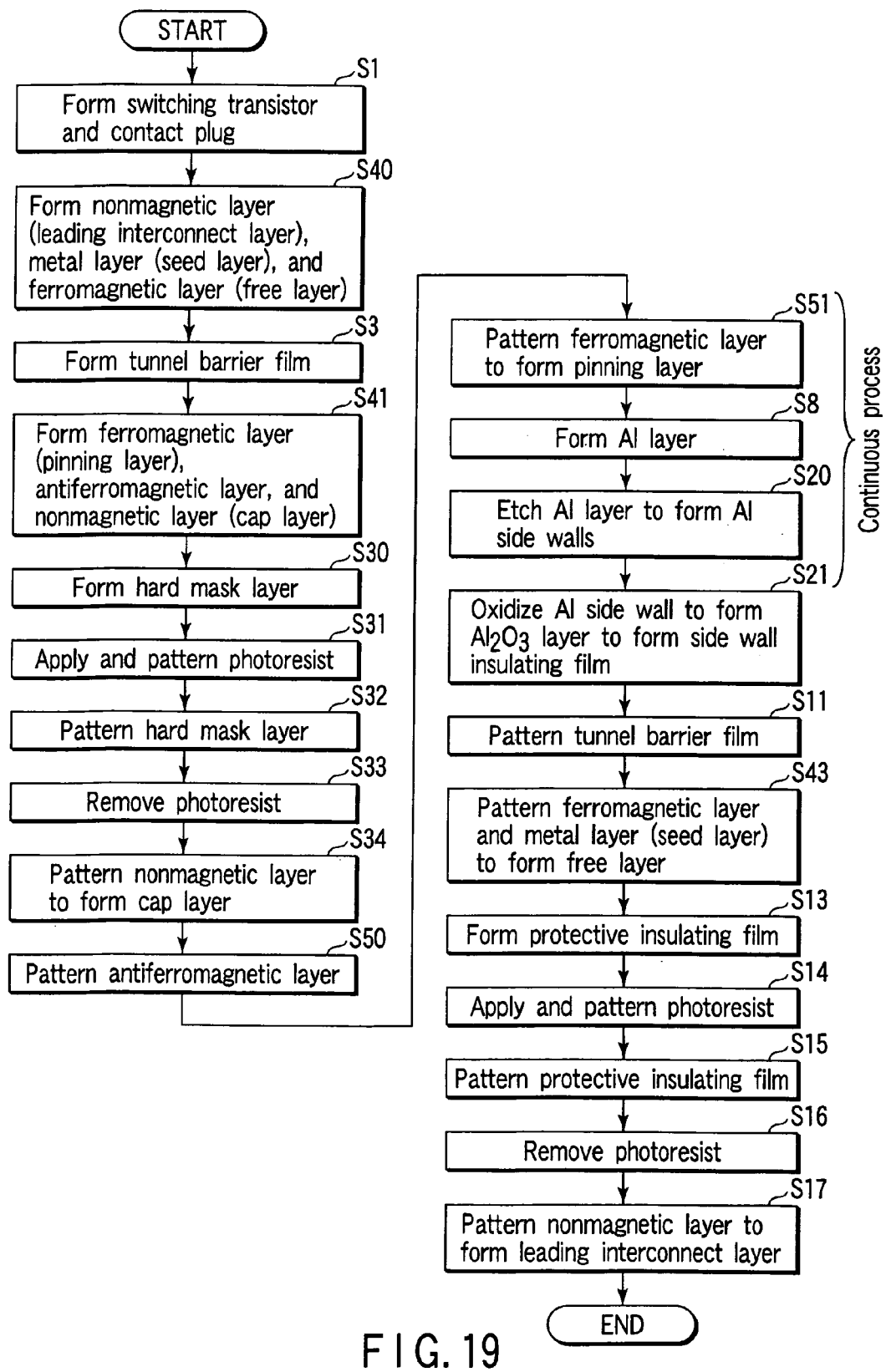
FIG. 19 is a flow chart of MRAM fabricating steps according to a tenth embodiment of the present invention.

Now, with reference to FIGS. 19 and 20A to 20F, description will be given of method of fabricating a semiconductor memory device according to a tenth embodiment of the present invention. FIG. 19 is a flow chart of MRAM fabricating steps according to the present embodiment. FIGS. 20A to 20F are sectional views sequentially showing some of the fabricating steps. The present embodiment corresponds to the above third embodiment applied to a top pin type MRAM.

Figure 20A:
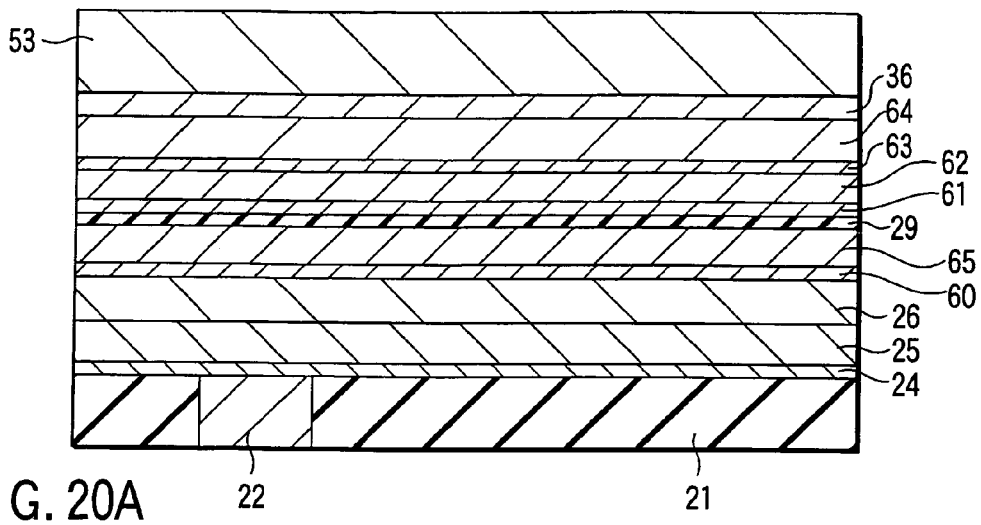

First, the structure shown in FIG. 16A is obtained through steps S1 to S41 described in the above eighth embodiment. Then, in step S30, the hard mask layer 53 is formed on the Ta layer 36 using the sputtering method or the CVD method. Thus, the structure shown in FIG. 20A is obtained.

Figure 20B:
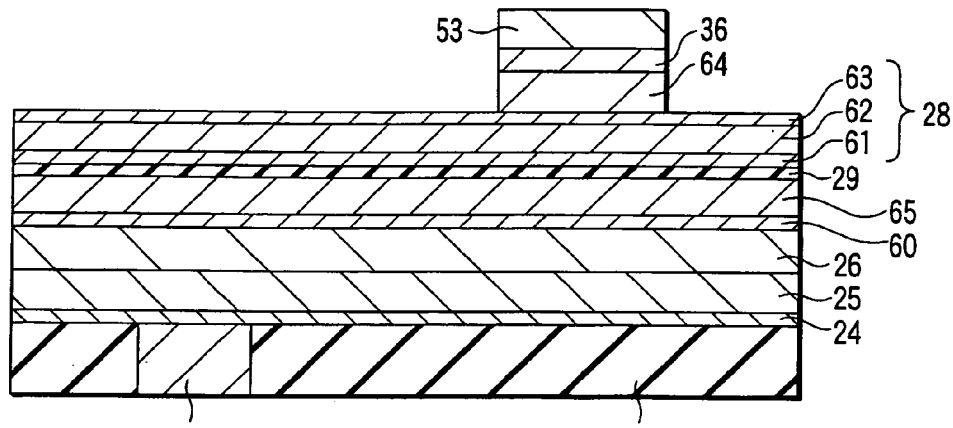
Figure 20C:
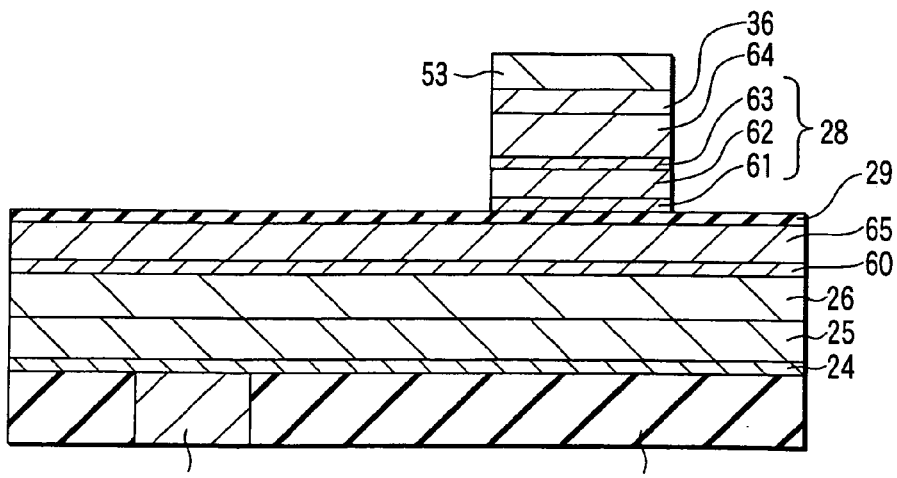

Then, in steps S31 and S32, a photo resist is applied to the surface of the hard mask layer 53. As shown in FIG. 20B, the lithography technique and etching are used to pattern the hard mask layer 53 so that the layer 53 has a pattern for forming the magnetic resistive element. Thereafter, the photo resist 50 is removed (step S33). Subsequently, in step S34, the nonmagnetic layer 36 is patterned by the RIE method or Ar ion milling using the hard mask layer 53 as a mask, to form a cap layer. Then, in step S50, the ferromagnetic layer 64 is patterned. Furthermore, the antiferromagnetic layers 61 to 63 are patterned to form the pinning layer 28. As a result, a structure such as the one shown in FIG. 20C is obtained.

Then, in step S8, an Al layer is formed to obtain the structure shown in FIG. 20D. Subsequently, in step S20, the Al layer 51 is etched. In step S21, the Al layer 51 is oxidized to form the $Al_2O_3$ layer 40. As a result, the side wall insulating film 40 formed of the $Al_2O_3$ layer is completed as shown in FIG. 20E. The side wall insulating film 40 covers the sides of the pinning layer 28, antiferromagnetic layer 64, cap layer 36, and hard mask 53.

Then, in step S11, the tunnel barrier film 29 is patterned. Furthermore, in step S43, the ferromagnetic layer 65 and the metal layer 60 are patterned. As a result, the free layer 30 is completed to obtain the structure shown in FIG. 20F.

Subsequently, steps S13 to S17 are executed as described in the above first embodiment to complete the MRAM.

Also with the fabricating method according to the present embodiment, effects similar to those of the above first and second embodiments are obtained even with a top pin type MRAM.

Figure 21:
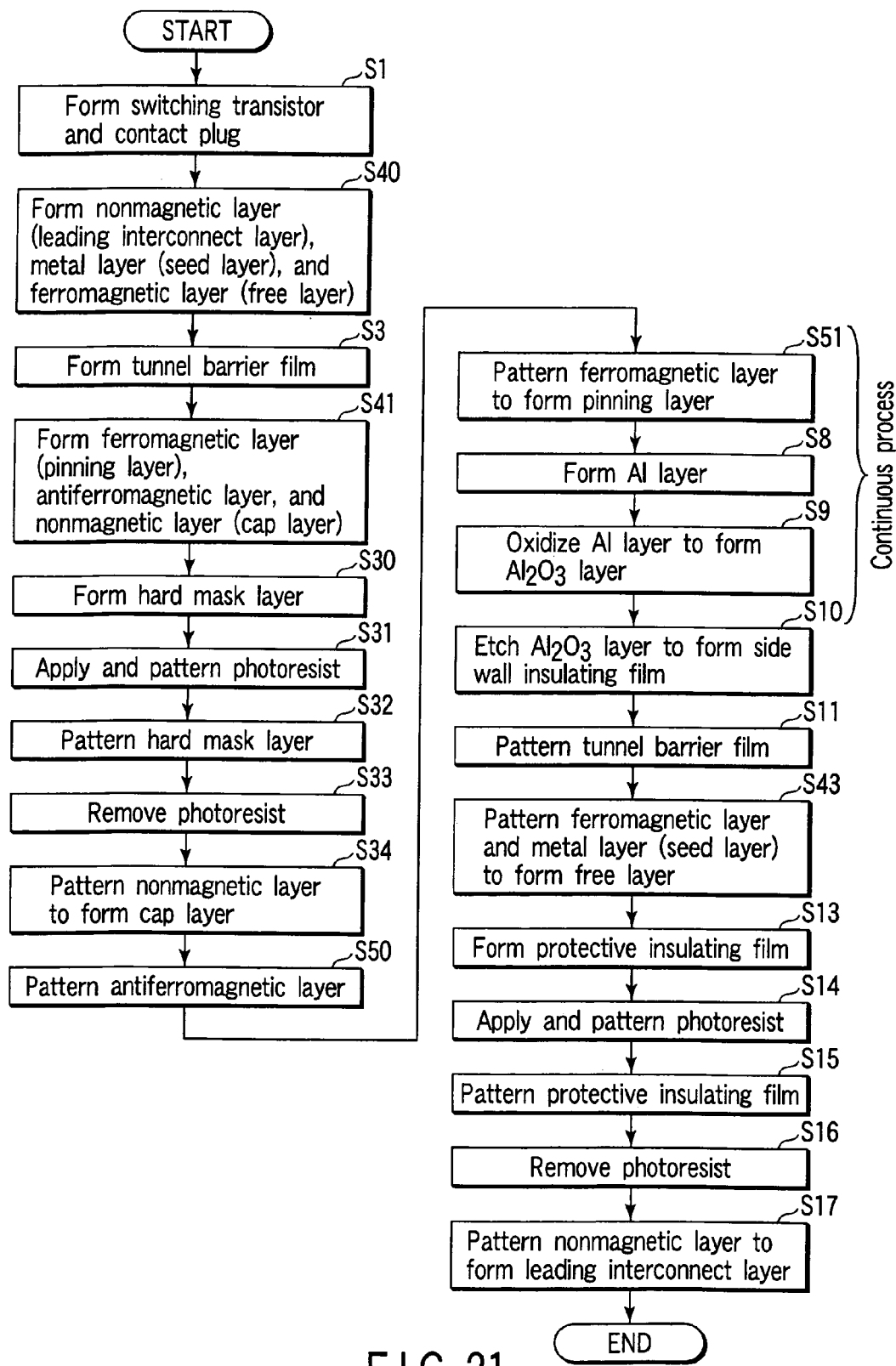
FIG. 21 is a flow chart of MRAM fabricating steps according to a variation of the tenth embodiment of the present invention.

FIG. 21 is a flow chart of MRAM fabricating steps according to a variation of the present embodiment. The present variation relates to the above first embodiment applied to a top pin type MRAM and using a hard mask layer. That is, even if a hard mask layer is used, a side wall insulating film may be formed by patterning an $Al_2O_3$ film.

Figure 22:
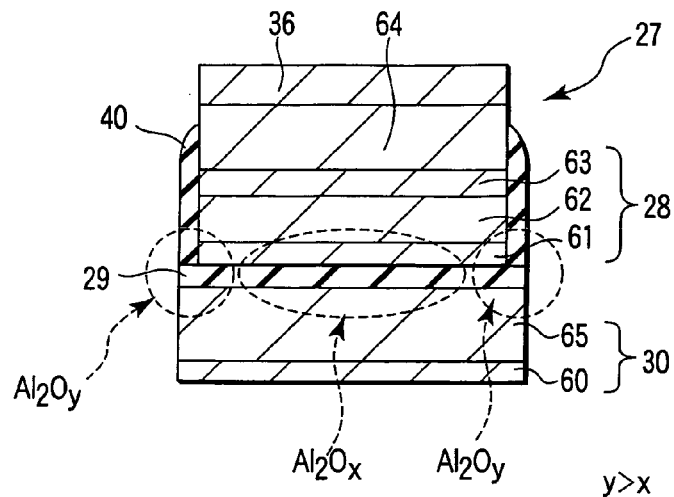
FIG. 22 is a sectional view of a magneto resistive element provided in an MRAM according to an eleventh embodiment of the present invention.

Now, with reference to FIG. 22, description will be given of a semiconductor memory device according to an eleventh embodiment. FIG. 22 is a sectional view of a memory cell in an MRAM, notably its magneto resistive element according to the present embodiment. The present embodiment corresponds to the above fourth embodiment applied to a top pin type MRAM. Accordingly, its detailed description is omitted.

As shown in the figure, the magneto resistive element 27 of the MRAM according to the present embodiment corresponds to the arrangement according to the eighth to tenth embodiments in which the composition of $Al_2O_3$ as the tunnel barrier film 29 is improved. That is, the tunnel barrier film 29 has a higher oxygen content at the end than in the center of the magneto resistive element 27. Specifically, the composition of the tunnel barrier film is $Al_2O_x$ in the center of the magneto resistive element and is $Al_2O_y$ at its end, where x and y are both close to 3 and y>x.

With the configuration according to the present embodiment, the effects described in the above fourth embodiment are obtained even with a top pin type MRAM.

Figure 23:
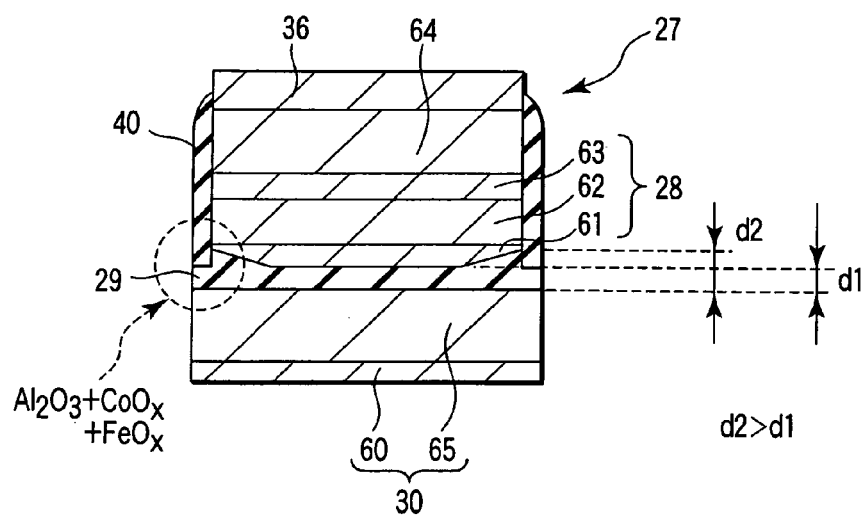
FIG. 23 is a sectional view of a magneto resistive element provided in an MRAM according to a twelfth embodiment of the present invention.

Now, with reference to FIG. 23, description will be given of a semiconductor memory device according to a twelfth embodiment. FIG. 23 is a sectional view of a memory cell in an MRAM, notably its magneto resistive element according to the present embodiment. The present embodiment corresponds to the above fifth embodiment applied to a top pin type MRAM. Accordingly, its detailed description is omitted.

As shown in the figure, the magneto resistive element 27 of the MRAM according to the present embodiment corresponds to the arrangement according to the above eighth to tenth embodiments in which the tunnel barrier film 29 has a larger film thickness at the end of the magneto resistive element. That is, the tunnel barrier film 29 has the film thickness d1 in the center of the magneto resistive element and the film thickness d2 at its end. In this case, d2>d1.

The present structure can be formed by increasing, in the above eighth to tenth embodiments, the time required for the oxidizing process to provide excessive oxidization when the Al layer 51 is oxidized. The excessive oxidization causes oxygen to enter not only the $Al_2O_3$ layer 29 but also an area of the in-surface edge of the pinning layer 28 which contacts with the tunnel barrier film 29. As a result, a part of the CoFe layer 61, forming the pinning layer 30, is oxidized to form a $CoO_x$ layer and an $FeO_x$ layer. That is, at the end of the magneto resistive element, the tunnel barrier film 29 is formed of an $Al_2O_3$ layer, a $CoO_x$ layer, and an $FeO_x$ layer. Consequently, the tunnel barrier film 29 apparently has a larger film thickness in the center than at the end of the magneto resistive element.

With the above configuration, the effects described in the above fifth embodiment are obtained even with a top pin type MRAM.

Figure 24:
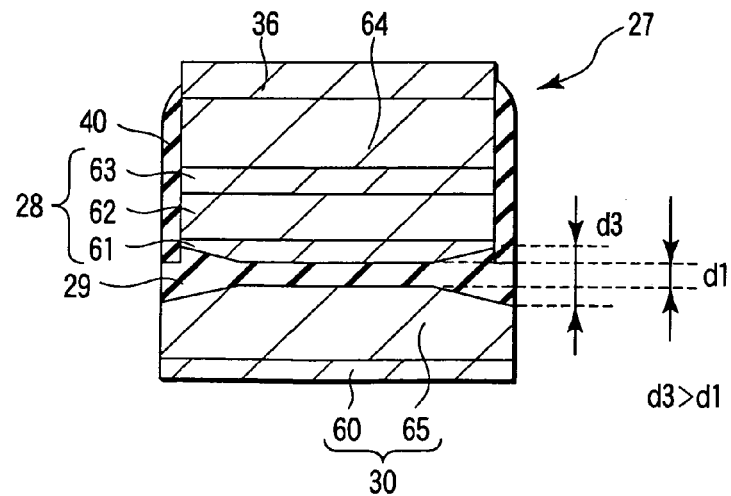
FIG. 24 is a sectional view of a magneto resistive element provided in an MRAM according to a thirteenth embodiment of the present invention.

Now, with reference to FIG. 24, description will be given of a semiconductor memory device according to a thirteenth embodiment. FIG. 24 is a sectional view of a memory cell in an MRAM, notably its magneto resistive element according to the present embodiment. The present embodiment corresponds to the above sixth embodiment applied to a top pin type MRAM. Accordingly, its detailed description is omitted.

As shown in this figure, the magneto resistive element 27 of the MRAM according to the present embodiment corresponds to the arrangement according to the above eighth to tenth embodiments in which the tunnel barrier film 29 has a much larger film thickness at the end of the magneto resistive element.

The present structure can be formed by increasing, in the above eighth to tenth embodiments, the time required for the oxidizing process to provide excessive oxidization when the Al layer 51 is oxidized. The excessive oxidization causes oxygen to enter not only the $Al_2O_3$ layer 29 but also the pinning layer 28 and the free layer 30. As a result, a part of the CoFe layer 34, forming the free layer 30, is oxidized to form a $CoO_x$ layer and an $FeO_x$ layer. Further, a part of the NiFe layer 65, forming the free layer 30, is oxidized to form an NiFe oxide film. Thus, at the end of the magneto resistive element, the tunnel barrier film 29 is formed of an $Al_2O_3$ layer, and an insulating film formed by oxidizing the CoFe layer 61 and NiFe layer 65. Consequently, the tunnel barrier film 29 apparently has a larger film thickness in the center than at the end of the magneto resistive element.

According to the present embodiment, effects similar to those of the above sixth embodiment are obtained even with a top pin type MRAM.

Figure 25:
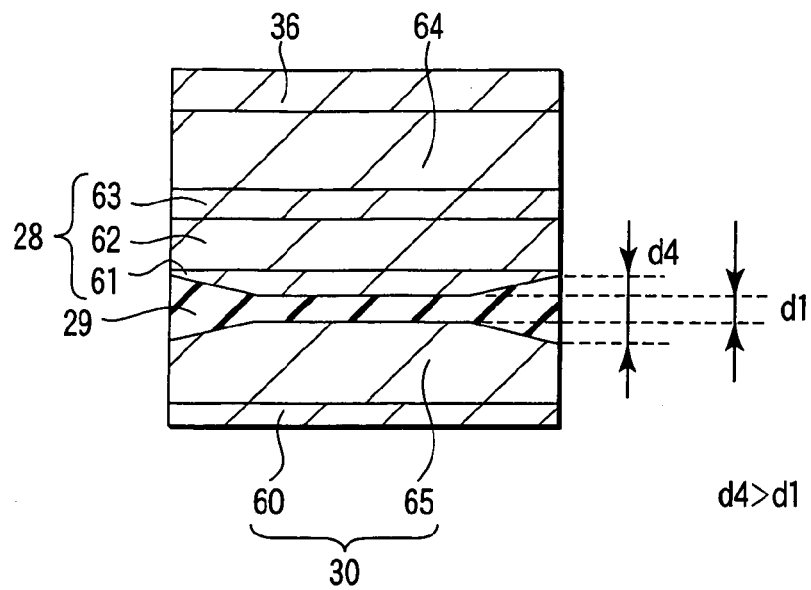
FIG. 25 is a plan view of a magneto resistive element provided in an MRAM according to the fourteenth embodiment of the present invention.

Now, with reference to FIG. 25, description will be given of a semiconductor memory device according to a fourteenth embodiment. FIG. 25 is a sectional view of a memory cell in an MRAM, notably its magneto resistive element according to the present embodiment. The present embodiment corresponds to the above seventh embodiment applied to a top pin type MRAM.

As shown in the figure, the magneto resistive element 27 comprises the free layer 30, the tunnel barrier film 29 formed on the free layer 30, and the pinning layer 28 formed on the tunnel barrier film 29. The free layer 30 has a stacked structure including the seed layer 60 formed of, for example, Cu and the ferromagnetic layer 30 formed of, for example, Py. The pinning layer 28 also has a stacked structure including, for example, the CoFe layer 61, the Ru layer 62, and the CoFe layer 63, which are sequentially formed. The tunnel barrier film 29 has the film thickness d1 in the center of the magneto resistive element and the film thickness d4 at its end (d4>d1).

A method of forming the magneto resistive element according to the present embodiment is similar to that of the above seventh embodiment. That is, the structure shown in FIG. 16B is obtained through steps S1 to S42 in FIG. 15C, described in the above eighth embodiment. Subsequently, the tunnel barrier film 29, the ferromagnetic layer 30, and the metal layer 60 are sequentially etched. Then, the magneto resistive element is exposed to an oxygen atmosphere. As a result, the CoFe layers 61 and permalloy layer 65, arranged over and under the tunnel barrier film 29, respectively, are oxidized in their areas corresponding to the end of the magneto resistive element. Thus, the structure shown in FIG. 25 is obtained.

According to the present embodiment, effects similar to those of the above seventh embodiment are obtained even with a top pin type MRAM.

Figure 26A:
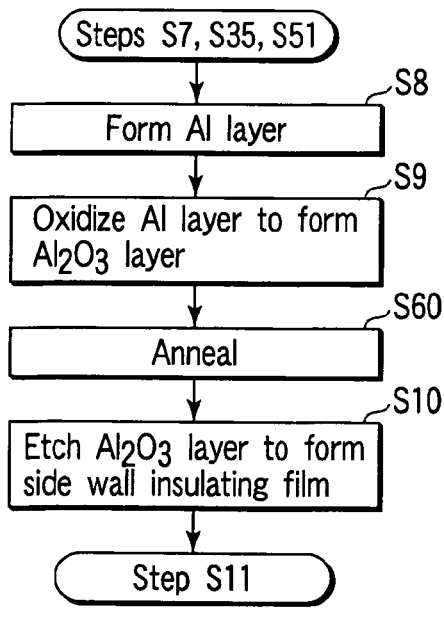
FIG. 26A is a flow chart of MRAM fabricating steps according to a fifteenth embodiment of the present invention.

Now, with reference to FIG. 26A, description will be given of method of fabricating a semiconductor memory device according to a fifteenth embodiment of the present invention. FIG. 26A is a flow chart of MRAM fabricating steps according to the present embodiment.

As shown in the figure, the fabricating method according to the present embodiment corresponds to the fabricating steps described in the above first embodiment, variation of the third embodiment, eighth embodiment, and variation of the tenth embodiment wherein the Al layer is oxidized in step S9 and then annealed in step S60.

The fabricating method according to the present embodiment improves the insulating property of the side wall insulating film 40. The $Al_2O_3$ film forming the side wall insulating film 40 may have the loss of oxygen or include an area with an excessive amount of Al or oxygen. However, by oxidizing and then annealing the Al layer as in the present embodiment, Al and oxygen atoms can be made uniform. As a result, the insulating property of the $Al_2O_3$ can be improved. Further, once the Al layer is oxidized, the composition of the resultant side wall insulating film is not completely $Al_2O_3$. However, the annealing operation helps complete the composition of the side wall insulating film. Therefore, the insulating property is improved.

Figure 26B:
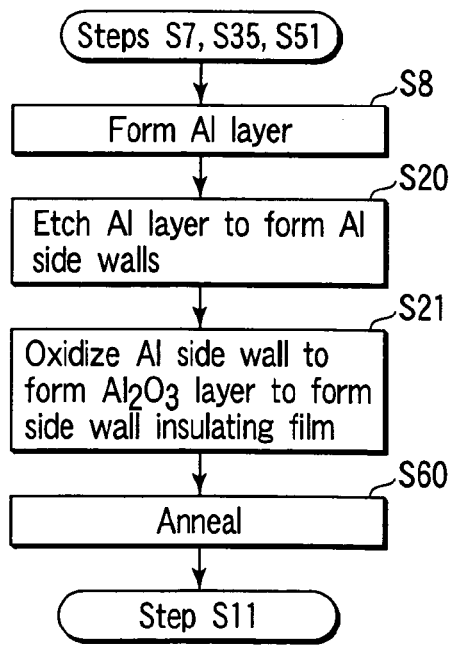
FIG. 26B is a flow chart of MRAM fabricating steps according to a variation of the fifteenth embodiment of the present invention.

FIG. 26B is a flow chart showing some MRAM fabricating steps according to a variation of the present embodiment. The present variation corresponds to the fabricating steps described in the above second, third, ninth, and tenth embodiments wherein the Al layer is oxidized in step S21 and then annealed in step S60. The above effects are also obtained using a fabricating method according to the present variation. The annealing in step S60 may be carried out at any time after the Al layer oxidizing step and need not necessarily be executed immediately after the oxidizing step. Further, the annealing step may be continuously executed with the Al layer forming and oxidizing steps and other steps within the same fabricating apparatus.

As described above, according to the first to sixth embodiments of the present invention, the side wall insulating wall 40 is formed on the tunnel barrier film 29 so as to surround the periphery of the free layer 30. It is thus possible to hinder a short circuit between the pinning layer 28 and the free layer 30 caused by residue resulting from the Ar ion milling. Further, since the side wall insulating film 40 prevents a short circuit between the pinning layer 28 and the free layer 30, ions can enter the semiconductor substrate surface substantially perpendicularly to it during the Ar ion milling step executed to form the pinning layer 28. Thus, the shape of the pinning layer 28 can be easily controlled to ensure a sufficient operation margin for the MRAM. Furthermore, the side wall insulating film 40 is formed by oxidizing the Al layer 51. In this case, oxygen is also supplied to the end of the tunnel barrier film 29. Consequently, those areas of the tunnel barrier film 29 which correspond to the ends of the magneto resistive element can sufficiently maintain their insulating property. This makes it possible to prevent a short circuit between the pinning layer 28 and the free layer 30.

Further, according to the seventh and fourteenth embodiments, a part of the pinning layer 28 and free layer 30 are oxidized. As a result, the tunnel barrier film 29 has a larger film thickness at the end of the magneto resistive element, thus producing the above effects.

Furthermore, according to the eighth to thirteenth embodiments, effects similar to those of the above first to sixth embodiments are obtained even with a top pin type MRAM. That is, the side wall insulating film 40 is formed on the tunnel barrier film 29 so as to surround the periphery of the pinning layer 28. It is thus possible to prevent a short circuit between the pinning layer 28 and the free layer 30. Further, ions can enter the semiconductor substrate surface substantially perpendicularly to it during the Ar ion milling step executed to form the free layer 30. Thus, the shape of the free layer 30 can be easily controlled to ensure a sufficient operation margin for the MRAM.

Furthermore, according to the fifteenth embodiment, the Al layer 51 is oxidized and then annealed. This results in the uniform composition of the $Al_2O_3$ layer forming the side wall insulating film 40. Thus, the insulating property of the side wall insulating film 40 can be improved.

In the description of the above embodiments, Al is cited as an example of material used to form the side wall insulating film 40. However, the present embodiment is not particularly limited to Al. Other metal or alloy may be used. Preferably, it is desirable to use material that is easier to oxidize than the ferromagnetic material used for the free layer or the pinning layer. Further, the formation of the side wall insulating film 40 is not limited to oxidization. For example, nitridization or fluoridization may be used. However, in view of the yield and manufacturing costs, the side wall insulating film 40 and the tunnel barrier film 29 are desirably an oxide, a nitride, or a fluoride containing the same metal element. For example, $Al_2O_3$, AlN, MgO, $HfO_2$, GaO, $LaAlO_3$, $MgF_2$, $CaF_2$, or the like may be used. These compounds may have a small loss of oxygen (nitrogen or fluorine). Further, the above fabricating steps are not limited to the above order. The order can be changed as drastically as possible. Furthermore, in the description of the above eighth to thirteenth embodiments, the pinning layer 28 has a multilayer structure including the CoFe layers 61 and 63 and the Ru layer 62. However, the pinning layer 28 may be formed only of a CoFe layer.

Further, in the description of the above embodiments, the magneto resistive element is a memory cell using an MTJ element. However, a GMR (Giant Magneto Resistive) element, a CMR (Colossal Magneto Resistive) element, or the like may be used.

Various applications are possible in magneto resistive random access memories (semiconductor memory) according to the first to fifteenth embodiments of the present invention. FIGS. 27 to 33 show some examples of applications thereof.

APPLICATION EXAMPLE 1

As an example, FIG. 27 shows a DSL data path part of a modem for a digital subscriber line (DSL). The modem comprises a programmable digital signal processor (DSP) 100, an analogue-digital converter 110, a digital-analogue converter 120, filters 130 and 140, a transmission driver 150, and a receiver amplifier 160. In the structure of FIG. 27, a band-pass filter is omitted. Instead, it includes, as optional memories of various types which can hold line code programs, a magneto resistive random access memory 170 according to the first to fifteenth embodiments of the present invention, and an EEPROM 180.

In this example, two memories of the magneto resistive random access memory and EEPROM are used as memories for holding the line code programs. However, the EEPROM may be replaced by another magneto resistive random access memory. Further, only a magneto resistive random access memory may be used, instead of using two memories.

APPLICATION EXAMPLE 2

Figure 28:
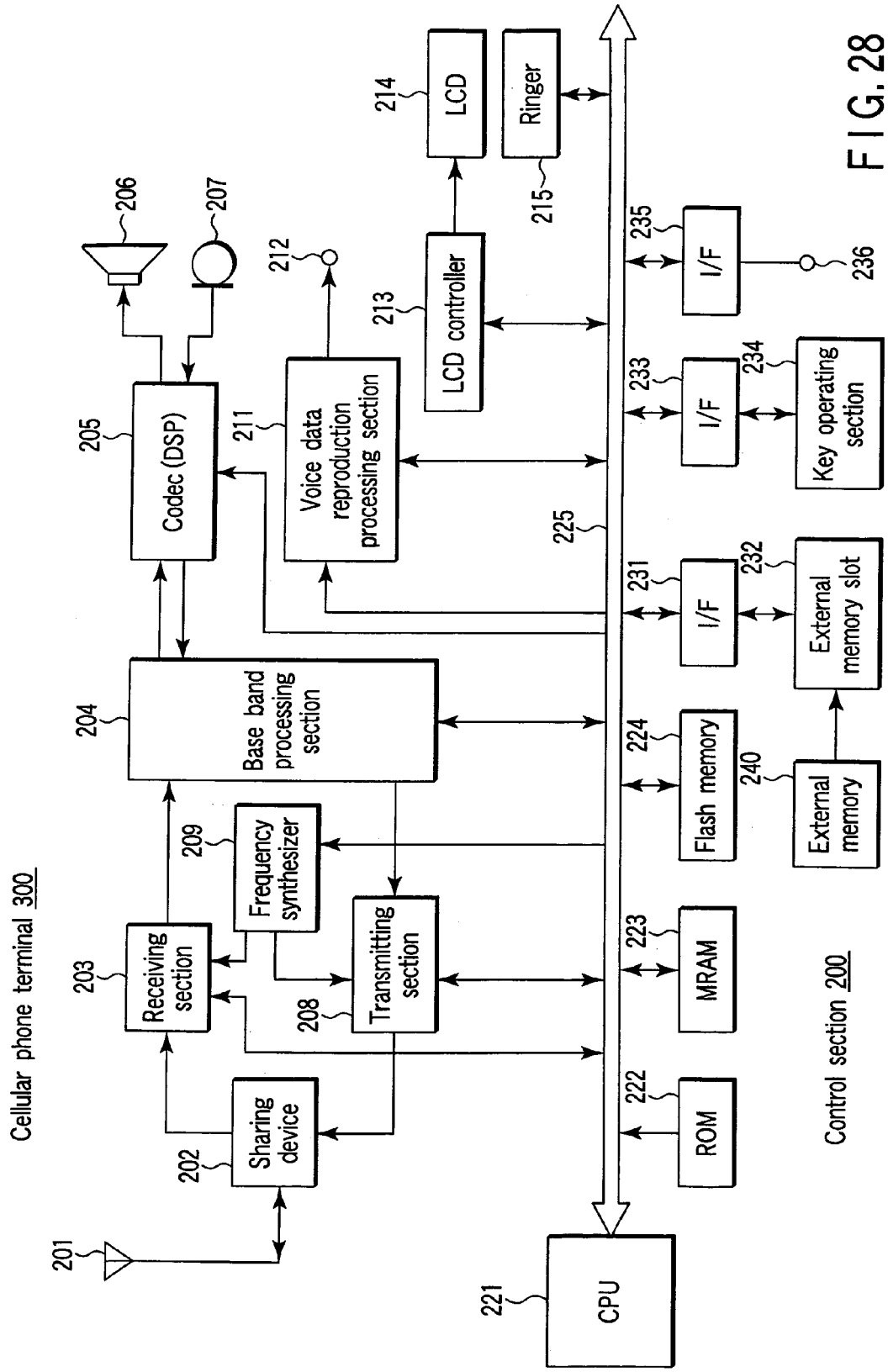
FIG. 28 is a block diagram of a cellular phone having the MRAM according to the first to fifteenth embodiments of the present invention.

As another example, FIG. 28 shows a part of realizing a communication function in a cellular phone terminal. As shown in FIG. 28, the part of realizing a communication function comprises a transmission/reception antenna 201, an antenna sharing device 202, a receiving section 203, a base band processing section 204, a DSP (Digital Signal Processor) 205 used as a voice codec, a speaker (receiver) 206, a microphone (transmitter) 207, a transmitting section 208, and a frequency synthesizer 209.

Further, as shown in FIG. 28, the cellular phone terminal 300 is provided with a control section 200 which controls sections of the cellular phone terminal. The control section 200 is a microcomputer formed by connecting a CPU 221, a ROM 222, a magneto resistive random access memory (MRAM) 223 according to the first to fifteenth embodiments of the present invention, and a flash memory 224 through a CPU bus 225. Some programs to be executed in the CPU 221 and necessary data such as fonts for display are pre-stored in the ROM 222. Further, the MRAM 223 is mainly used as a work space. For example, the MRAM 223 is used for storing data which is being calculated according to necessity when the CPU 221 is executing a program, or for temporarily storing data to be transmitted and received among the sections. The flash memory 224 stores setting parameters, in the case of adopting a method of use in which the setting conditions just before turning off the power of the cellular phone terminal 300 is stored and the same setting conditions are used when the terminal is turned on next. Specifically, the flash memory 224 is a non-volatile memory, in which the stored data is not erased by turning off the power of the cellular phone terminal.

Although the ROM 222, MRAM 223, and flash memory 224 are used in this application example, the flask memory 224 may be replaced by a magneto resistive random access memory according to the first to fifteenth embodiments of the present invention. Further, the ROM 222 may also be replaced by a magneto resistive random access memory according to the first to fifteenth embodiments of the present invention.

APPLICATION EXAMPLE 3

FIGS. 29 to 33 show an example in which a magneto resistive random access memory according to the first to fifteenth embodiments of the present invention is applied to a card (MRAM card), such as a smart media, which stores media contents.

Figure 29:
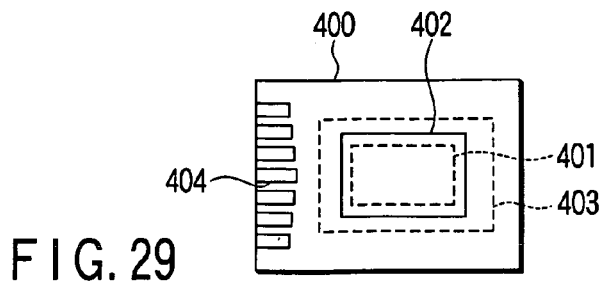
FIG. 29 is a block diagram of a card having the MRAM according to the first to fifteenth embodiments of the present invention.

In FIG. 29, an MRAM card 400 comprises an MRAM chip 401, an opening portion 402, a shutter 403, and an external terminal 404. The MRAM chip 401 is contained inside the card main body 400, and is exposed to the outside through the opening portion 402. When the MRAM card is carried, the MRAM chip 401 is covered with the shutter 403. The shutter 403 is formed of a material having an effect of shielding the chip from an external magnetic field, such as ceramic. When the data in the card is transferred, the shutter 403 is opened and the MRAM chip 401 is exposed. The external terminal 404 is used for taking out the contents data stored in the MRAM card to the exterior.

Figure 30:
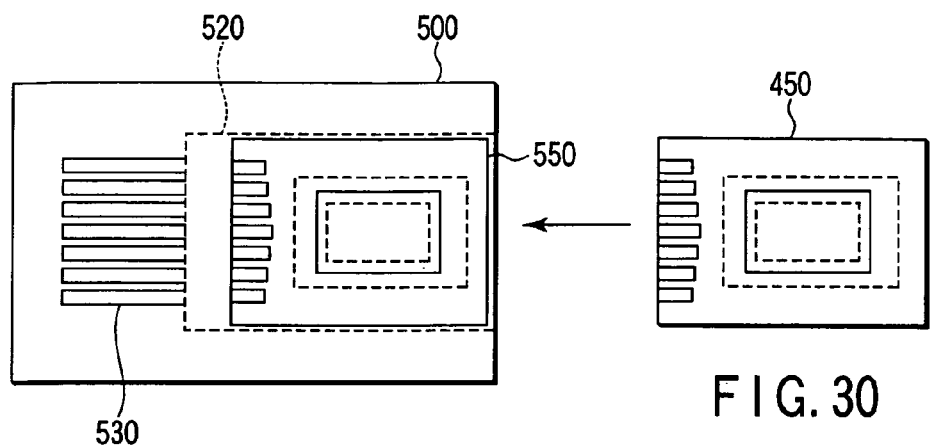
FIG. 30 is a top view of a transfer device which transfers data of the card having the MRAM according to the first to fifteenth embodiments of the present invention.
Figure 31:
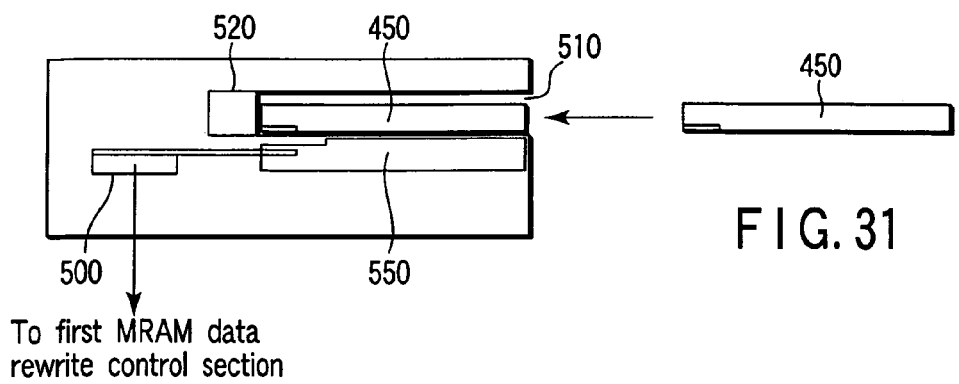
FIG. 31 is a sectional view of the transfer device which transfers data of the card having the MRAM according to the first to fifteenth embodiments of the present invention.

FIGS. 30 and 31 are a top view and a sectional view of a transfer device which transfers data to the MRAM card. The transfer device is a card-inserting type transfer device. A second MRAM card 450 which an end user uses is inserted in an inserting section 510 of the transfer device 500, and pushed into the device until it is stopped by a stopper 520. The stopper 520 is also used as a member for positioning the first MRAM 550 and the second MRAM card. Simultaneously with positioning the second MRAM card 450 to a predetermined position, data stored in the first MRAM card is transferred to the second MRAM card.

Figure 32:
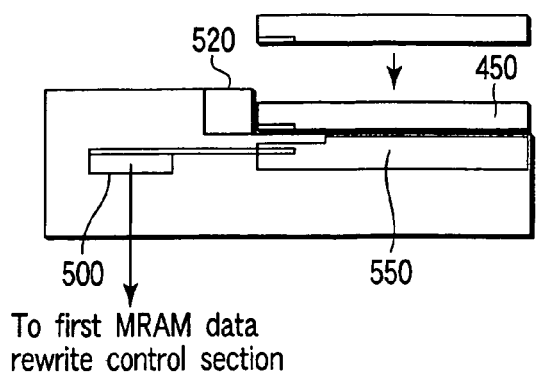
FIG. 32 is a sectional view of a transfer device which transfers data of the card having the MRAM according to the first to fifteenth embodiments of the present invention.

FIG. 32 shows a fit-in type transfer device. In this type, a second MRAM card is mounted on a first MRAM against the stopper 520, as shown in an arrow in FIG. 32, such that the second MRAM card is fitted on the first MRAM. The transfer method thereof is the same as that of the card-inserting type, and its explanation is omitted.

FIG. 33 shows a slide-type transfer device. In this type, a receiver slide 560 is provided on a transfer device 500, in the same manner as a CD-ROM drive and a DVD drive. The receiver slide 560 is moved as shown by an arrow in FIG. 33. When the receiver slide 560 has been moved to the state as shown by a broken line in FIG. 33, a second MRAM card 450 is placed on the receiver slide 560, and the receiver slide 560 carries the second MRAM card into the transfer device 500. The slide-type device is the same as the card-insertion type in the point that the second MRAM card is carried such that a distal end portion of the second MRAM card abuts against the stopper 520 and in the transfer method. Therefore, their explanations are omitted.

In the embodiments described above, the side wall insulating film 40 covers either side of the pinning layer 28 or free layer 30 entirely. Nonetheless, the sides of the layer 28 or layer 30 need not be entirely covered.

If the free layer 30 provided on the tunnel barrier film 29 is thick, the insulating film 40 may cover only a part of the side of the free layer 30 as shown in FIG. 34. More precisely, the film 40 may cover only the lower part of the side of the layer 30, which lies near the tunnel barrier film 29. Thus, the film 40 does not cover the upper part of the side of the layer 30.

In the case of the top pin type MRAM, the insulating film 40 may cover only a part of the side of the pinning layer 28 as illustrated in FIG. 35. More specifically, the film 40 may cover only the lower part of the side of the pinning layer 28, which lies near the tunnel barrier film 29.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    a memory cell comprising a first ferromagnetic film, a tunnel barrier film formed on the first ferromagnetic film, and a second ferromagnetic film formed on the tunnel barrier film;
    a side wall insulating film formed so as to surround at least sides of the second ferromagnetic film; and
    an interlayer insulating film formed so as to cover the memory cell and the side wall insulating film,
    wherein the tunnel barrier film has a higher oxygen content in an in-surface edge portion than in an in-surface central portion.

2. The device according to claim 1, wherein the side wall insulating film contacts with the tunnel barrier film.

3. The device according to claim 1, wherein the side wall insulating film is formed of aluminum oxide.

4. The device according to claim 1, wherein the side wall insulating film and the tunnel barrier film contain a common metal element.

5. The device according to claim 1, wherein the side wall insulating film and the tunnel barrier film are both formed of aluminum oxide.

6. The device according to claim 1, wherein the side wall insulating film contacts with at least a part of side wall of the tunnel barrier film along a circumferential direction.

7. The device according to claim 1, wherein the tunnel barrier film is formed of aluminum oxide.

8. A semiconductor memory device comprising:
    a memory cell comprising a first ferromagnetic film, a tunnel barrier film formed on the first ferromagnetic film, and a second ferromagnetic film formed on the tunnel barrier film; and
    a side wall insulating film formed so as to surround at least sides of the second ferromagnetic film and containing a metal element,
    wherein the tunnel barrier film has a higher oxygen content in an in-surface edge portion than in an in-surface central portion.

9. The device according to claim 8, wherein the side wall insulating film contacts with the tunnel barrier film.

10. The device according to claim 8, wherein the side wall insulating film is formed of aluminum oxide.

11. The device according to claim 8, wherein the side wall insulating film and the tunnel barrier film contain a common metal element.

12. The device according to claim 8, wherein the side wall insulating film and the tunnel barrier film are both formed of aluminum oxide.

13. The device according to claim 8, wherein the side wall insulating film contacts with at least a part of side wall of the tunnel barrier film along a circumferential direction.

14. The device according to claim 8, wherein the tunnel barrier film is formed of aluminum oxide.

15. A semiconductor memory device comprising:
    a memory cell comprising a first ferromagnetic film, a tunnel barrier film formed on the first ferromagnetic film, and a second ferromagnetic film formed on the tunnel barrier film; and
    a side wall insulating film formed on the tunnel barrier film so as to surround a periphery of the second ferromagnetic film,
    wherein the tunnel barrier film has a higher oxygen content in an in-surface edge portion than in an in-surface central portion.

16. The device according to claim 15, wherein the side wall insulating film is formed of aluminum oxide.

17. The device according to claim 15, wherein the side wall insulating film and the tunnel barrier film contain a common metal element.

18. The device according to claim 15, wherein the side wall insulating film and the tunnel barrier film are both formed of aluminum oxide.

19. The device according to claim 15, wherein the side wall insulating film contacts with at least a part of side wall of the tunnel barrier film along a circumferential direction.

20. The device according to claim 15, wherein the tunnel barrier film is formed of aluminum oxide.

* * * * *